United States Patent [19]
Takasugi et al.

[11] Patent Number: 5,812,148
[45] Date of Patent: Sep. 22, 1998

[54] SERIAL ACCESS MEMORY

[75] Inventors: Atsushi Takasugi; Shigemi Yoshioka; Terumi Hiraoka, all of Tokyo, Japan

[73] Assignee: OKI Electric Industry Co., Ltd., Tokyo, Japan

[21] Appl. No.: 336,661

[22] Filed: Nov. 4, 1994

[30] Foreign Application Priority Data

Nov. 11, 1993 [JP] Japan .................................. 5-282457
Sep. 30, 1994 [JP] Japan .................................. 6-238057

[51] Int. Cl.⁶ .................................................. G09G 5/36
[52] U.S. Cl. ........................ 345/515; 345/509; 345/513; 345/508
[58] Field of Search ................................. 345/189, 190, 345/201, 197, 198, 511, 508, 509, 515, 513

[56] References Cited

U.S. PATENT DOCUMENTS

| | | | |
|---|---|---|---|
| 4,796,231 | 1/1989 | Pinkham | 345/197 |
| 5,132,678 | 7/1992 | Morris | 345/197 |
| 5,142,275 | 8/1992 | Rockel | 345/201 |
| 5,200,925 | 4/1993 | Morooka | 345/201 |
| 5,264,837 | 11/1993 | Buehler | 345/189 |
| 5,412,399 | 5/1995 | Hara | 345/201 |
| 5,543,824 | 8/1996 | Priem et al. | 345/201 |

FOREIGN PATENT DOCUMENTS

| | | | |
|---|---|---|---|
| 182719 | 5/1986 | European Pat. Off. | G11C 7/00 |
| 459 316 | 12/1991 | European Pat. Off. | G11C 5/14 |
| 473127 | 3/1992 | European Pat. Off. | G11C 7/00 |
| 487819 | 6/1992 | European Pat. Off. | G11C 7/00 |
| 93-183732 | 6/1993 | European Pat. Off. | H01L 23/50 |
| 64 59694 | 3/1989 | Japan | G11C 11/34 |
| 2 187989 | 7/1990 | Japan | G11C 11/41 |
| 5234364 | 9/1993 | Japan | G11C 11/401 |

*Primary Examiner*—Richard A. Hjerpe
*Assistant Examiner*—Ricardo Osorio
*Attorney, Agent, or Firm*—Spencer & Frank

[57] ABSTRACT

A serial access memory includes a data transfer unit including a memory cell array having a plurality of memory cells arranged therein for storing data therein, a first transfer register electrically connected to the memory cell array through a first switching circuit and a second transfer register electrically connected to the first transfer register through a second switching circuit. The data transfer unit is provided so that when each of the first and second switching circuits is in an ON state, data passes through the first transfer register so as to be transferred from the memory cell array to the second transfer register and when the first switching circuit is in an ON state and the second switching circuit is in an OFF state, data is transferred from the memory cell array to the first transfer register.

40 Claims, 57 Drawing Sheets

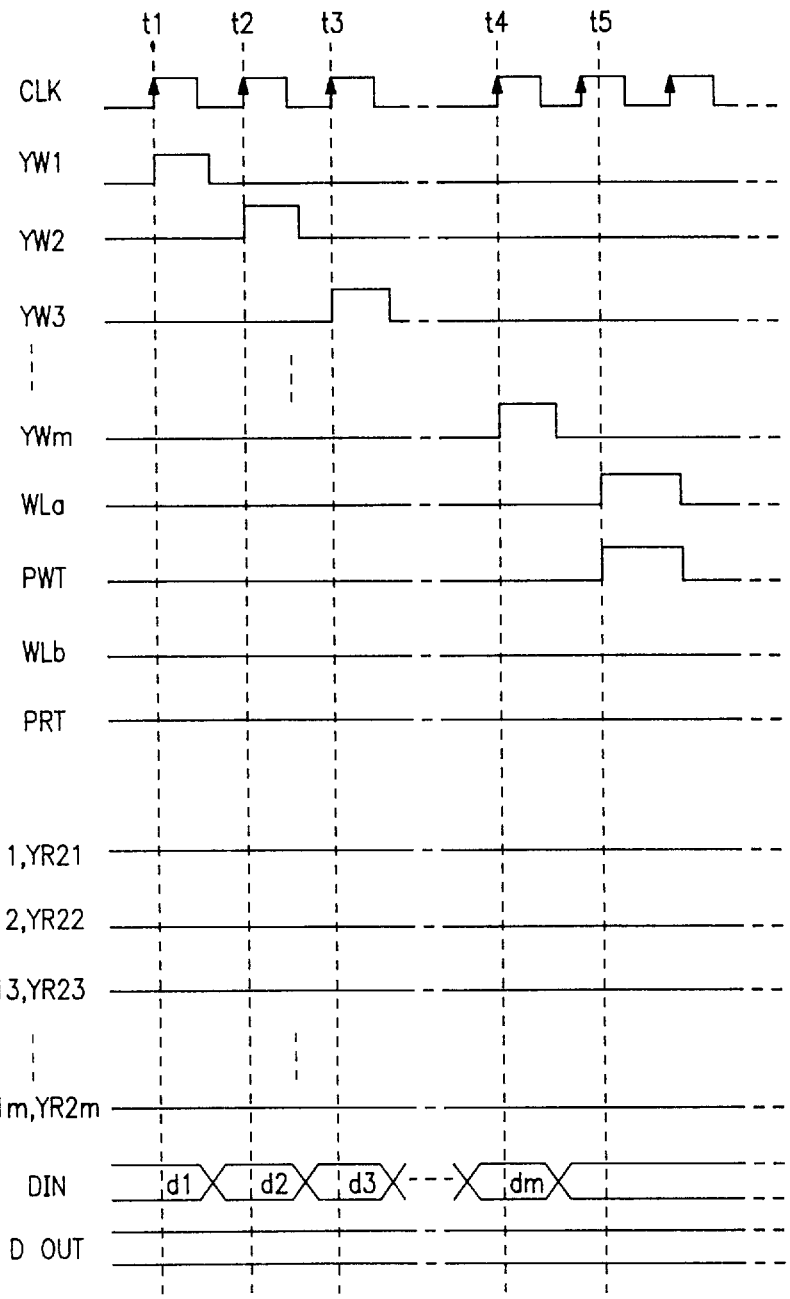

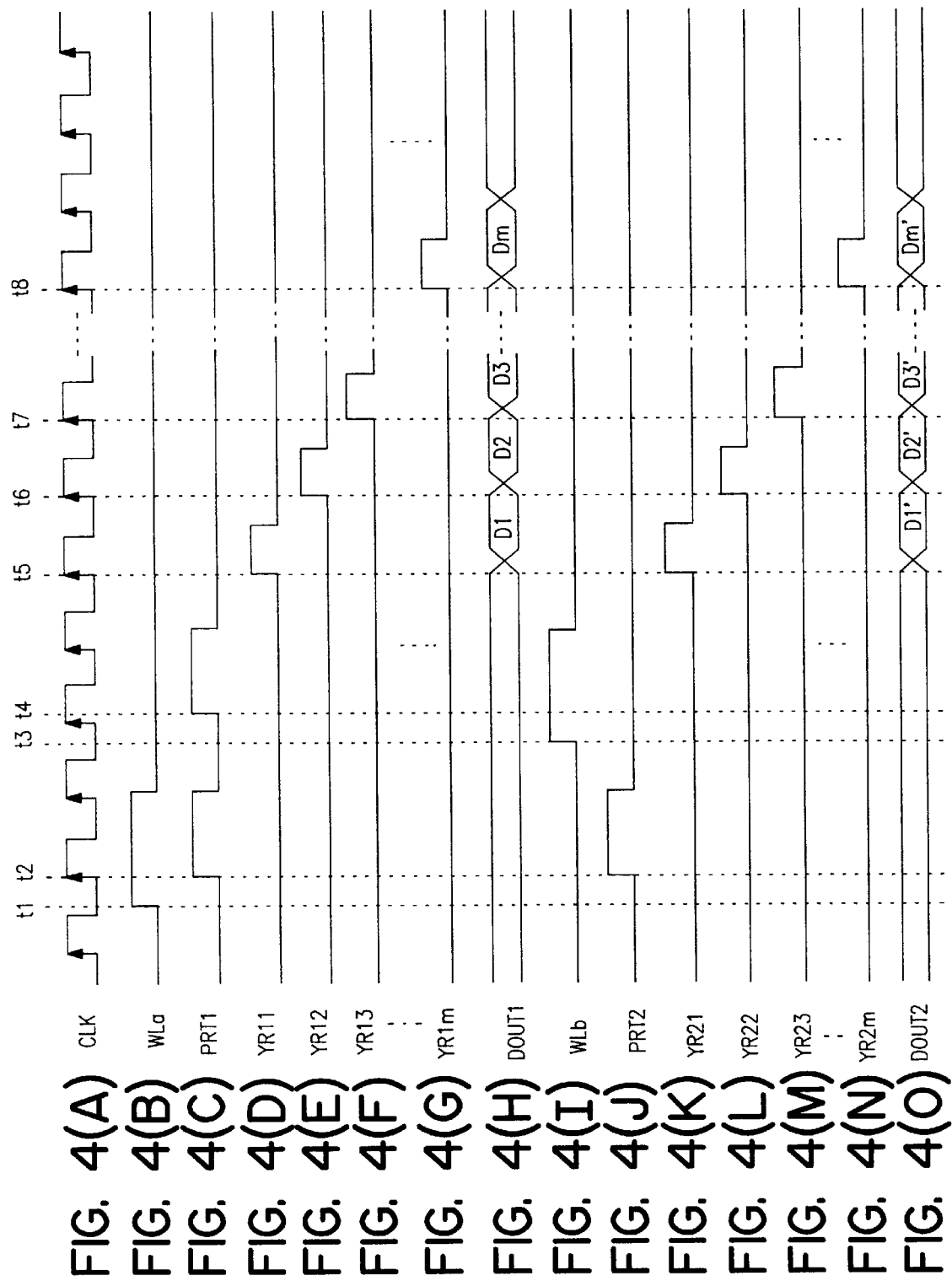

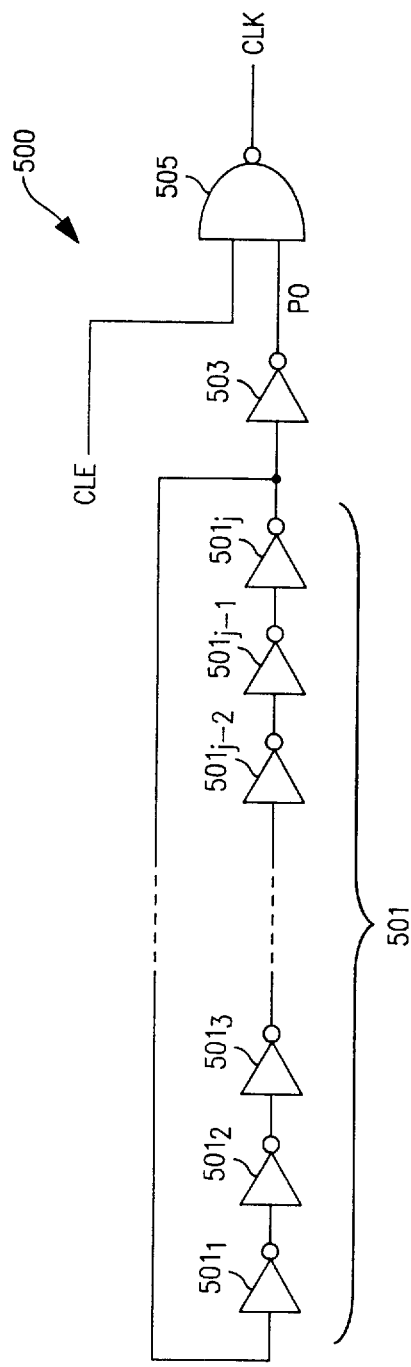
FIG. 5(A)
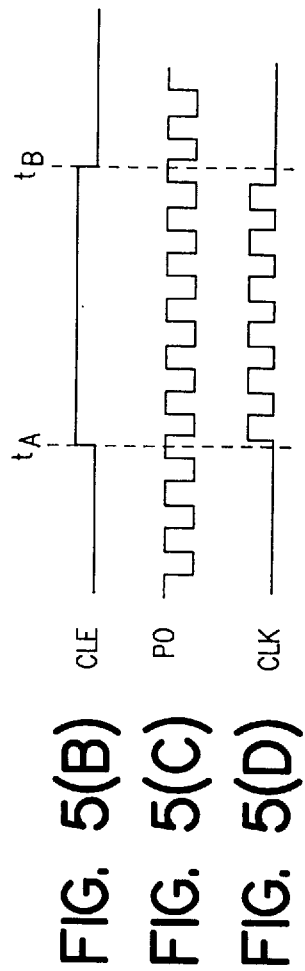
FIG. 5(B) CLE
FIG. 5(C) P0
FIG. 5(D) CLK

SERIAL ACCESS MEMORY

BACKGROUND OF THE INVENTION

1. Field of the Invention

This invention relates to a serial access memory having a plurality of output ports.

2. Description of the Related Art

In recent years, a serial access memory (two port memory) having a plurality of output ports has been used to remove noise produced in screens of a digital television, a digital VTR, etc. and correct screen movements (time base).

Filtering techniques for replacing a noise-infested line with a line arranged before or after the line to remove the noise produced on the screens have been used particularly in the present TV system (called the "interlace system") wherein a single display screen comprises a screen comprised of odd-numbered lines and a screen comprised of even-numbered lines.

Such techniques have normally been realized by a field delay and a line delay. A serial access memory for achieving the field delay is called a "field memory," whereas a serial access memory for achieving the line delay is called a "line memory."

Such serial access memories have been described in Japanese Patent Application Laid-Open Publication No. 64-59694 laid open on Mar. 7, 1989, and Japanese Patent Application Laid-Open Publication No. 2-187989 laid-open on Jul. 24, 1990, for example.

SUMMARY OF THE INVENTION

It is an object of the present invention to provide a serial access memory which occupies a reduced area and is reduced in cost.

It is another object of the present invention to provide a technique which enables a plurality of serial access memories to be simply formed into one chip.

According to one aspect of the present invention, for achieving the above objects, there is provided a typical serial access memory comprising a data transfer unit which includes a memory cell array having a plurality of memory cells arranged therein for storing data therein, a first transfer register electrically connected to the memory cell array through a first switching circuit and a second transfer register electrically connected to the first transfer register through a second switching circuit and which is provided so that when each of the first and second switching circuits is in an ON state, data passes through the first transfer register so as to be transferred from the memory cell array to the second transfer register and when the first switching circuit is in an ON state and the second switching circuit is in an OFF state, data is transferred from the memory cell array to the first transfer register.

According to another aspect of the present invention, for achieving the above objects, there is provided a typical serial access memory comprising a clock signal generating circuit for generating a first clock signal and a second clock signal subsequent to the first clock signal therefrom, a first serial access memory unit for outputting data therefrom in response to the first clock signal, a second serial access memory unit for receiving data therein in response to the second clock signal, and a delay circuit connected between the first and second serial access memory units, for delaying the data output from the first serial access memory unit by a predetermined period and supplying the delayed data to the second serial access memory unit.

Since the serial access memory according to the one aspect of the present invention is constructed as described above, a function equivalent to a function which has heretofore been realized by a plurality of serial access memories, can be achieved by series-connecting the first and second transfer registers to one another.

Further, since the serial access memory according to another aspect of the present invention is constructed as described above, the plurality of serial access memories which have heretofore been used, can simply be formed into one chip.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 3(A)–3(O) are a partial timing chart for describing a data write operation of the serial access memory shown in FIG. 1;

FIGS. 4(A)–4(O) are a partial timing chart for describing a data read operation of the serial access memory shown in FIG. 1;

FIG. 5(A) is a circuit block diagram showing the structure of a clock signal generating circuit employed in the serial access memory shown in FIG. 1, and FIGS. 5(B)–5(D) are a partial timing chart for describing the operation of the clock signal generating circuit;

FIGS. 29(A)–29(M) are a circuit block diagram showing a specific circuit configuration of a read/write shared Y address decoder 2401 employed in the serial access memory shown in FIG. 24;

DETAILED DESCRIPTION OF THE PREFERRED EMBODIMENTS

Figure 1:
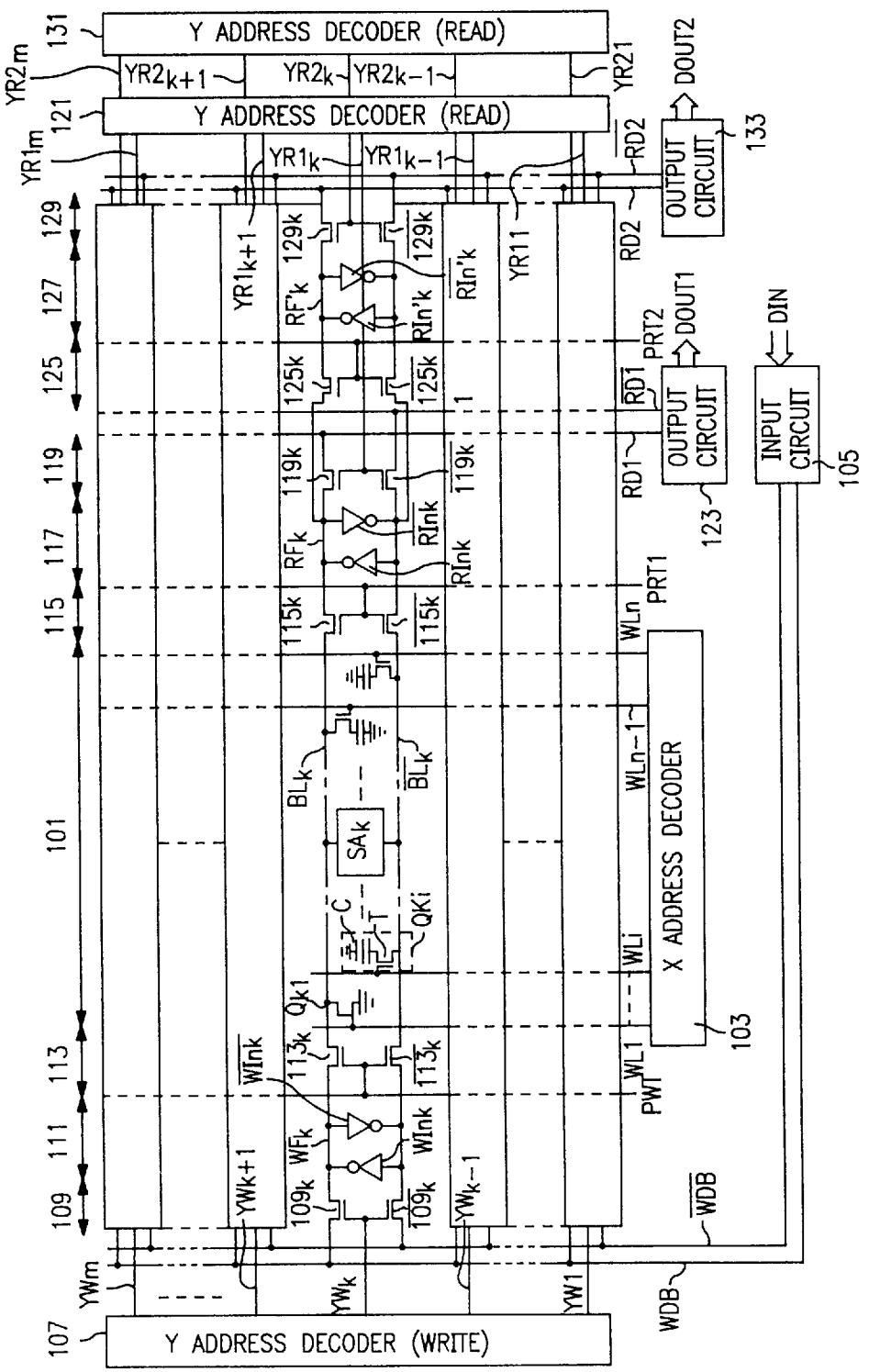
FIG. 1 is a circuit block diagram showing the structure of a principal part of a serial access memory according to a first embodiment of the present invention.

Preferred embodiments of the present invention will hereinafter be described with reference to the accompanying drawings. Common elements employed in the respective embodiments are identified by like reference numerals. In the respective embodiments, memory control signal generating circuits and the like, which are not directly concerned with basic operations of the present invention, are omitted to provide an easy understanding of illustration.

A first embodiment of the present invention will first be described with reference to FIG. 1. FIG. 1 is a schematic block diagram showing the structure of a serial access memory according to the first embodiment of the present invention.

The serial access memory according to the present embodiment has a memory cell array 101. The memory cell array 101 has a plurality of word lines $WL_i$ (i=1~n) and a plurality of complementary bit line pairs $BL_k$ and $\overline{BL}_k$ (k=1~m) which intersect the plurality of word lines $WL_i$ respectively. Memory cells $Q_{ki}$ (k=1~m, i=1~n) each comprised of a transistor and a capacitor are electrically connected to their corresponding points where the plurality of word lines $WL_i$ and the plurality of complementary bit line pairs $BL_k$ and $\overline{BL}_k$ intersect respectively. Further, the memory cells $Q_{ki}$ are arranged in row and column directions. The bit line pairs $BL_k$ and $\overline{BL}_k$ are respectively electrically connected to sense amplifiers $SA_k$ (k=1~m).

An X address decoder 103 is electrically connected to the memory cell array 101. The X address decoder 103 is electrically connected to the plurality of word lines $WL_i$ and has the function of selecting a desired column from the memory cell array 101 in response to an X address supplied from the outside.

An input circuit 105 serves as a circuit for inputting write data input from an input terminal $D_{in}$ to the memory cell array 101 through a pair of write data buses WDB and $\overline{WDB}$.

A Y address decoder (for writing) 107 has the function of decoding a Y address supplied from the outside and selecting a desired row from the memory cell array 101 based on an address signal $YW_j$. Data on the write data bus pair WDB and $\overline{WDB}$ are input to a desired memory cell arranged in the selected row.

A transfer circuit 109 is comprised of a plurality of transistor pairs $109_k$ and $\overline{109}_k$. These transistors are N channel MOS transistors (NMOSs). The transistor pairs $109k$ and $\overline{109k}$ are respectively electrically connected between the write data bus pair WDB and $\overline{WDB}$ and flip-flops $WF_k$ of a write register 111. A desired transistor pair $109_k$ and $\overline{109}_k$ is selected based on an output $YW_k$ produced from the Y address decoder 107. The transfer circuit 109 has the function of transferring the write data on the write data bus pair WDB and $\overline{WDB}$ to the write register 111.

The write register 111 is comprised of the flip-flops $WF_k$ (k=1~m) respectively electrically connected to the transistor pairs $109_k$ and $\overline{109}_k$ of the transfer circuit 109. Each flip-flop $WF_k$ is comprised of two inverters $WI_{nk}$ and $\overline{WI}_{nk}$ reversely parallel-connected to each other. The write register 111 has the function of storing write data therein.

A transfer circuit 113 is electrically connected between the memory cell array 101 and the write register 111 and is comprised of a plurality of transistor pairs $113_k$ and $\overline{113}_k$. These transistors are N channel MOS transistors (NMOSs). The transistor pairs $113_k$ and $\overline{113}_k$ are respectively electrically connected between the flip-flops $WF_k$ and the bit line pairs $BL_k$ and $\overline{BL}_k$. The transfer circuit 113 has the function of writing the write data stored in the write register 111 therein and transferring the write data to the memory cell array 101 in response to a control signal PWT.

Further, a transfer circuit 115 for transferring read data to a first read register 117 is electrically connected to the memory cell array 101. The transfer circuit 115 is made up of a plurality of transistor pairs $115_k$ and $\overline{115}_k$. These transistors correspond to N channel MOS transistors (NMOSs). The transistor pairs $115_k$ and $\overline{115}_k$ are respectively electrically connected between the bit line pairs $BL_k$ and $\overline{BL}_k$ and flip-flops $RF_k$ of the first read register 117. Further, the transistor pairs $115_k$ and $\overline{115}_k$ transfer data read from the memory cell array 101 to their corresponding flip-flops $RF_k$ in response to a control signal PRT1.

The first read register 117 is comprised of the flip-flops $RF_k$ (k=1~m) respectively electrically connected to the transistor pairs $115_k$ and $\overline{115}_k$ of the transfer circuit 115. Each of the flip-flops $RF_k$ is comprised of two inverters $Rl_{nk}$ and $\overline{Rl}_{nk}$ electrically reversely parallel-connected to one another. The first read register 117 has the function of storing therein read data corresponding to each column, which have been transferred from the transfer circuit 115.

A transfer circuit 119 is electrically connected between a pair of first read data buses RD1 and $\overline{RD1}$ and the first read register 117 and comprises a plurality of transistor pairs $119_k$ and $\overline{119}_k$. These transistors are N channel MOS transistors (NMOSs). The transistor pairs $119_k$ and $\overline{119}_k$ are respectively electrically connected between the flip-flops $RF_k$ and the first read data bus pair RD1 and $\overline{RD1}$. The transfer circuit 119 transfers each read data stored in the first read register 117 to the first read data bus pair RD1 and $\overline{RD1}$ in response to an address signal $YR_{1k}$ supplied from a first Y address decoder (Read) 121.

A first output circuit 123 is electrically connected to the first read data bus pair RD1 and $\overline{RD}_1$. The first output circuit 123 outputs each read data transferred from the first read register 117 to a first output terminal DOUT1.

In the serial access memory according to the present invention, a transfer circuit 125 is further electrically connected to the first read register 117. The transfer circuit 125 has the function of transferring the data read from the memory cell array 101 to a second read register 127 through the first read register 117 in response to a second read control signal PRT2. The transfer circuit 125 is comprised of a plurality of transistor pairs $125_k$ and $\overline{125}_k$. These transistors are N channel MOS transistors (NMOSs). The transistor pairs $125_k$ and $\overline{125}_k$ are respectively electrically connected between the flip-flops $RF_k$ of the first read register 117 and flip-flops $RF'_k$ of the second read register 127. Further, the transistor pairs $125_k$ and $\overline{125}_k$ transfer data read from the memory cells $Q_{kj}$ of the memory cell array 101 to their corresponding flip-flops $RF'_k$ in response to the second read control signal PRT2.

The second read register 127 is comprised of the flip-flops $RF'_k$ (k=1~m) respectively electrically connected to the transistor pairs $125_k$ and $\overline{125}_k$ of the transfer circuit 125. Each flip-flop $RF'_k$ is made up of two inverters $RI_{n'k}$ and $\overline{RI_{n'k}}$ electrically reversely parallel-connected to one another. The second read register 127 has the function of storing therein read data corresponding to each column, which have been transferred from the transfer circuit 125.

A transfer circuit 129 is electrically connected between a pair of second read data buses RD2 and $\overline{RD2}$ and the second read register 127 and comprises a plurality of transistor pairs $129_k$ and $\overline{129}_k$. These transistors are N channel MOS transistors (NMOSs). The transistor pairs $129_k$ and $\overline{129}_k$ are respectively electrically connected between the flip-flops $RF'_k$ and the second read data bus pair RD2 and $\overline{RD2}$. The transfer circuit 129 transfers each read data stored in the second read register 127 to the second read data bus pair RD2 and $\overline{RD2}$ in response to an address signal $YR_{2k}$ supplied from a second Y address decoder (Read) 131.

A second output circuit 133 is electrically connected to the second read data bus pair RD2 and $\overline{RD2}$. The second output circuit 133 outputs each read data transferred from the second read register 127 to a second output terminal DOUT2.

Figure 2A:
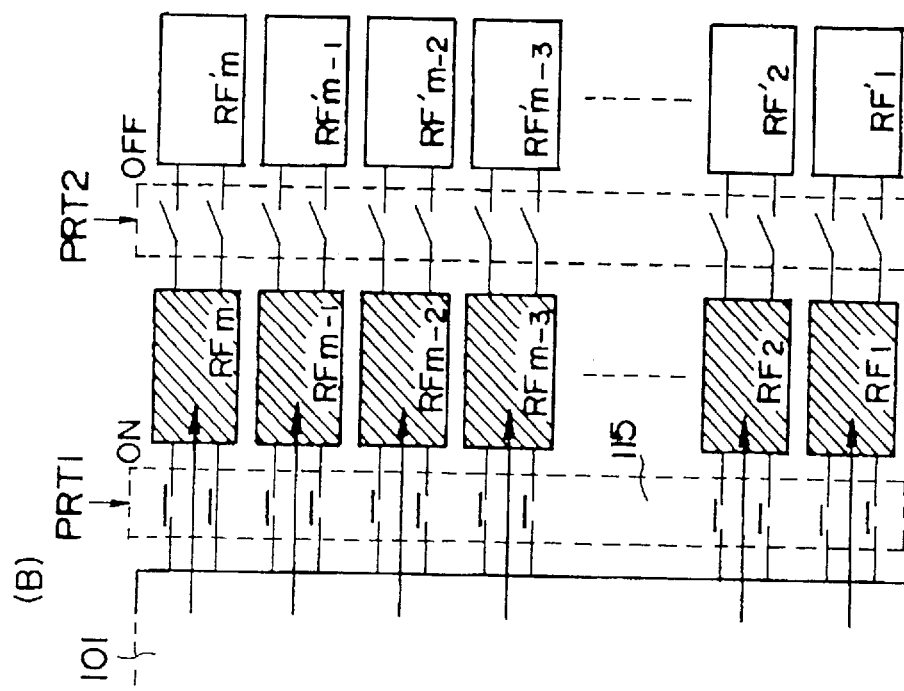
FIG. 2 is a view typically illustrating characteristic portions of the serial access memory shown in FIG. 1.
Figure 2B:
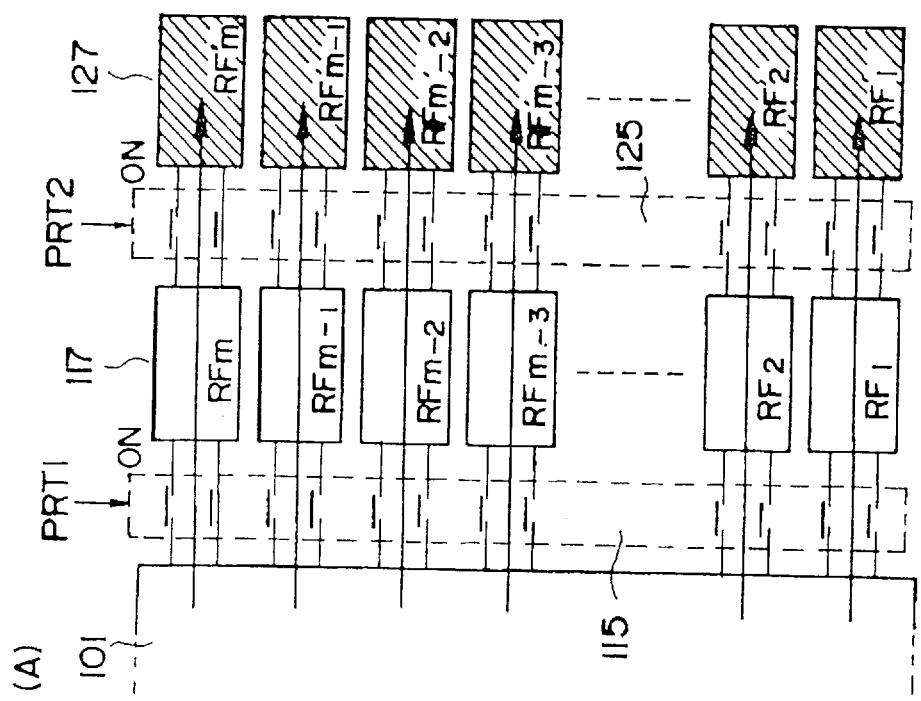

The present invention will now be described with reference to FIGS. 2(A) and 2(B), showing characteristic portions of the present invention to provide an easier understanding of the present invention. In this case, the same elements of structure as those employed in the serial access memory shown in FIG. 1 are identified by like reference numerals.

In the serial access memory according to the present invention, the first read register 117 is electrically series-connected to the second read register 127 as shown. When data are input to the second read register 127 in the present serial access memory, the transfer circuit 115 is first turned ON in response to the first read control signal PRT1 and the transfer circuit 125 is then turned ON in response to the second read control signal PRT2 as shown in FIG. 2(A). As a result, data read from the memory cell array 101 are transferred to the second read register 127 through the first read register 117. On the other hand, when data are input to the first read register 117, the transfer circuit 115 is first turned ON in response to the first read control signal PRT1 and the transfer circuit 125 is then turned OFF in response to the second read control signal PRT2 as shown in FIG. 2(B). As a result, data read from the memory cell array 101 are transferred to the first read register 117.

The operation of the serial access memory according to the present embodiment will now be described in detail with reference to timing charts shown in FIGS. 3(A)–3(O) and 4(A)–4(O). In this case, a write operation and a read operation will be described individually to provide an easy understanding. The write operation and the read operation will be described with reference to the timing charts shown in FIGS. 3(A)–3(O) and 4(a)–4(O) respectively. The write and read operations of the serial access memory can be performed simultaneously by carrying out the write and read operations separately from each other. Such operations can be easily understood by reference to the following description. This description will be made for each period to provide an easy understanding.

The serial access memory is activated in response to a clock signal CLK. The clock signal CLK is generated from a clock signal generating circuit 500 shown in FIG. 5(A). The clock signal generating circuit 500 comprises an inverter unit 501 comprised of a plurality of odd-stage inverters $501_1$ through $501_j$ (j:j≧odd number of three) electrically series-connected to each other, an inverter 503 and a gate circuit 505. An output of the inverter $501_j$ is electrically connected to an input of the inverter $501_1$ and an input of the inverter 503. An output $P_o$ of the inverter 503 is electrically connected to one of the inputs of the gate circuit 505. A clock control signal CLE is supplied to the other input of the gate circuit 505.

A simplified operation of the clock signal generating circuit 500 is represented by a timing chart shown in FIGS. 5(B)–5(D). During a period (corresponding to a time interval between $t_A$ and $t_B$) in which the logic level of the clock control signal CLE is HIGH (hereinafter called "H"), the clock signal CLK is output from the clock signal generating circuit 500.

The operation of the serial access memory at the time that data is input from the outside will first be described with reference to FIGS. 3(A)–3(O).

<Period $t_1$>

Write data $d_1$, is input to the input circuit 105 from the input terminal DIN. The write data $d_1$ is supplied from the input circuit 105 to the write data bus pair WDB and $\overline{WDB}$. Since an address signal $YW_1$, supplied from the Y address decoder (Write) 107 is of the "H" at this time, a pair of transistors $109_1$, and $\overline{109_1}$, of the transfer circuit 109 is turned ON so that the write data $d_1$ is input to a flip-flop $WF_1$, of the write register 111.

<Period $t_2$>

Similarly, write data $d_2$ is supplied to the write data bus pair WDB and $\overline{WDB}$ from the input circuit 105. Since an address signal $YW_2$ is of the "H" level at this time, a transistor pair $109_2$ and $\overline{109_2}$ of the transfer circuit 109 is turned ON so that the write data $d_2$ is input to a flip-flop $WF_2$ of the write register 111.

<Period $t_3$>

Write data $d_3$ is supplied to the write data bus pair WDB and $\overline{WDB}$ from the input circuit 105 in the same manner as described above. Since an address signal $YW_3$ is of the "H" level at this time, a transistor pair $109_3$ and $\overline{109_3}$ of the transfer circuit 109 is turned ON so that the write data $d_3$ is input to a flip-flop $WF_3$ of the write register 111.

<Period $t_4$>

Write data $d_m$ is hereafter supplied to the write data bus pair WDB and $\overline{WDB}$ from the input circuit 105 in the same manner as described above. Since an address signal $YW_m$ is of the "H" level at this time, a transistor pair $109_m$ and $\overline{109_m}$ of the transfer circuit 109 is turned ON so that the write data $d_m$, is input to a flip-flop $WF_m$ of the write register 111.

<Period $t_5$>

A desired word line $WL_a$ ($1 \leq a \leq n$) is selected by the X address decoder 103. In this case, the potential level of the selected word line $WL_a$, is brought to the "H" level. Simultaneously, the logic level of the write control signal PWT is rendered "H" in level so that transistor pairs $113_1$, and $\overline{113_1}$ through $113_m$ and $\overline{113_m}$ of the transfer circuit 113 are turned ON. Thus, the write data d1 through $d_m$ stored in the write register 111 are written into their corresponding memory cells $Q_1$, a through $Q_m$ a electrically connected to the word line $WL_a$.

The write data are written into their corresponding memory cells of the memory cell array 101 in the above-described manner.

The read operation of the serial memory according to the present embodiment will now be described with reference to FIGS. 4(A)–4(O). In this case, the operations for outputting read data from the first and second output terminals DOUT1 and DOUT2 respectively will be described below.

<Period $t_1$,>

A desired word line $WL_a$ ($1 \leq a \leq n$) is selected by the X address decoder 103. In this case, the potential of the selected word line $WL_a$ is brought to the "H" level. The word line $WL_a$ is electrically connected to a memory cell group having data stored therein to be read from the second output terminal DOUT2.

At this time, the data stored in the memory cells $Q_1$, a through $Q_m$, a respectively connected to the word line $WL_a$ are read into the bit line pairs $BL_1$ and $\overline{BL_1}$ through $BL_m$ and $\overline{BL_m}$ to which their corresponding memory cells are electrically connected. Thereafter, the data read into the bit line pairs are amplified by sense amplifiers $SA_1$, through $SA_m$ respectively.

<Period $t_2$>

Next, the logic levels of each of the first and second read control signals PRT1 and PRT2 are brought to the "H" level. Accordingly, transistor pairs $115_1$ and $\overline{115_1}$ through $115_m$ and $\overline{115_m}$ of the transfer circuit 115 are turned ON and transistor pairs $125_1$, and $\overline{125_1}$, through $125_m$ and $\overline{125_m}$ of the transfer circuit 125 are turned ON.

Thus, the data on the bit line pairs $BL_1$, and $\overline{BL_1}$ through $BL_m$ and $\overline{BL_m}$, which have been amplified by the sense amplifiers $SA_1$ through $SA_m$ during the period $t_1$, are transferred to the first read register 117 at the same time. Further, the data are input to the second read register 127 through the first read register 117.

<Period $t_3$>

Next, a desired word line $WL_b$ ($1 \leq b \leq n$) is selected by the X address decoder 103. In this case, the potential of the selected word line $WL_b$ is brought to the "H" level. The word line $WL_b$ is electrically connected to a memory cell group having data stored therein to be read from the first output terminal DOUT1.

At this time, the data stored in the memory cells $Q_1$, b through $Q_m$, b respectively connected to the word line $WL_b$ are read into the bit line pairs $BL_1$ and $\overline{BL_1}$ through $BL_m$ and $\overline{BL_m}$ to which their corresponding memory cells are electrically connected. Thereafter, the data read into the bit line pairs are amplified by the sense amplifiers $SA_1$, through $SA_m$ respectively.

<Period t4>

Next, the logic level of the first read control signal PRT1 is next brought to "H" and the logic level of the second read control signal PRT2 is rendered "L" in level. Thus, the transistor pairs $115_1$, and $\overline{115_1}$, through $115_m$, and $\overline{115_m}$ of the transfer circuit 115 are turned ON and the transistor pairs $125_1$ and $\overline{125_1}$ through $125_m$ and $\overline{125_m}$ of the transfer circuit 125 are turned OFF.

As a result, the data on the bit line pairs $BL_1$ and $\overline{BL_1}$ through $BL_m$ and $\overline{BL_m}$, which have been amplified by the sense amplifiers $SA_1$, through $SA_m$ during the period $t_1$, are input to the first read register 117 at the same time.

<Period $t_5$,>

Next, an address signal $YR_{11}$ supplied from the first Y address decoder (Read) 121 is brought to the "H" level so that a transistor pair $119_1$ and $\overline{119_1}$ of the transfer circuit 119 is turned ON. Accordingly, the read data stored in the flip-flop $RF_1$ of the first read register 117 is transferred to the output circuit 123 through the first read data bus pair RD1 and $\overline{RD1}$. Thereafter, data D1 is output to the first output terminal DOUT1 from the output circuit 123.

Similarly, an address signal $YR_{21}$ supplied from the second Y address decoder (Read) 131 is brought to the "H" level so that a transistor pair $129_1$, and $\overline{129_1}$ of the transfer circuit 129 is turned ON. Thus, the read data stored in the flip-flop $RF'_1$ of the second read register 127 is transferred to the output circuit 133 through the second read data bus pair RD2 and $\overline{RD2}$. Thereafter, data D1' is output to the second output terminal DOUT2 from the output circuit 133.

<Period $t_6$>

An address $YR_{12}$ supplied from the first Y address decoder (Read) 121 is then brought to the "H" level so that a transistor pair $119_2$ and $\overline{119_2}$ of the transfer circuit 119 is turned ON. Thus, the read data stored in the flip-flop $RF_2$ of the first read register 117 is transferred to the output circuit 123 through the first read data bus pair RD1 and $\overline{RD1}$. Thereafter, data D2 is output to the first output terminal DOUT1 from the output circuit 123.

Similarly, an address signal $YR_{22}$ supplied from the second Y address decoder (Read) 131 is brought to the "H" level so that a transistor pair $129_2$ and $\overline{129_2}$ of the transfer circuit 129 is turned ON. Thus, the read data stored in the flip-flop $RF'_2$ of the second read register 127 is transferred to the output circuit 133 through the second read data bus pair RD2 and $\overline{RD2}$. Thereafter, data D2' is output to the second output terminal DOUT2 from the output circuit 133.

Similar to the above operations as indicated by periods $t_7$ and $t_8$, data D3, D4, . . . Dm are subsequently successively output from the first output terminal DOUT1. Further, data D3', D4', . . . Dm' are successively output from the second output terminal DOUT2.

Thus, the data read from the memory cell array are successively output from the two output terminals.

The following serial access memories (called "two port memories") are normally considered to be of such a type that the data read from the memory cell array are read from two output terminals.

There is known a first serial access memory of a type wherein a memory cell at an address common to the same two serial access memories provided adjacent to each other and electrically connected to an input circuit in which a write data bus common to the serial access memories is used, is selected and the same write data is written into the memory cell and data stored in memory cells at different addresses are respectively read from separately-provided output circuits in accordance with separate read operations.

There is known a second access memory cell of a type wherein two read registers are electrically parallel-connected to a bit line pair of a memory cell array through a transfer circuit and alternately-read data are output therefrom.

Let us now perform a comparison between the serial access memory according to the first embodiment of the present invention and the aforementioned first serial access memory. In the first serial access memory, a two port memory is realized using the two serial access memories. In the serial access memory according to the first embodiment of the present invention in contrast with this, a two port memory can be realized using a single serial access memory. Therefore, the serial access memory according to the first embodiment of the present invention permits a great reduction in its occupied area as compared with the first serial access memory. Since the occupied area can be reduced, wiring lengths of respective signal lines or conductors can also be shortened so that high-speed operation can be expected. Since the two port memory is realized using the single serial access memory in the case of the serial access memory according to the first embodiment of the present invention, power consumption can be greatly reduced.

Further, wires and transfer circuits are provided around a peripheral portion of a read register in close order. Therefore, the more the integration of memory cells advances, the more the degree of freedom of design at its peripheral portion is reduced. Since, however, the length of a wire for connecting the read registers to each other is made longer because the read registers are parallel-connected to each other in the second serial access memory, an improvement in integration makes it difficult to design the wires at the peripheral portion. Otherwise, an increase in pitch between memory cells in a column direction (i.e., in a direction parallel to the Y address decoder) is inevitable to ensure the degree of freedom of design at the peripheral portion. This interferes with the integration of a semiconductor memory device. On the other hand, since the serial access memory according to the first embodiment of the present invention is constructed such that the two read registers are electrically connected in series with each other, the wires electrically connected to the two read registers can be greatly reduced in length as compared with the second serial access memory. Therefore, a degree of freedom of design at the peripheral portion of each read register can be ensured and the integration of the peripheral portion can also be achieved according to the integration of each memory cell.

According to the serial access memory of the first embodiment of the present invention, as has been described above, a function identical to that which has been achieved by a plurality of serial access memories, can be realized by a single serial access memory. It is also possible to provide a serial access memory whose degree of integration can be rendered high and which enables a reduction in cost.

Figure 6:
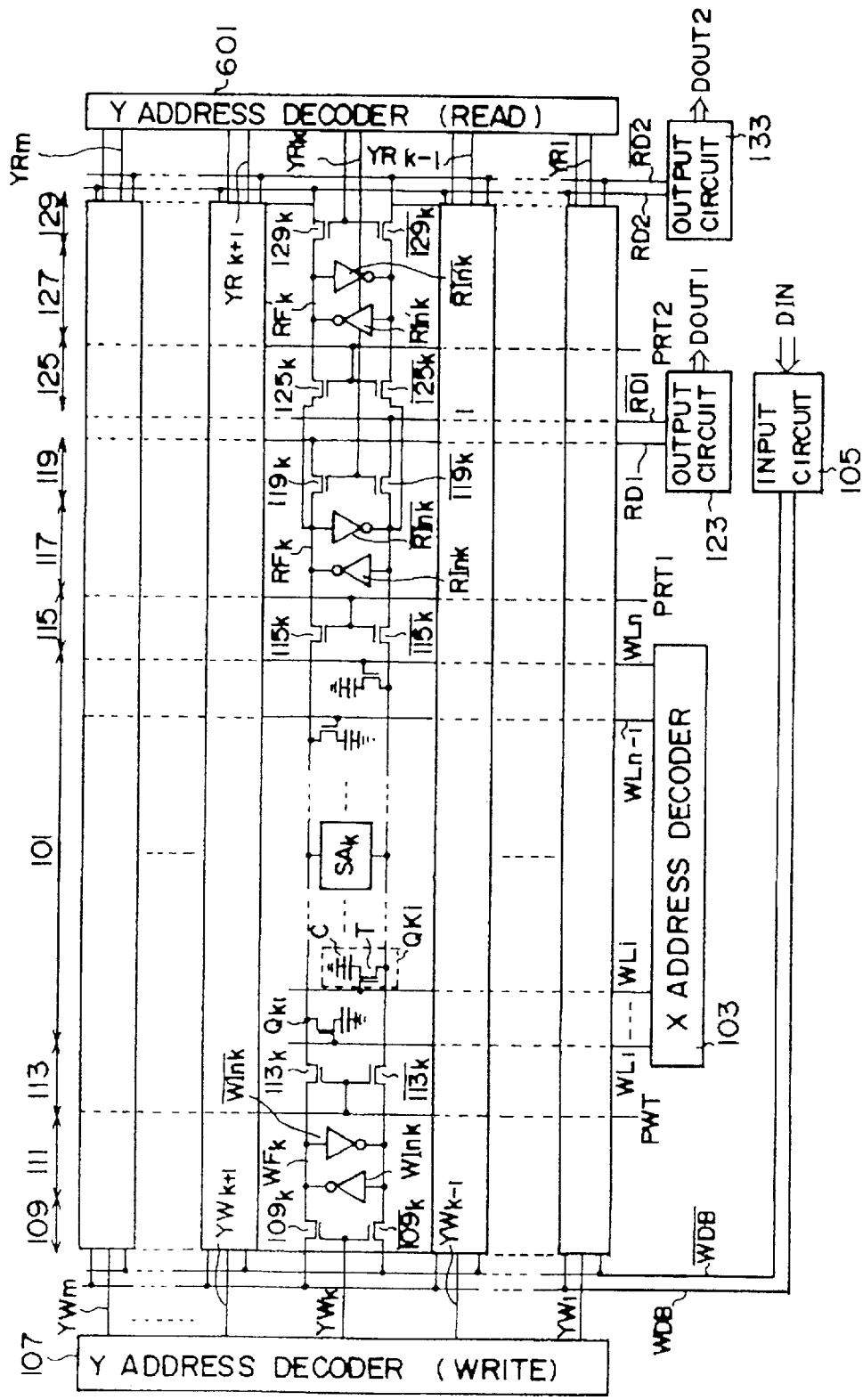
FIG. 6 is a circuit block diagram showing the structure of a principal part of a serial access memory according to a second embodiment of the present invention.

A second embodiment of the present invention will now be described below with reference to FIG. 6. FIG. 6 is a circuit block diagram showing the structure of a serial access memory according to the second embodiment of the present invention. In this case, the same elements of structure as those shown in the serial access memory according to the first embodiment are identified by like reference numerals and their description will therefore be omitted.

The serial access memory according to the second embodiment is basically substantially identical in structure to the serial access memory according to the first embodiment. The serial access memory according to the second embodiment is different from the serial access memory according to the first embodiment in that the first and second read Y address decoders 121 and 131 employed in the first embodiment are replaced by a common Y address decoder (Read) 601. The Y address decoder (Read) 601 is identical in structure and function to each of the first and second Y address decoders 121 and 131.

Namely, an address signal $YR_k$ ($1 \leq k \leq m$) output from the Y address decoder (Read) 601 is supplied to the gate electrodes of the transistor pair $119_k$ and $\overline{119_k}$ of the transfer circuit 119 and the gate electrodes of the transistor pair $129_k$ and $\overline{129_k}$ of the transfer circuit 129.

Figure 7:
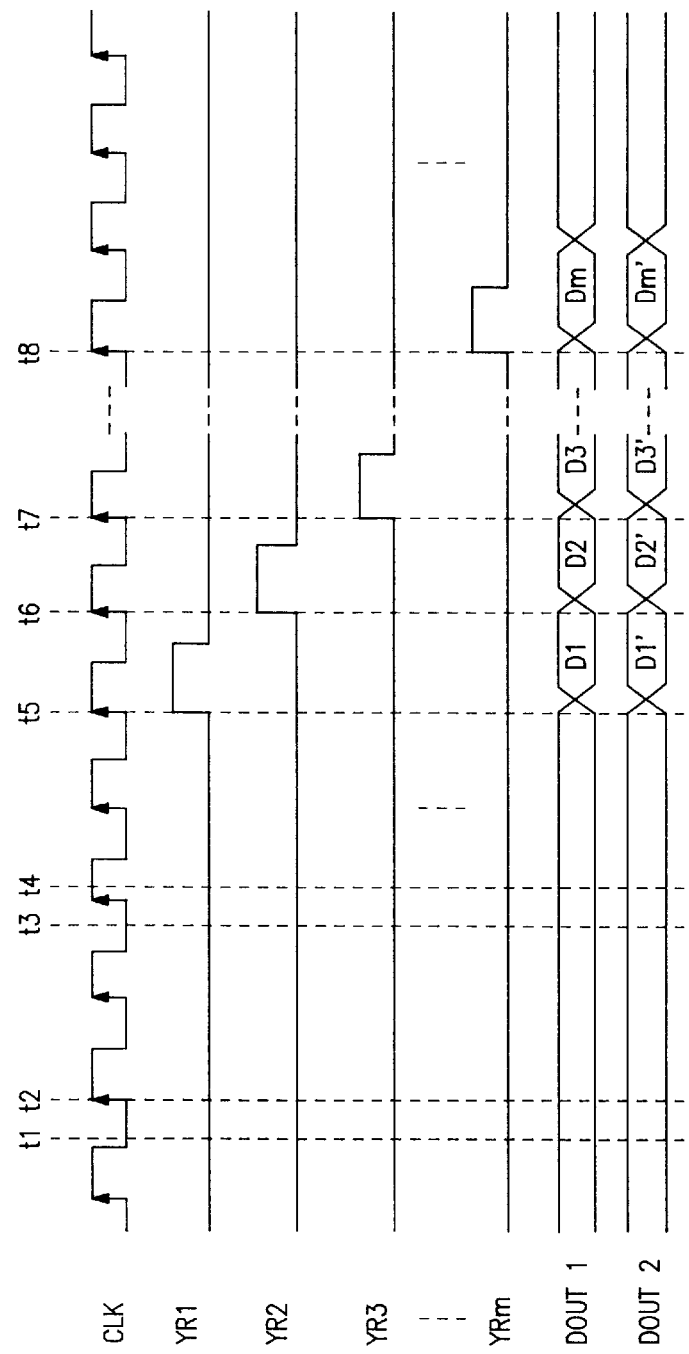
FIGS. 7 (A)–7(G) are a partial timing chart for describing a data read operation of the serial access memory shown in FIG. 6.

A read operation of the serial access memory according to the present embodiment will next be described with reference to a timing chart shown in FIGS. 7(A)–7(G). In this case, the operation of the serial access memory, for outputting read data from the first and second output terminals DOUT1 and DOUT2 is shown in FIGS. 7(F) and 7(G). The operation of the serial access memory according to the present embodiment can be easily understood by reference to the description of the operation of the serial access memory according to the first embodiment, which is shown by the timing chart of FIGS. 4(A)–4(D). Accordingly, the description of operations executed during periods $t_1$ through $t_4$ will be omitted by reference to the description of FIG. 4 and operations subsequent to a period $t_5$ will be described in the present embodiment.

<Period $t_5$>

An address signal $YR_1$, supplied from the Y address decoder (Read) 601 is brought to the "H" level so that a transistor pair $119_1$, and $\overline{119_1}$ of the transfer circuit 119 and a transistor pair $129_1$, and $\overline{129_1}$ of the transfer circuit 129 are turned ON. Thus, read data stored in a flip-flop $RF_1$ of a first read register 117 is transferred to an output circuit 123 through the first read data bus pair RD1 and $\overline{RD1}$. Further, read data stored in a flip-flop $RF'_1$ of a second read register 127 is transferred to the output circuit 133 through a second read data bus pair RD2 and $\overline{RD2}$. Thereafter, data D1 is output to the first output terminal DOUT1 from the output circuit 123 and data D1' is output to the second output terminal DOUT2 from the output circuit 133.

<Period $t_6$>

Next, an address signal $YR_2$ supplied from the Y address decoder (Read) 601 is brought to the "H" level so that a transistor pair $119_2$ and $\overline{119_2}$ of the transfer circuit 119 is turned ON and a transistor pair $129_2$ and $\overline{129_2}$ of the transfer circuit 129 is turned ON. Thus, read data stored in a flip-flop $RF_2$ of the first read register 117 is transferred to the output circuit 123 through first read data bus pair RD1 and $\overline{RD1}$. Further, read data stored in a flip-flop $RF'_2$ of the second read register 127 is transferred to the output circuit 133 through the second read data bus pair RD2 and $\overline{RD2}$. Thereafter, data D2 is output to the first output terminal DOUT1 from the output circuit 123 and data D2' is output to the second output terminal DOUT2 from the output circuit 133.

Similarly to the above operations as indicated by periods $t_7$ and $t_8$, data D3, D4, . . . Dm are subsequently successively output from the first output terminal DOUT1. Further, data D3', D4', . . . Dm' are successively output from the second output terminal DOUT2.

Thus, the data read from the memory cell array are successively output from the two output terminals.

The serial access memory according to the second embodiment brings about the advantageous effect obtained by the serial access memory according to the first embodiment and shares the use of the read Y address decoder. It is therefore possible to realize a serial access memory which is reduced in its occupied area. As fields to which the serial access memory according to the second embodiment is applied, there are considered those such as low-grade TV and VTR, etc. which do not necessarily require the correction of a time base and are accessible under the same Y address.

Figure 8:
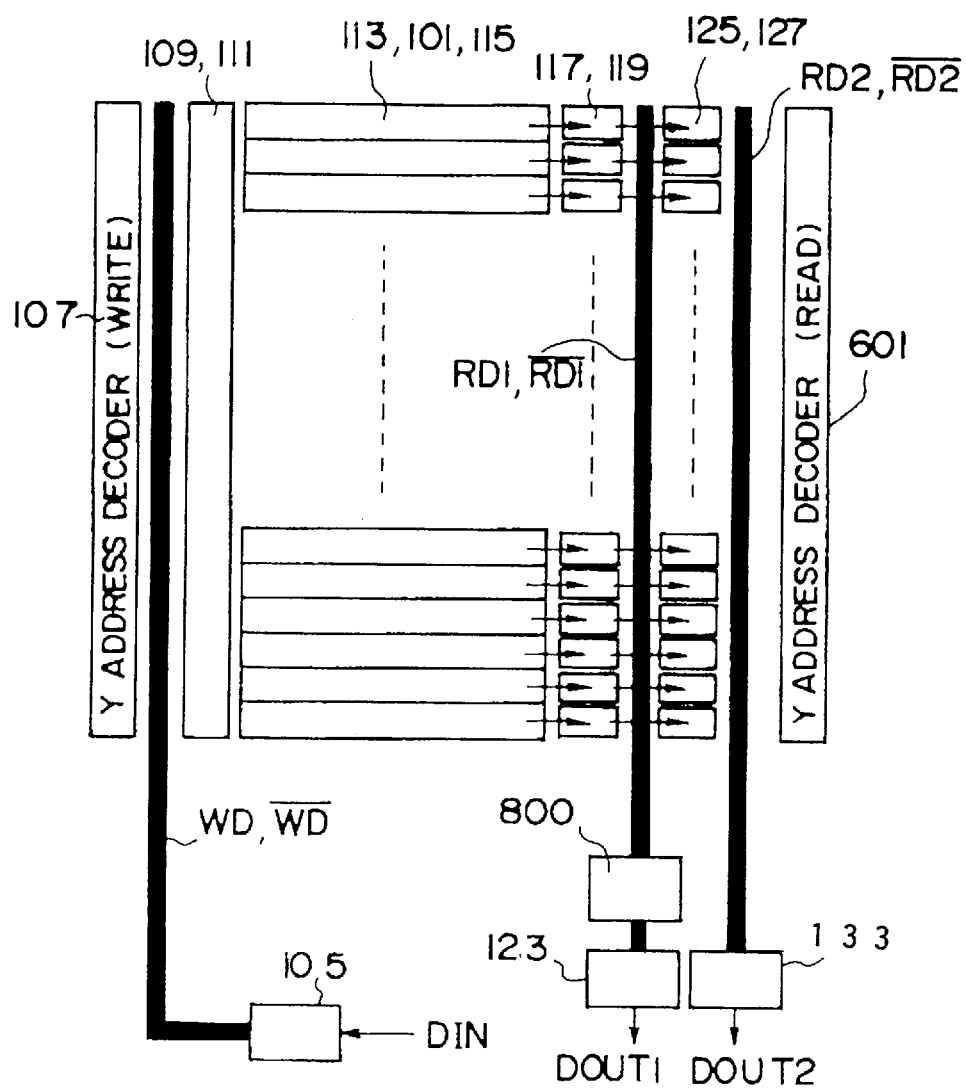
FIG. 8 is a circuit block diagram typically illustrating the structure of a principal part of a serial access memory according to a third embodiment of the present invention.

A third embodiment of the present invention will now be described below with reference to FIG. 8. FIG. 8 is a block diagram showing the structure of a serial access memory according to the third embodiment of the present invention. In this case, the aforementioned elements are suitably blocked and typically shown to provide an easy understanding of illustration of the present embodiment. The same elements of structure as those described above are identified by like reference numerals and their description will therefore be omitted.

The serial access memory according to the third embodiment is basically substantially identical in structure to the serial access memory according to the second embodiment. The serial access memory according to the third embodiment is different from the serial access memory according to the second embodiment in that a first delay circuit 800 is electrically connected between a first read data bus pair RD1 and $\overline{\text{RD1}}$ and a first output circuit 123. The first delay circuit 800 has the function of delaying the transfer of data read on the read data bus pair by a predetermined period of time upon transfer of the data. The first delay circuit 800 may be provided between the second read data bus pair RD2 and $\overline{\text{RD2}}$ and the second output circuit 133 as an alternative to the provision of the first delay circuit 800 between the first read data bus pair RD1 and $\overline{\text{RD1}}$ and the first output circuit 123. Namely, the delay circuit may be connected between either one of the read data bus pairs and either one of the output circuits.

Figure 9:
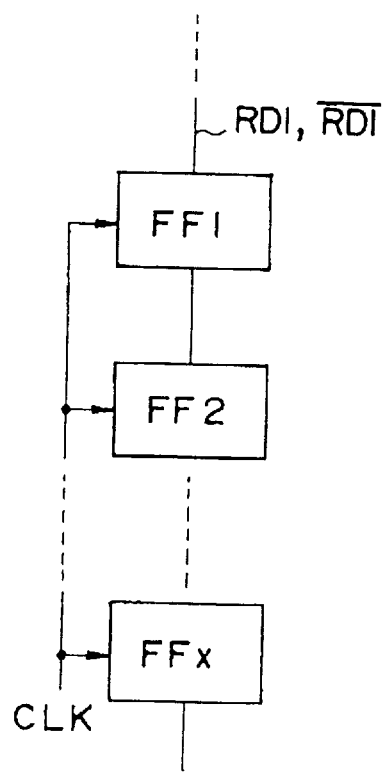
FIG. 9 is a circuit block diagram depicting the structure of a delay circuit employed in the serial access memory shown in FIG. 8.
Figure 10:
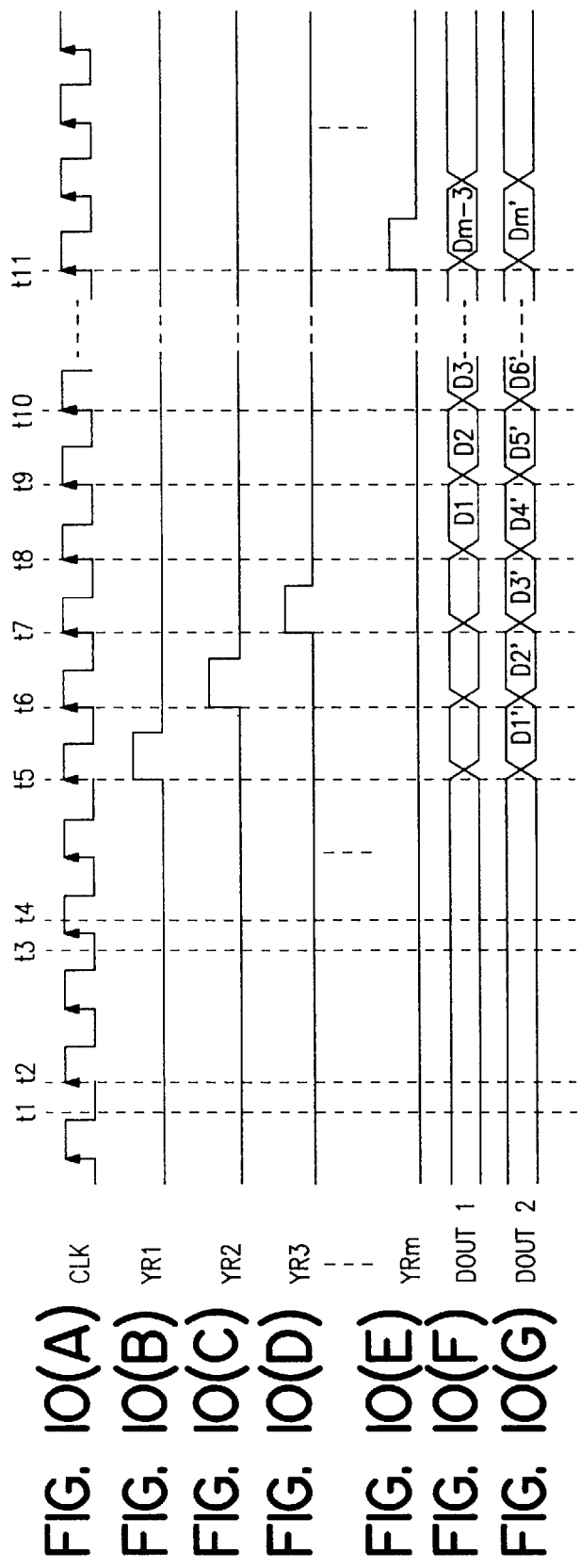
FIGS. 10(A)–10(G) are a partial timing chart for describing a data read operation of the serial access memory shown in FIG. 8.

As shown in FIG. 9, the first delay circuit 800 comprises a plurality of flip-flops $FF_1$ through $FF_x$ electrically series-connected to one another so that read data can be delayed by a predetermined bit. If X=2, then a delay corresponding to 2 bits is developed. If X=3, then a delay corresponding to 3 bits is developed. The first delay circuit 800 is activated in synchronism with the clock signal CLK.

A read operation of the serial access memory according to the present embodiment will now be described with reference to a timing chart shown in FIGS. 10(A)–10(G). In this case, the operation of the serial access memory, for outputting read data from first and second output terminals DOUT1 and DOUT2 when a delay corresponding to three bits is developed (X=3), is shown. The operation of the serial access memory according to the present embodiment can be easily understood by reference to the description of the operations of the serial access memories according to the first and second embodiments, which are shown by the timing charts of FIGS. 4(A)–4(O) and 7(A)–7(G). Thus, a description of operations executed during periods $t_1$, through $t_4$ will be omitted by reference to the description of FIG. 4 and operations subsequent to a period $t_5$ will be described in the present embodiment.

<Period $t_5$>

An address signal $YR_1$, supplied from a Y address decoder (Read) 601 is brought to the "H" level so that a transistor pair 119₁, and $\overline{119_1}$ of the transfer circuit 119 and a transistor pair 129₁, and $\overline{129_1}$ of the transfer circuit 129 are turned ON. Thus, read data stored in a flip-flop $RF_1$, of the first read register 117 is transferred to the first delay circuit 800 through a first read data bus pair RD1 and $\overline{\text{RD1}}$. Thereafter, the read data is stored in a flip-flop $FF_1$. Simultaneously, read data stored in a flip-flop $RF'_1$ of the second read register 127 is transferred to an output circuit 133 through the second read data bus pair RD2 and $\overline{\text{RD2}}$. Thereafter, data D1' is output to the second output terminal DOUT2 from the output circuit 133.

<Period $t_6$>

Next, an address signal $YR_2$ supplied from the Y address decoder (Read) 601 is brought to the "H" level so that a transistor pair 119₂ and $\overline{119_2}$ of the transfer circuit 119 is turned ON and a transistor pair 129₂ and $\overline{129_2}$ of the transfer circuit 129 is turned ON. Thus, read data stored in a flip-flop $RF_2$ of the first read register 117 is transferred to the first delay circuit 800 through the first read data bus pair RD1 and $\overline{\text{RD1}}$. At this time, data stored in a flip-flop $FF_1$ is input to a flip-flop $FF_2$ in synchronism with the clock signal CLK and the data read from the flip-flop $RF_2$ is input to the flip-flop $FF_1$. Further, read data stored in a flip-flop $RF'_2$ of the second read register 127 is transferred to the output circuit 133 through the second read data bus pair RD2 and $\overline{\text{RD2}}$. Thereafter, data D2' is output to the second output terminal DOUT2 from the output circuit 133.

<Period $t_7$>

Next, an address signal $YR_3$ supplied from the Y address decoder (Read) 601 is brought to the "H" level so that a transistor pair 119₃ and $\overline{119_3}$ of the transfer circuit 119 is turned ON and a transistor pair 129₃ and $\overline{129_3}$ of the transfer circuit 129 is turned ON. Thus, read data stored in a flip-flop $RF_3$ of the first read register 117 is transferred to the first delay circuit 800 through the first read data bus pair RD1 and $\overline{\text{RD1}}$. At this time, the data stored in the flop-flop $FF_1$ is input to the flip-flop $FF_2$ in synchronism with the clock signal CLK and the data stored in the flip-flop $FF_2$ is input to a flip-flop $FF_3$ in synchronism with the clock signal CLK. Simultaneously, the data read from the flip-flop $FF_3$ is input to the flip-flop $FF_1$. Further, read data stored in a flip-flop $RF'_3$ of the second read register 127 is transferred to the output circuit 133 through the second read data bus pair RD2 and $\overline{\text{RD2}}$. Thereafter, data D3' is output to the second output terminal DOUT2 form the output circuit 133.

<Period $t_8$>

Next, an address signal $YR_4$ supplied from the Y address decoder (Read) 601 is brought to the "H" level so that a transistor pair 119₄ and $\overline{119_4}$ of the transfer circuit 119 is turned ON and a transistor pair 129₄ and $\overline{129_4}$ of the transfer circuit 129 is turned ON. Thus, read data stored in a flip-flop $RF_4$ of the first read register 117 is transferred to the first delay circuit 800 through the first read data bus pair RD1 and $\overline{\text{RD1}}$. At this time, the data stored in the flip-flop $FF_1$ is input to the flip-flop $FF_2$ in synchronism with the clock signal CLK and the data stored in the flip-flop $FF_2$ is input to the flip-flop $FF_3$ in synchronism with the clock signal CLK. Further, the data stored in the flip-flop $FF_3$ is transferred to the output circuit 123. Simultaneously, data read from a flip-flop $FF_4$ is input to the flip-flop $FF_1$. Further, read data stored in a flip-flop $RF'_4$ of the second read register 127 is transferred to the output circuit 133 through the second read data bus pair RD2 and $\overline{\text{RD2}}$. Thereafter, data D1 is output to the first output terminal DOUT1 from the output circuit 123 and data D4' is output to the second output terminal DOUT2 from the output circuit 133.

Similarly to the above operations as indicated by periods $t_9$, $t_{10}$, ..., data D2, D3, ... Dm-3 are subsequently successively output from the first output terminal DOUT1. Further, data D5', D6', ... Dm' are successively output from the second output terminal DOUT2. Thus, the data delayed by the three bits as compared with the data output from the second output terminal DOUT2 is output from the first output terminal DOUT1.

Thus, the data read from the memory cell array are successively output from the two output terminals.

In addition to the advantageous effects obtained by the first and second embodiments, the present embodiment can bring about an advantageous effect capable of delaying data output from one of the output terminals. It is therefore possible to increase variations in data output and make a wide range of user's choice.

Figure 11:
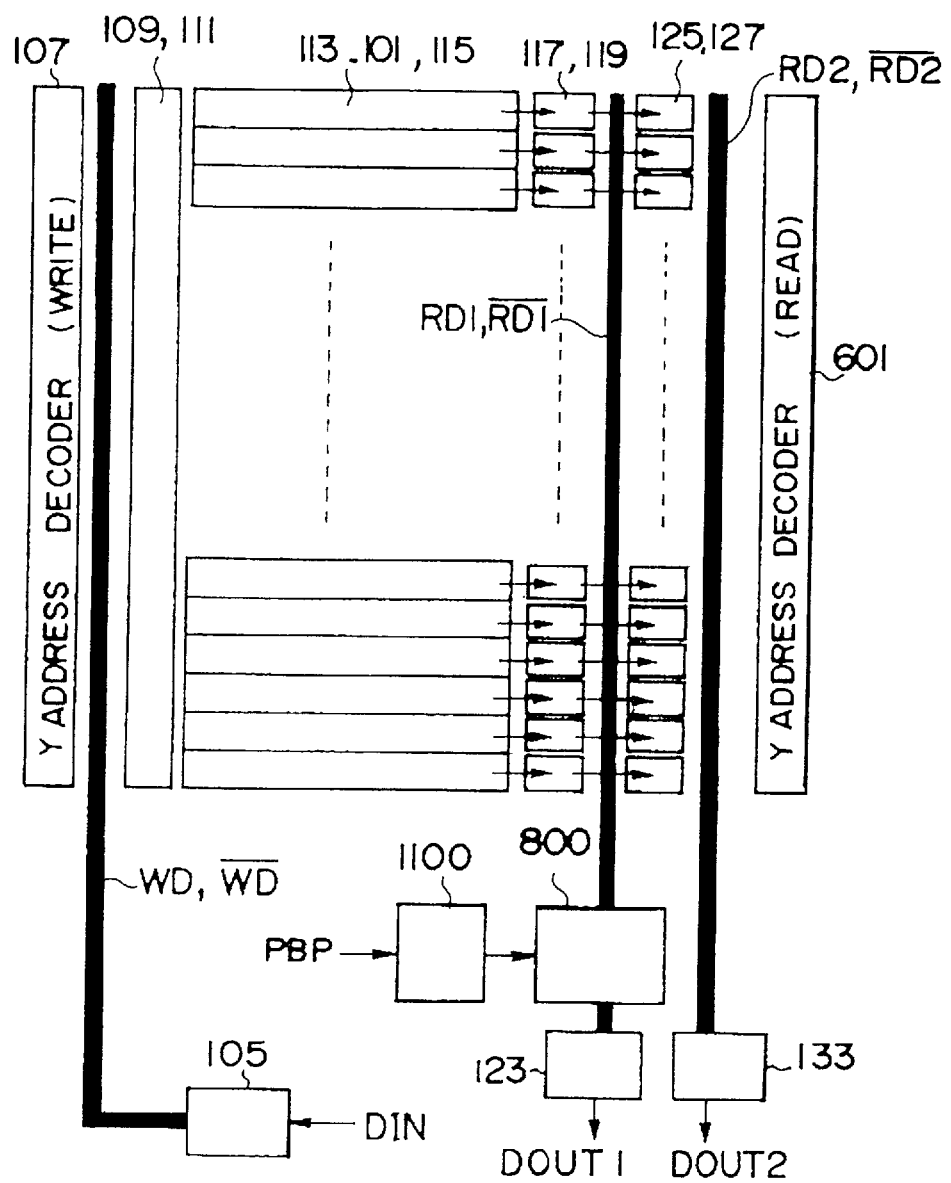
FIG. 11 is a circuit block diagram typically showing the structure of a principal part of a serial access memory according to a fourth embodiment of the present invention.

A fourth embodiment of the present invention will now be described below with reference to FIG. 11. FIG. 11 is a block diagram showing the structure of a serial access memory according to the fourth embodiment of the present invention. In this case, the aforementioned elements are suitably blocked and typically shown to provide an easy understanding of illustration of the present embodiment. The same elements of structure as those described above are identified by like reference numerals and their description will therefore be omitted.

The serial access memory according to the fourth embodiment has a delay bypass circuit 1100 electrically connected to the first delay circuit 800 employed in the serial access memory according to the third embodiment.

Figure 12:
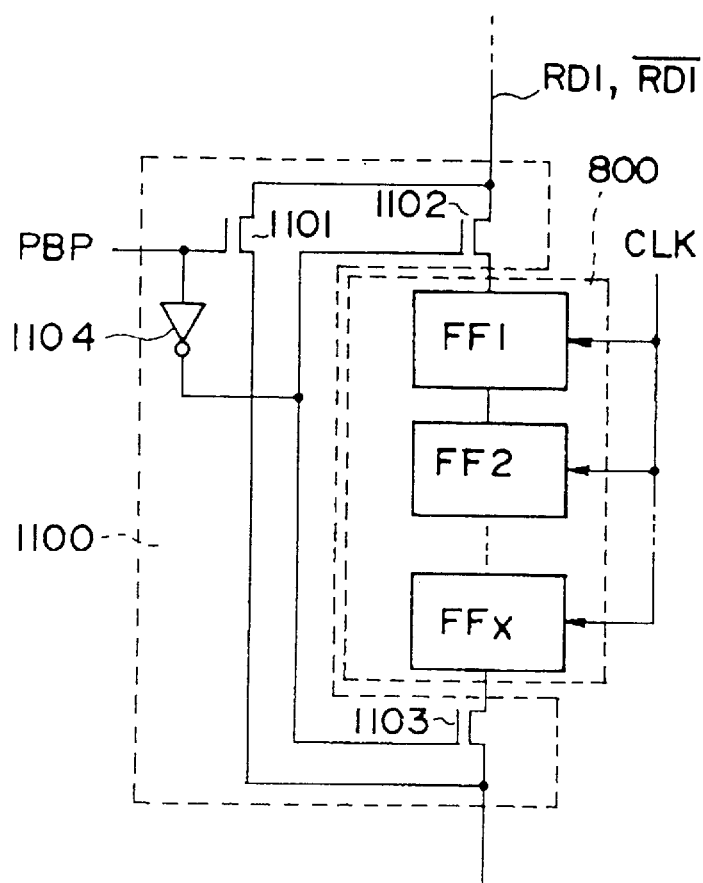
FIG. 12 is a circuit block diagram illustrating the structure of a delay bypass circuit employed in the serial access memory shown in FIG. 11.

As shown in FIG. 12, the delay bypass circuit 1100 comprises transistors 1101, 1102 and 1103, and an inverter 1104. These transistors are N-type MOS transistors. The transistor 1101 is electrically connected between the first read data bus pair RD1 and $\overline{\text{RD1}}$ and the first output circuit 123 so as to be arranged in shunt with the delay circuit 800. Further, the transistor 1102 is electrically connected between a flip-flop $FF_1$ and the first read data bus pair RD1 and $\overline{\text{RD1}}$. Furthermore, the transistor 1103 is electrically connected between a flip-flop FFx and the first output circuit 123. A control electrode of the transistor 1101 is supplied with a delay bypass signal PBP. Further, both control electrodes of the transistors 1102 and 1103 are supplied with the delay bypass signal PBP through the inverter 1104. The delay bypass circuit 1100 has the function of controlling a delay in data transfer in response to the delay bypass signal PBP.

When the delay bypass signal PBP is brought to the "H" level in the serial access memory according to the fourth embodiment, the transistor 1101 is turned ON and the transistors 1102 and 1103 are turned OFF. In this case, data on the read bus pair bypasses the delay circuit 800 so as to be transferred to the first output circuit 123. Namely, a delay effect is not brought about due to this bypass process.

On the other hand, when the delay bypass signal PBP is of the LOW LEVEL (hereinafter simply called "L"), the transistor 1101 is turned OFF and the transistors 1102 and 1103 are turned ON. Thus, since read data is transferred through the delay circuit 800, the output at the first output terminal DOUT1 is delayed by n bits as compared with the output at the second output terminal DOUT2 as in the description of the third embodiment.

According to the serial access memory of the present embodiment, the function of the serial access memory according to the second or third embodiment can be selected based on the delay bypass signal PBP supplied from the outside in addition to the achievement of the advantageous effects of the aforementioned embodiments.

Figure 13:
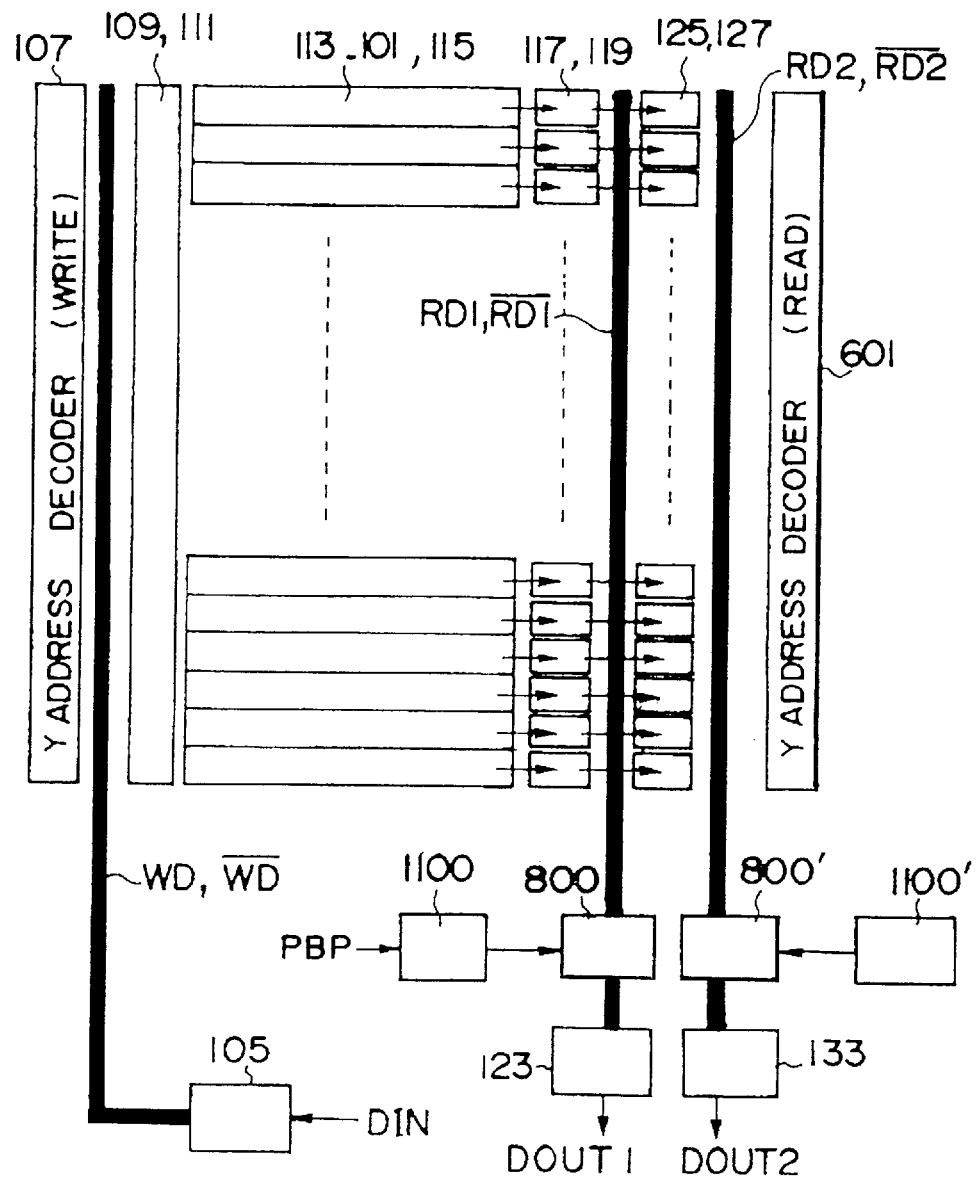
FIG. 13 is a circuit block diagram typically showing the structure of a principal part of a serial access memory according to a fifth embodiment of the present invention.

A fifth embodiment of the present invention will now be described below with reference to FIG. 13. FIG. 13 is a block diagram showing the structure of a serial access memory according to the fifth embodiment of the present invention. In this case, the aforementioned elements are suitably blocked and typically shown to provide an easy understanding of illustration of the present embodiment. The same elements of structure as those described above are identified by like reference numerals and their description will therefore be omitted.

The serial access memory according to the fifth embodiment is constructed such that a delay circuit 800' and a delay bypass circuit 1100' similar to those described in the third and fourth embodiments are added to the second read data bus pair RD2 and $\overline{\text{RD2}}$ of the serial access memory according to the fourth embodiment. The delay circuit 800' and the delay bypass circuit 1100' are identical in structure to the delay circuit 800 and the delay bypass circuit 1100 respectively. These circuits are controlled based on a delay bypass signal PBP'.

The operation of the serial access memory according to the present embodiment can be easily understood by reference to the third and fourth embodiments.

The serial access memory according to the present embodiment can arbitrarily delay read data output from first and second output terminals based on a signal supplied from the outside, as well as bring about the advantageous effects obtained by the aforementioned embodiments.

Figure 14:
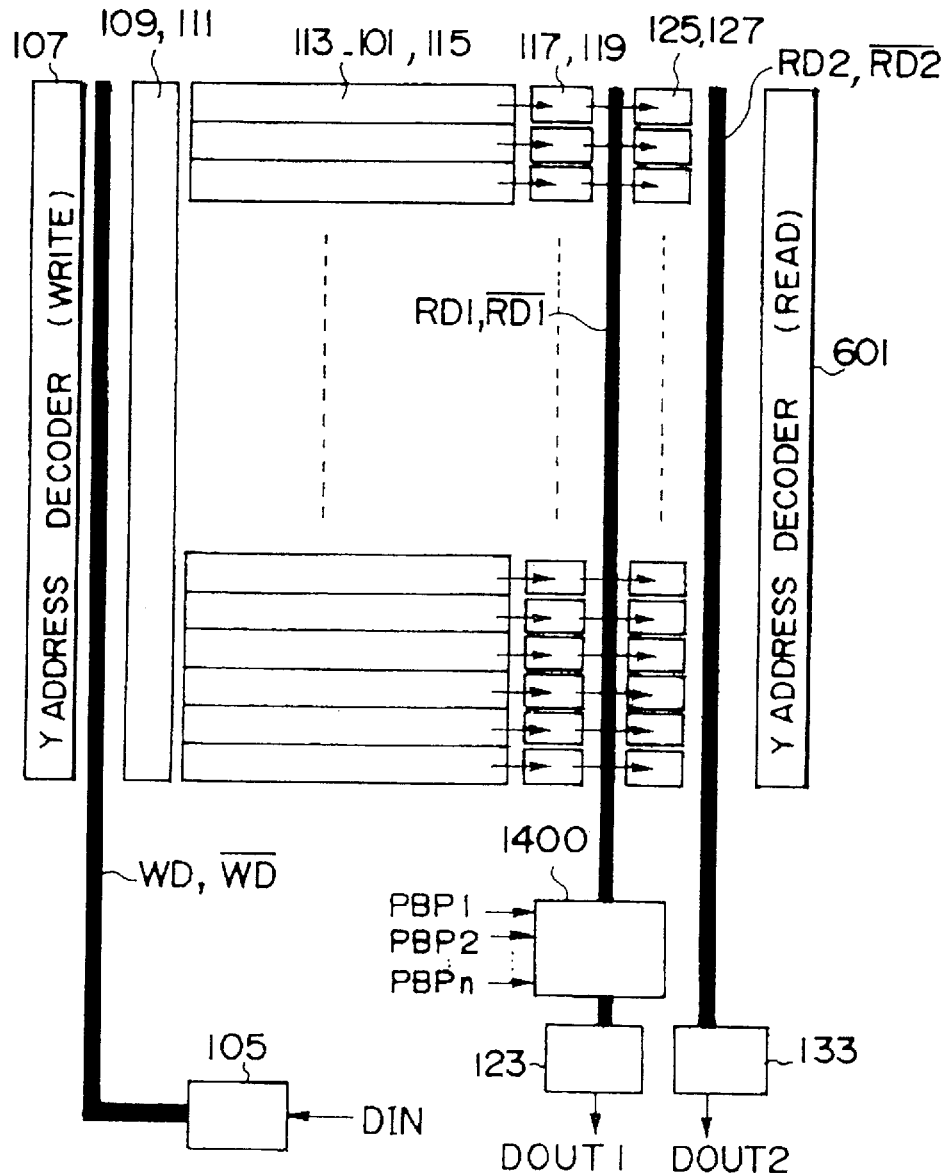
FIG. 14 is a circuit block diagram typically depicting the structure of a principal part of a serial access memory according to a sixth embodiment of the present invention.

A sixth embodiment of the present invention will now be described below with reference to FIG. 14. FIG. 14 is a block diagram showing the structure of a serial access memory according to the sixth embodiment of the present invention. In this case, the aforementioned elements are suitably blocked and typically shown to provide an easy understanding of illustration of the present embodiment. The same elements of structure as those described above are identified by like reference numerals and their description will therefore be omitted.

Figure 15:
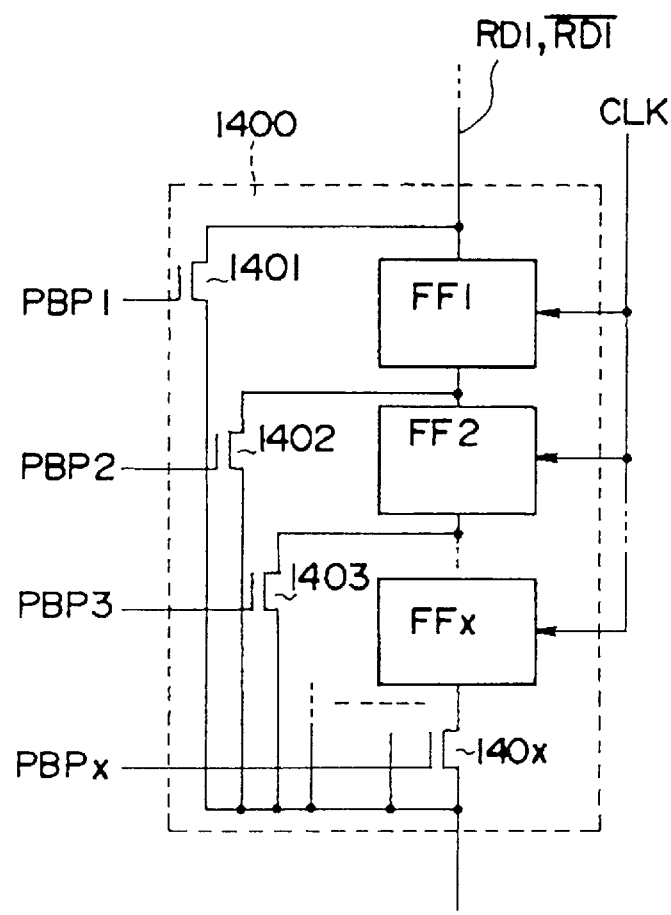
FIG. 15 is a circuit block diagram showing the structure of a delay selection circuit employed in the serial access memory shown in FIG. 14.

In the present embodiment, a delay selection circuit 1400 is electrically connected between the first read data bus pair RD1 and $\overline{\text{RD1}}$ and the first output circuit 123. The delay selection circuit 1400 comprises a plurality of transistors as shown in FIG. 15. These transistors are respectively provided between the first read data bus pair RD1 and $\overline{\text{RD1}}$ and the first output circuit 123 and between flip-flops $FF_1$ through $FF_x$ and the first output circuit 123. Further, these transistors are respectively supplied with delay select signals PBP1 through PBPx. Each of the transistors is ON- or OFF-controlled according to the logic level of each delay select signal. These transistors are N channel MOS transistors.

The serial access memory according to the present embodiment can select a desired delay based on each of the delay select signals PBP1 through PBPx, as well as bring about the advantageous effects obtained by the aforementioned embodiments. Therefore, a delay in data output from the first output terminal can be suitably set.

Figure 16:
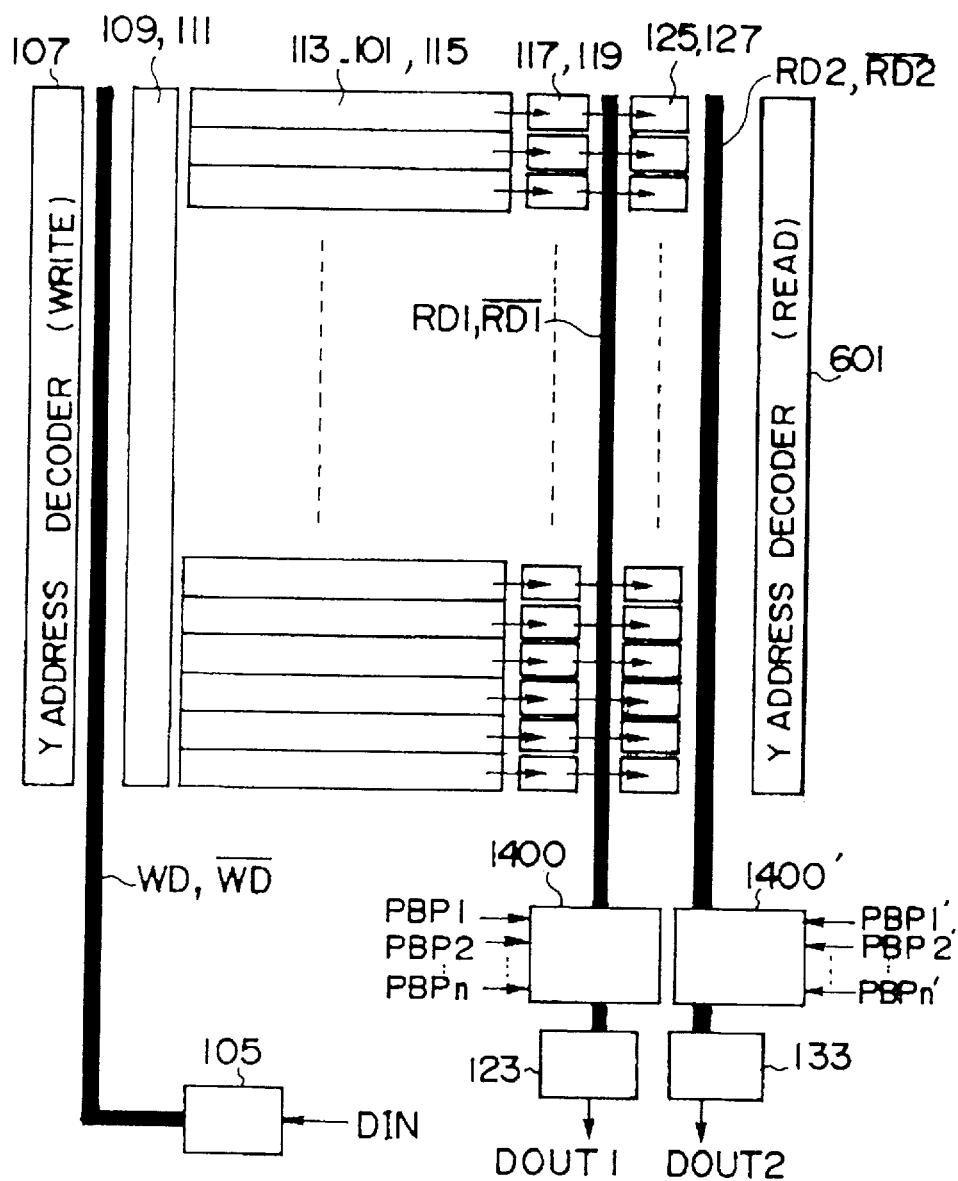
FIG. 16 is a circuit block diagram typically showing the structure of a principal part of a serial access memory according to a seventh embodiment of the present invention.

A seventh embodiment of the present invention will now be described below with reference to FIG. 16. FIG. 16 is a block diagram showing the structure of a serial access memory according to the seventh embodiment of the present invention. In this case, the aforementioned elements are suitably blocked and typically shown to provide an easy understanding of illustration of the present embodiment. The same elements of structure as those described above are identified by like reference numerals and their description will therefore be omitted.

The present embodiment has the structure of the sixth embodiment and is constructed such that a delay selection circuit 1400' identical in structure to the delay selection circuit 1400 employed in the sixth embodiment is electrically connected between the second read data bus pair RD2 and $\overline{\text{RD2}}$ and the second output circuit 133. The detailed configuration of the delay selection circuit 1400' can be easily understood by reference to FIG. 15. These transistors are respectively provided between the second read data bus pair RD2 and $\overline{\text{RD2}}$ and the second output circuit 133 and between flip-flops $FF_1$, through $FF_x$, and the second output circuit 133. Further, these transistors are respectively supplied with delay select signals PBP1' through PBPx'. Each of the transistors is ON- or OFF-controlled according to the logic level of each delay select signal. These transistors are N channel MOS transistors.

The serial access memory according to the present embodiment can select desired delay bits based on each of the delay select signals PBP1 through PBPx and each of the delay select signals PBP1' through PBPx', as well as bring about the advantageous effects obtained by the aforementioned embodiments. Therefore, a delay in data output from each of first and second output terminals can be suitably set.

Figure 17:
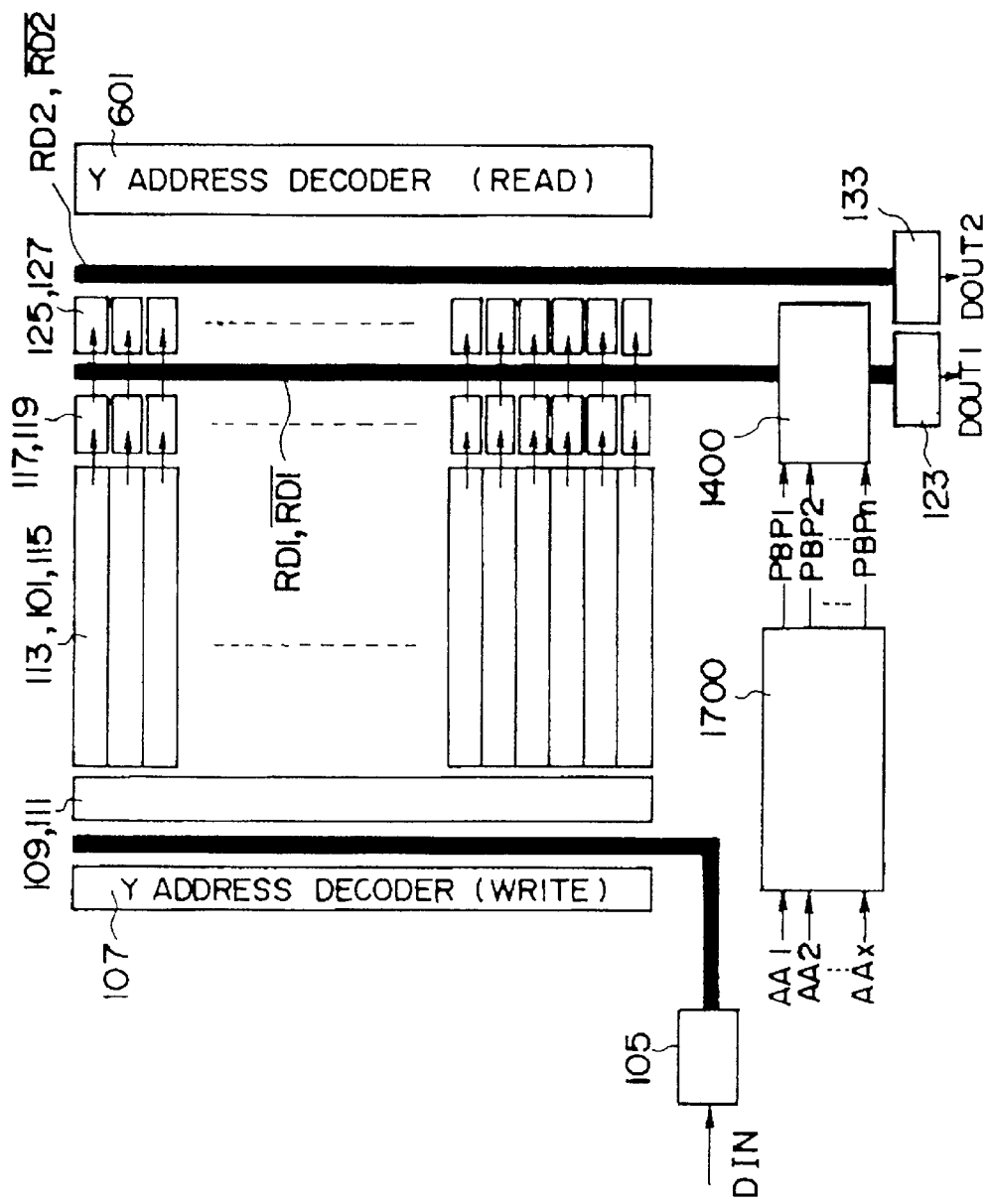
FIG. 17 is a circuit block diagram typically illustrating the structure of a principal part of a serial access memory according to an eighth embodiment of the present invention.

An eighth embodiment of the present invention will now be described below with reference to FIG. 17. FIG. 17 is a block diagram showing the structure of a serial access memory according to the eighth embodiment of the present invention. In this case, the aforementioned elements are suitably blocked and typically shown to provide an easy understanding of the illustration of the present embodiment. The same elements of structure as those described above are identified by like reference numerals and their description will therefore be omitted.

In the present embodiment, a delay control address decoder 1700 for outputting delay select signals PBP1 through PBPx therefrom is electrically connected to the delay selection circuit 1400 employed in the serial access memory according to the sixth embodiment. The delay control address decoder 1700 has a function for decoding addresses AA1 through AAx supplied from the outside to control delay bits and outputting the delay select signals PBP1 through PBPx based on the result of decoding.

According to the present embodiment, since the delay select signals are produced based on the external addresses in addition to the advantageous effects obtained by the aforementioned embodiments, the number of delay bits can be suitably set based on the reduced number of external signals.

Figure 18:
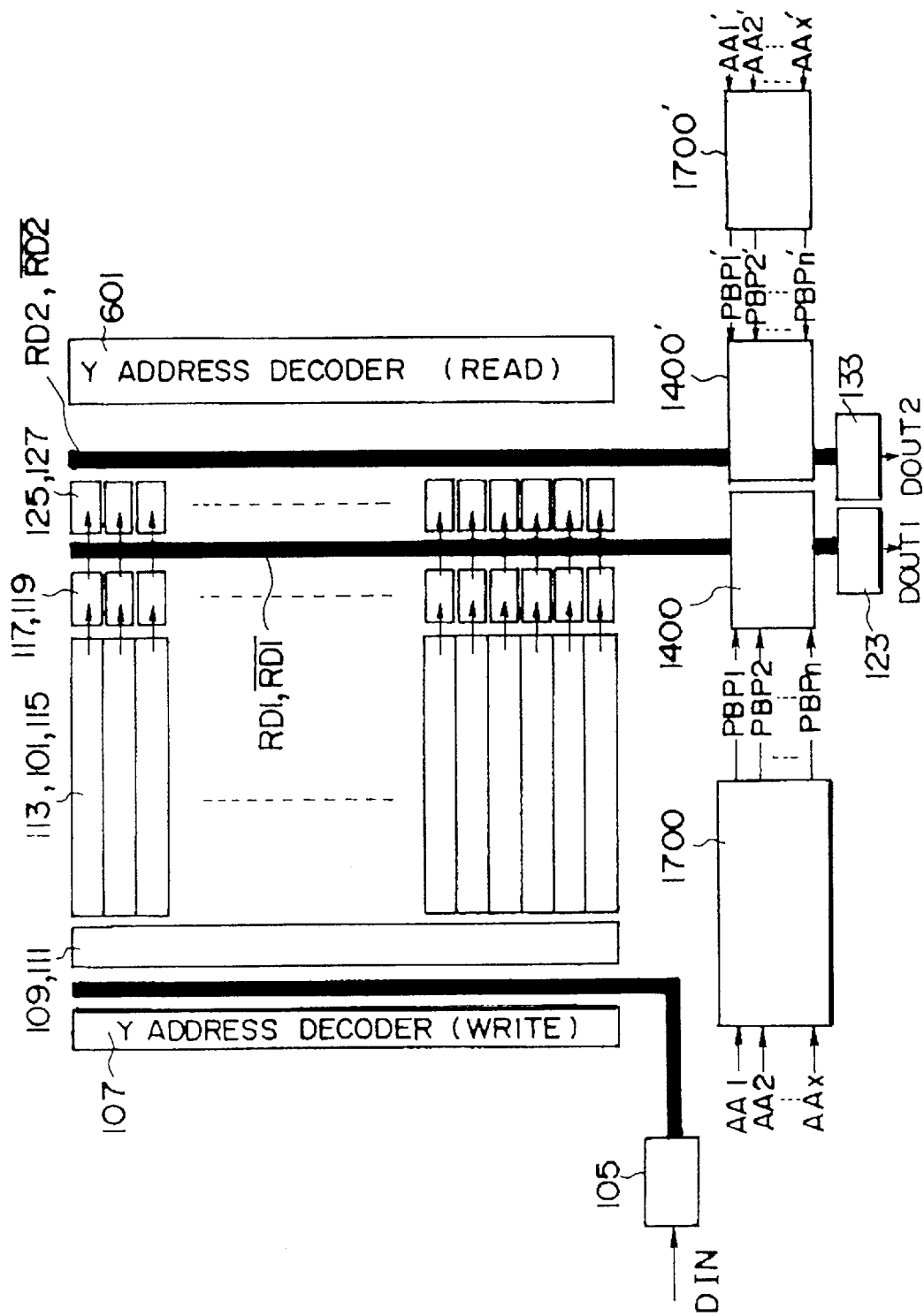
FIG. 18 is a circuit block diagram typically showing the structure of a principal part of a serial access memory according to a ninth embodiment of the present invention.

A ninth embodiment of the present invention will now be described below with reference to FIG. 18. FIG. 18 is a block diagram showing the structure of a serial access memory according to the ninth embodiment of the present invention. In this case, the aforementioned elements are suitably blocked and typically shown to provide an easy understanding of the illustration of the present embodiment. The same elements of structure as those described above are identified by like reference numerals and their description will therefore be omitted.

In the present embodiment, a delay control address decoder 1700 for outputting the delay select signals PBP1 through PBPx described in the eighth embodiment and a delay control address decoder 1700' having a function equivalent to that of the delay control address decoder 1700 are respectively electrically connected to the delay selection circuit 1400 and 1400' of the serial access memory according to the seventh embodiment. The delay control address decoder 1700' has the function of decoding addresses AA1' through AAx' supplied from the outside to control delay bits and outputting delay select signals PBP1' through PBPx' based on the result of decoding.

According to the present embodiment, since the delay select signals are produced based on the external addresses, in addition to the advantageous effects obtained by the aforementioned embodiments, the number of delay bits can be suitably set based on a reduced number of external signals.

Figure 19:
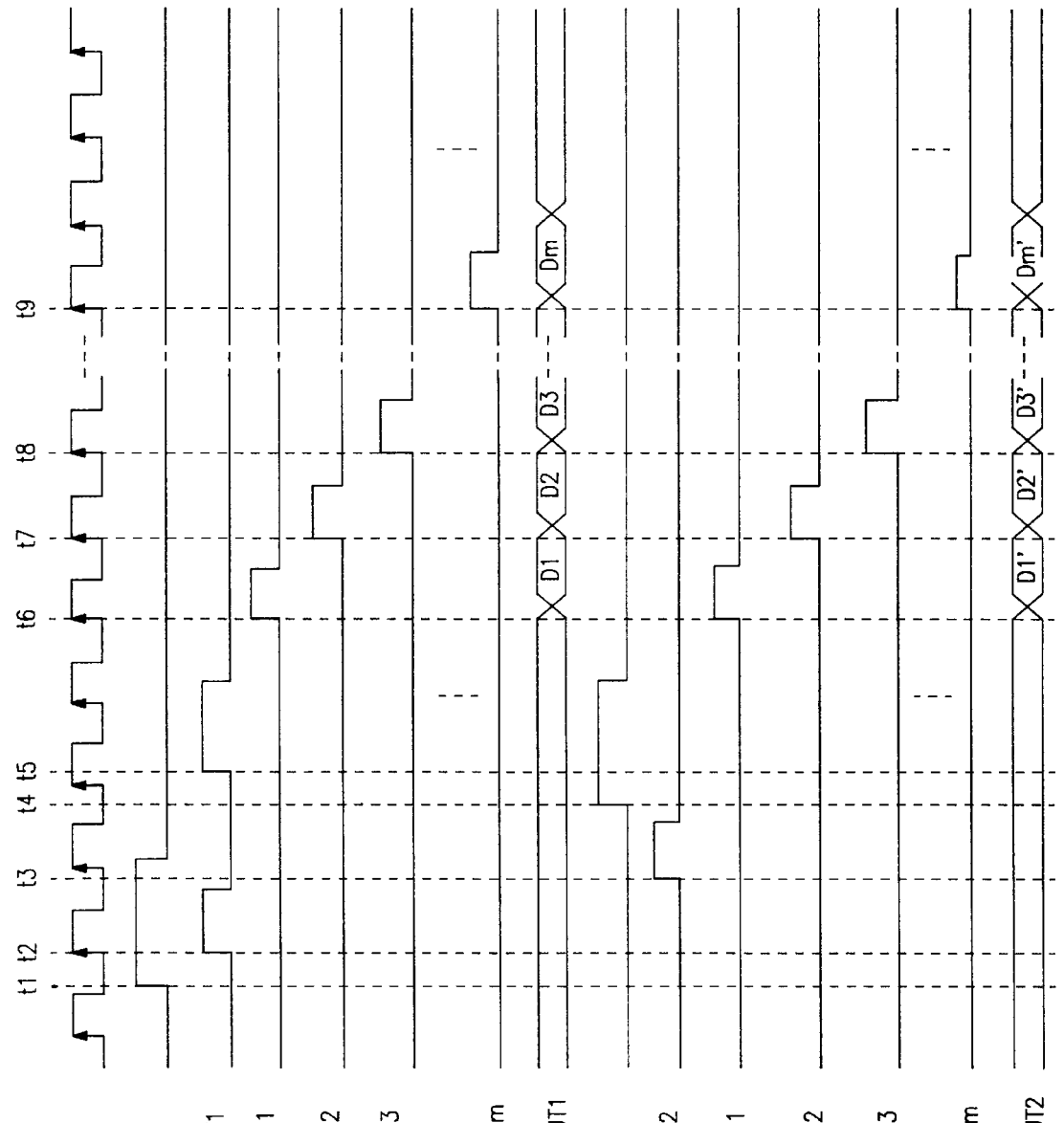
FIGS. 19(A)–19(O) are a partial timing chart for describing a data read operation of a serial access memory according to a tenth embodiment of the present invention.

A tenth embodiment of the present invention will now be described below with reference to FIGS. 19(A)–19(O). These figures provide a partial timing chart for describing the operation of a serial access memory according to the tenth embodiment of the present invention. In this case, the same elements of structure as the aforementioned elements are identified by like reference numerals to provide an easy understanding of the illustration of the present embodiment and their description will therefore be omitted. The basic operation of the present embodiment can be easily understood by reference to the operation of the serial access memory according to the first embodiment shown in FIGS. 4(A)–4(O) and their description, and a description of the basic operation will therefore be omitted.

Timing for providing the first read control signal PRT1 and the second read control signal PRT2, which is employed in the present embodiment, is different from that employed in the first embodiment.

Namely, only the first read control signal PRT1 is brought to the "H" level during a period $t_2$ and read data is transferred to the first read register 117 from the memory cell array 101 and stored in the first register 117. During a period $t_3$, only the second read control signal PRT2 is thereafter brought to the "H" level and the read data stored in the first read register 117 is transferred to the second read register 127.

According to the present embodiment, a serial access memory can be realized which is capable of improving the efficiency of data transfer and providing a satisfactory margin of operation.

An eleventh embodiment of the present invention will now be described below. A serial access memory according to the present embodiment is basically identical in structure to the serial access memory according to the first embodiment.

In the present embodiment, the inverters $Rl_{nk}$ and $\overline{Rl_{nk}}$ of each of the flip-flops $RF_k$ and $\overline{RF_k}$ of the first read register 117 employed in the serial access memory according to the first embodiment differ in dimension from the inverters $Rl_{n'k}$ and $\overline{Rl_{n'k}}$ of each of the flip-flops $RF_k$ and $\overline{RF_k}$ of the second read register 127.

Namely, the dimensions of a P channel MOS transistor (hereinafter called "PMOS") and an N channel MOS transistor (hereinafter called "NMOS") which respectively form the inverters $Rl_{nk}$ and $\overline{Rl_{nk}}$, are smaller than those of a PMOS and an NMOS which respectively form the inverters $Rl_{n'k}$ and $\overline{Rl_{n'k}}$.

According to the present embodiment, a serial access memory can be realized which is capable of improving the efficiency of data transfer and providing a satisfactory margin of operation.

Figure 20:
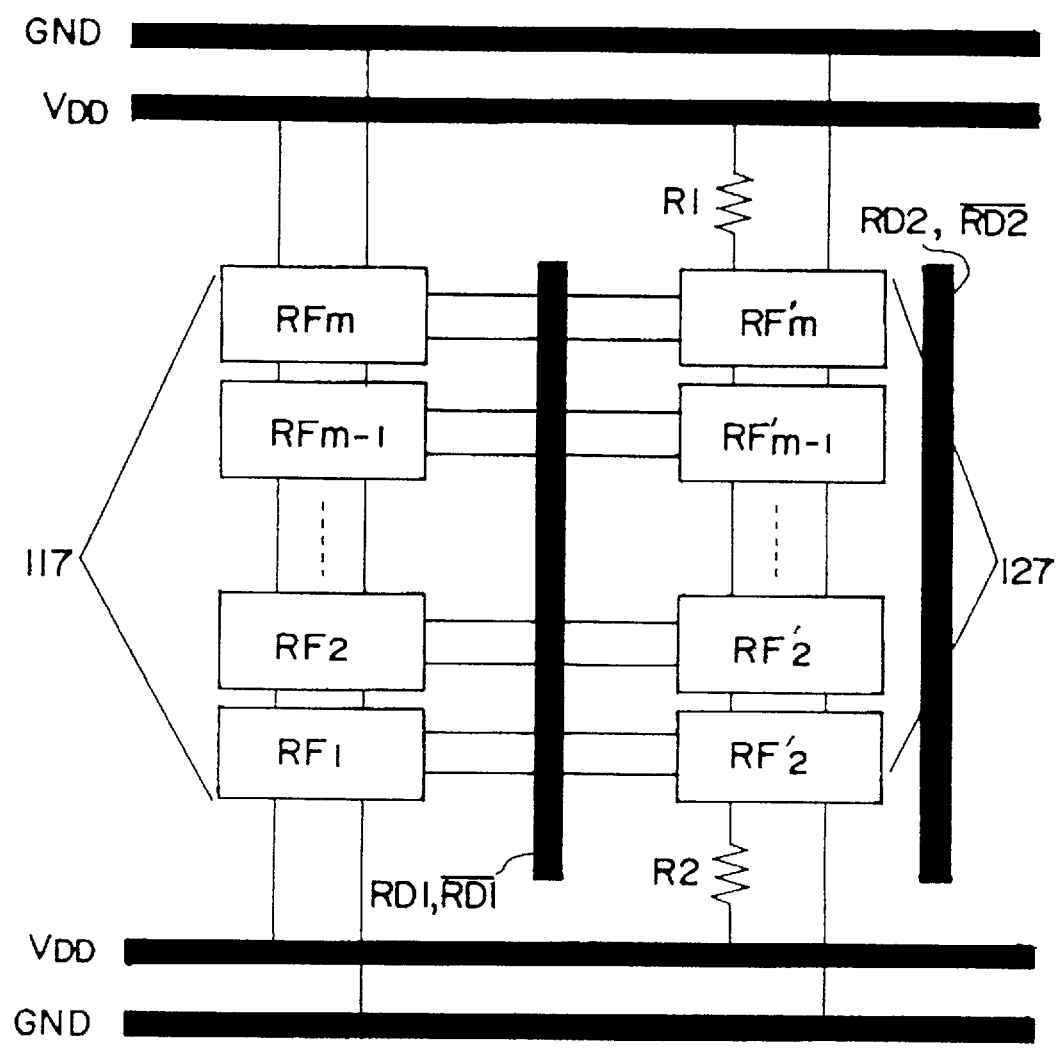
FIG. 20 is a circuit block diagram typically showing the structure of a principal part of a serial access memory according to a twelfth embodiment of the present invention.
Figure 21:
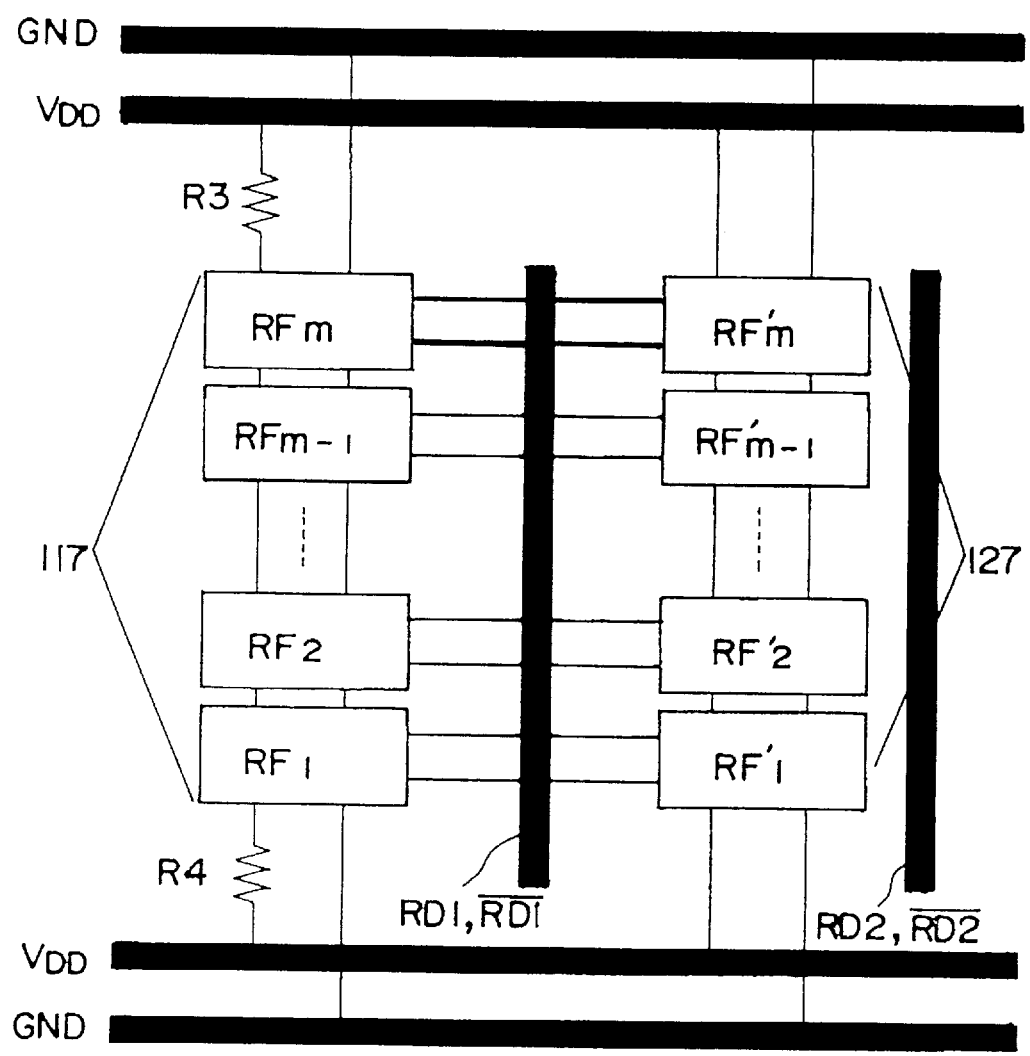
FIG. 21 is a circuit block diagram typically illustrating the structure of another principal part of the serial access memory shown in FIG. 20.
Figure 22:
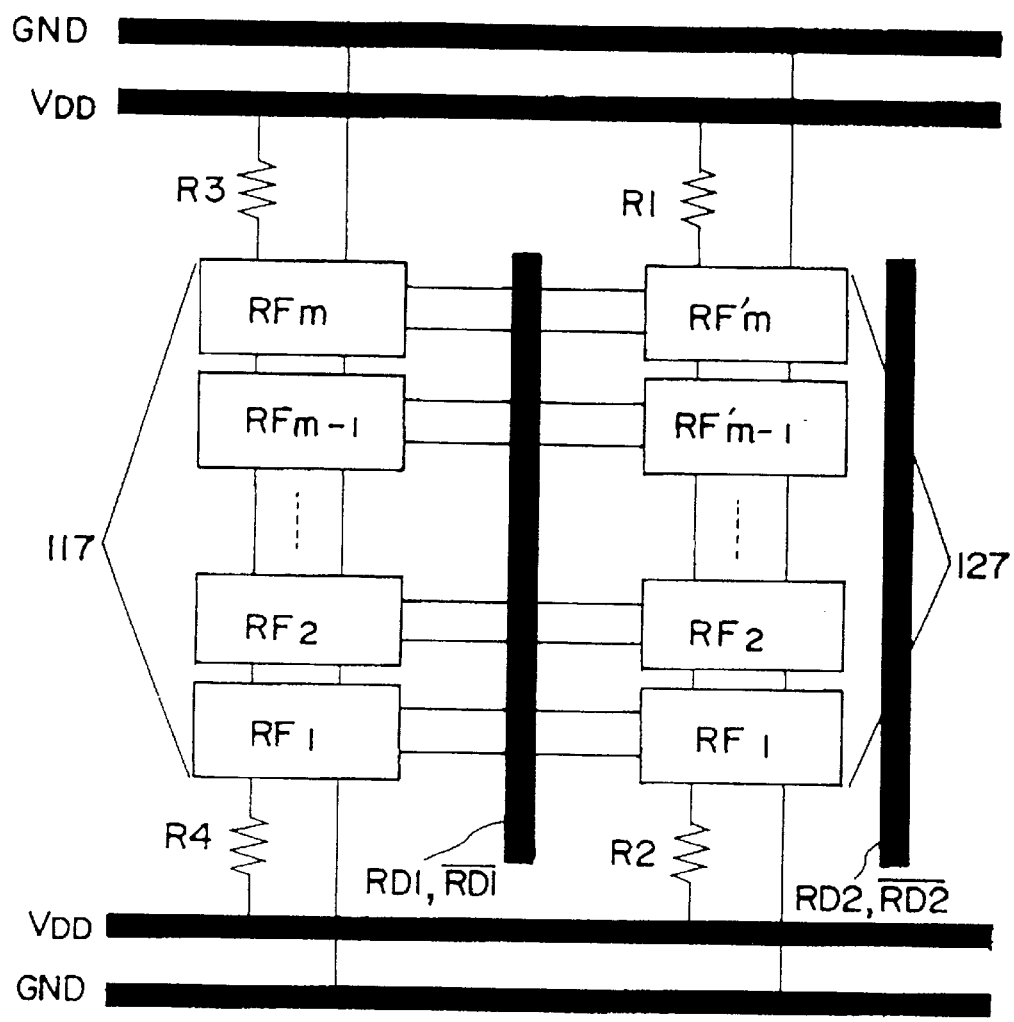
FIG. 22 is a circuit block diagram typically depicting the structure of a further principal part of the serial access memory shown in FIG. 20.

A twelfth embodiment of the present invention will now be described with reference to FIGS. 20, 21, and 22. FIGS. 20, 21, and 22 are respectively block diagrams each showing the structure of a principal part of a serial access memory according to the twelfth embodiment of the present invention. In this case, the aforementioned elements are suitably blocked and typically shown to provide an easy understanding of the illustration of the present embodiment. The same elements of structure as those described above are identified by like reference numerals and their description will therefore be omitted.

In the present embodiment, resistors R1 and R2 are respectively provided between the second read register 127 and a power source line $V_{DD}$ for supplying a potential to the second read register 127 and between the second read register 127 and the power source line $V_{DD}$ as shown in FIG. 20. Further, resistors R3 and R4 are respectively provided between the first read register 117 and power source lines $V_{DD}$ as shown in FIG. 21. Furthermore, resistors R1 and R2, and R3 and R4 are respectively provided between the second read register 127 and power source lines $V_{DD}$ and between the first read register 117 and the power source lines $V_{DD}$.

According to the present embodiment, a serial access memory can be realized which is capable of improving the efficiency of data transfer and providing a satisfactory margin of operation.

Figure 23:
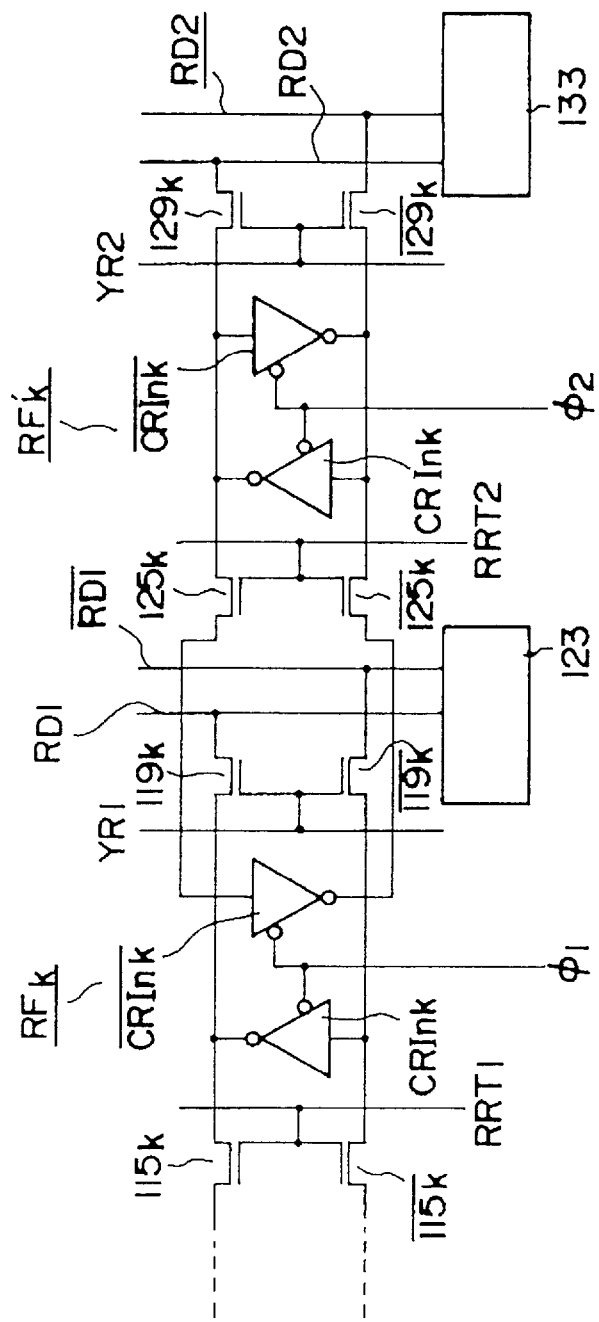
FIG. 23 is a circuit block diagram typically showing the structure of a principal part of a read register employed in a serial access memory according to a thirteenth embodiment of the present invention.

A thirteenth embodiment of the present invention will now be described with reference to FIG. 23. FIG. 23 is a block diagram showing the structure of a principal part of a serial access memory according to the thirteenth embodiment of the present invention. In this case, the aforementioned elements are suitably blocked and typically shown to provide an easy understanding of illustration of the present embodiment. The same elements of structure as those described above are identified by like reference numerals and their description will therefore be omitted.

In the present embodiment, flip-flops $RF_k$ and $\overline{RF_k}$ of the first read register 117 or flip-flops $RF'_k$ and $\overline{RF'_k}$ of the second read register 127 are respectively comprised of clocked inverters $CRI_{nk}$ and $\overline{CRI_{nk}}$ or $CRI_{n'k}$ and $\overline{CRI_{n'k}}$. These clocked inverters are respectively controlled based on control signals $\phi 1$ and $\phi 2$.

According to the present embodiment, a serial access memory can be materialized which is capable of improving the efficiency of data transfer and providing a satisfactory margin of operation.

Thus, the various embodiments in which the two port memories have been realized by connecting the read registers in series with one another have been described above. Further, various embodiments, each capable of realizing a two port memory by connecting a first serial access memory and a second serial access memory to one another through a delay circuit, will be described below.

Figure 24:
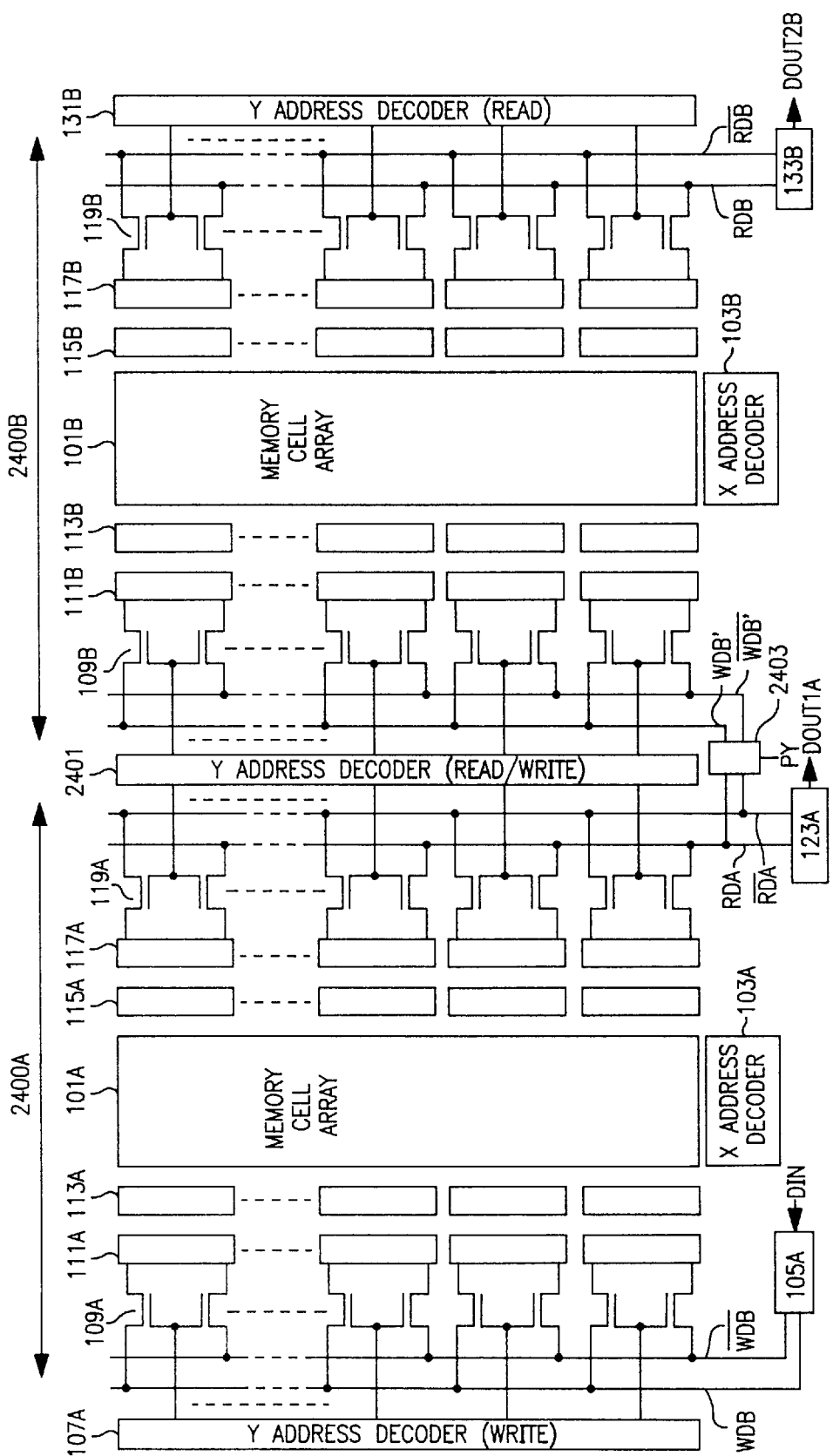
FIG. 24 is a circuit block diagram typically illustrating the structure of a principal part of a serial access memory according to a fourteenth embodiment of the present invention.

A fourteenth embodiment of the present invention will now be described with reference to FIG. 24. FIG. 24 is a block diagram showing the structure of a principal part of a serial access memory according to the fourteenth embodiment of the present invention. In this case, the aforementioned elements are suitably blocked and typically shown to provide an easy understanding of illustration of the present embodiment. The serial access memory according to the present invention is comprised of a first serial access memory unit 2400A and a second serial access memory unit 2400B.

Figure 25:
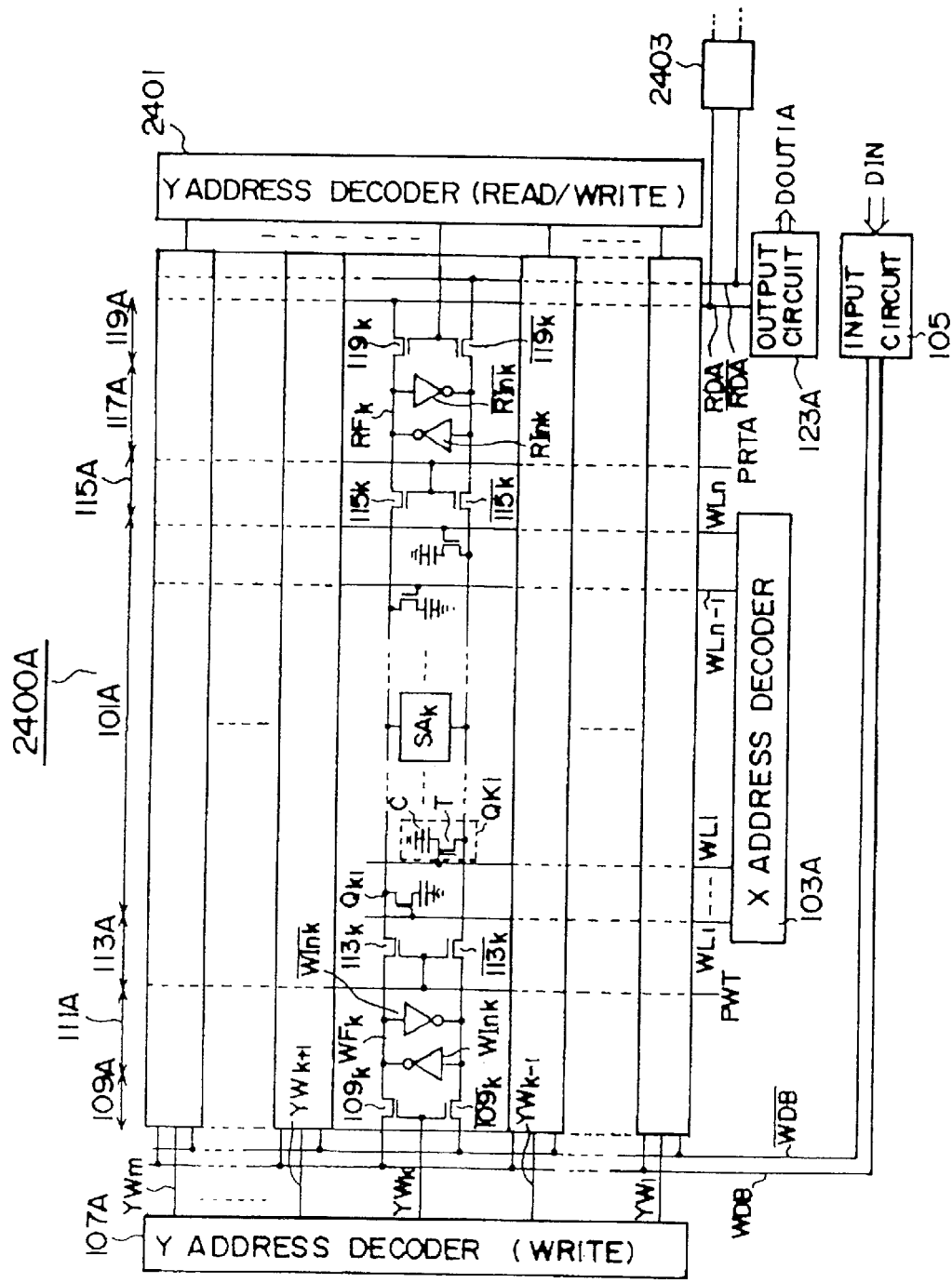
FIG. 25 is a circuit block diagram showing a specific configuration of a first serial access memory unit of the serial access memory shown in FIG. 24.

Reference symbols "A" are respectively applied to the ends of the aforementioned reference numerals applied to elements of the first serial access memory unit 2400A, which have the same functions as those of the aforementioned elements, and their detailed description will be omitted. The detailed configuration of the first serial access memory unit 2400A can be easily understood by reference to FIG. 25.

Figure 26:
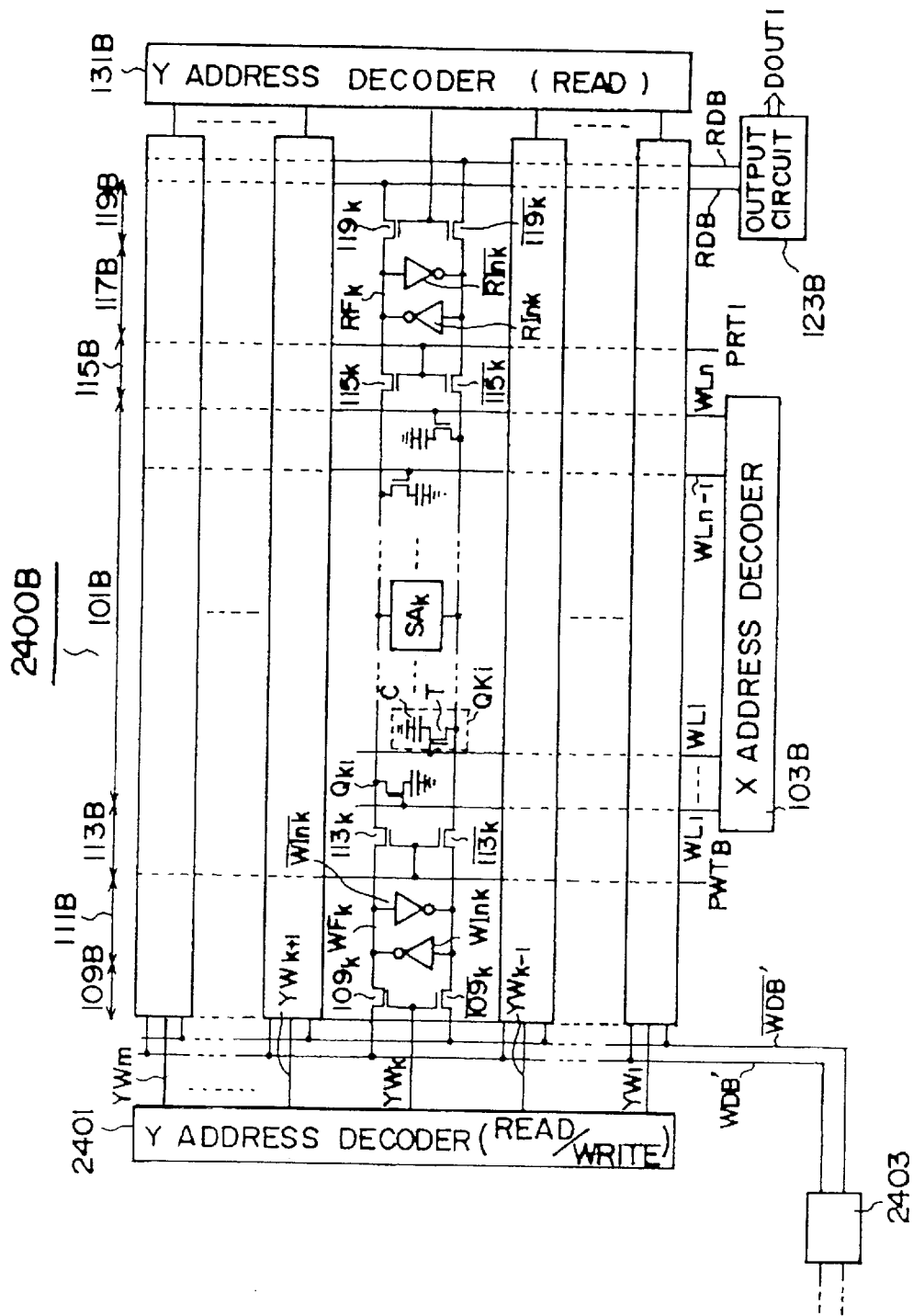
FIG. 26 is a circuit block diagram illustrating a specific configuration of a second serial access memory unit of the serial access memory shown in FIG. 24.

Reference symbols "B" are respectively applied to the ends of the aforementioned reference numerals applied to elements of the second serial access memory unit 2400B, which have the same functions as those of the aforementioned elements, and their detailed description will be omitted. The detailed configuration of the second serial access memory unit 2400B can be easily understood by reference to FIG. 26.

In the serial access memory according to the present embodiment, a delay circuit 2403 is electrically connected between a read data bus pair RDA and $\overline{RDA}$ of the first serial access memory unit 2400A and a write data bus pair WDB' and $\overline{WDB'}$ of the second serial access memory unit 2400B.

The delay circuit 2403 has the function of delaying data read from the first serial access memory unit 2400A by a predetermined period and transferring the data to the write data bus pair WDB' and $\overline{WDB'}$ of the second serial access memory unit 2400B. The necessity of delaying the data by the delay circuit 2403 will be described later.

Figure 27:
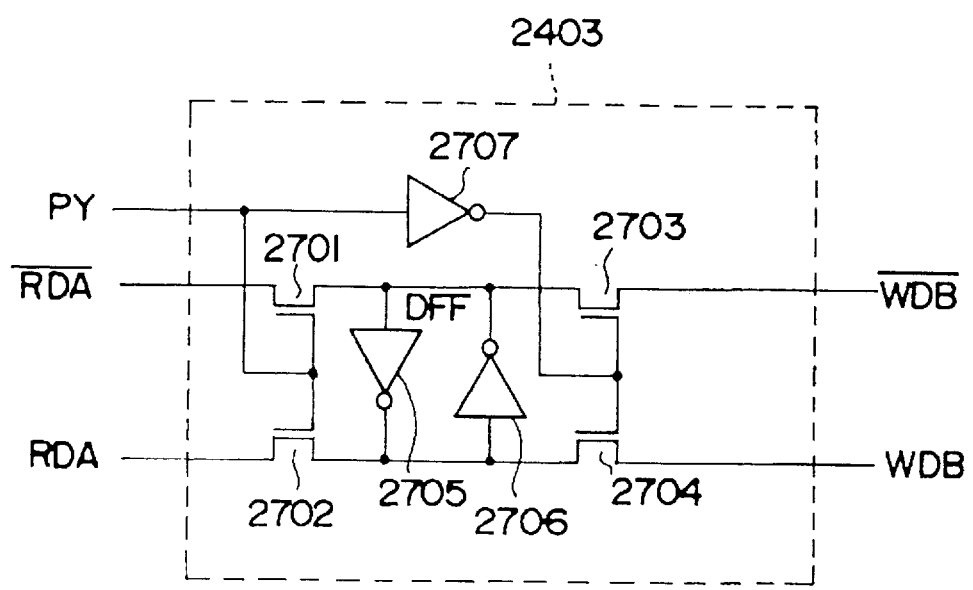
FIG. 27 is a circuit block diagram depicting the structure of a delay circuit employed in the serial access memory shown in FIG. 24.

A specific circuit configuration of the delay circuit 2403 is shown in FIG. 27. The delay circuit 2403 comprises a transistor pair 2701 and 2702 electrically connected to its corresponding read data bus pair RDA and $\overline{RDA}$, a transistor pair 2703 and 2704 electrically connected to its corresponding write data bus pair WDB and $\overline{WDB}$, a flip-flop DFF electrically connected between the transistor pair 2701 and 2702 and the transistor pair 2703 and 2704 and comprised of an inverter 2705 and an inverter 2706, and an inverter 2707 for inverting the logic level of a control signal PY and supplying the inverted signal to control electrodes of the transistor pair 2703 and 2704. These transistors are N channel MOS transistors.

A read/write Y address decoder 2401 decodes outer addresses $A_0$ and $\overline{A_0}$ through $A_n$ and $\overline{A_n}$ and outputs address signals $YRA_1$ through $YRA_n$ and address signals $YWB_1$ through $YWB_n$ therefrom. These address signals $YRA_k$ and $YWB_k$ are signals whose logic levels are equal to one another. Thus, a desired transistor pair of the transistor pairs of the transfer circuit 119A is turned ON and at the same time a transistor pair corresponding to the desired transistor pair, which is selected from the transistor pairs of the transfer circuit 109B, is turned ON.

Figure 28:
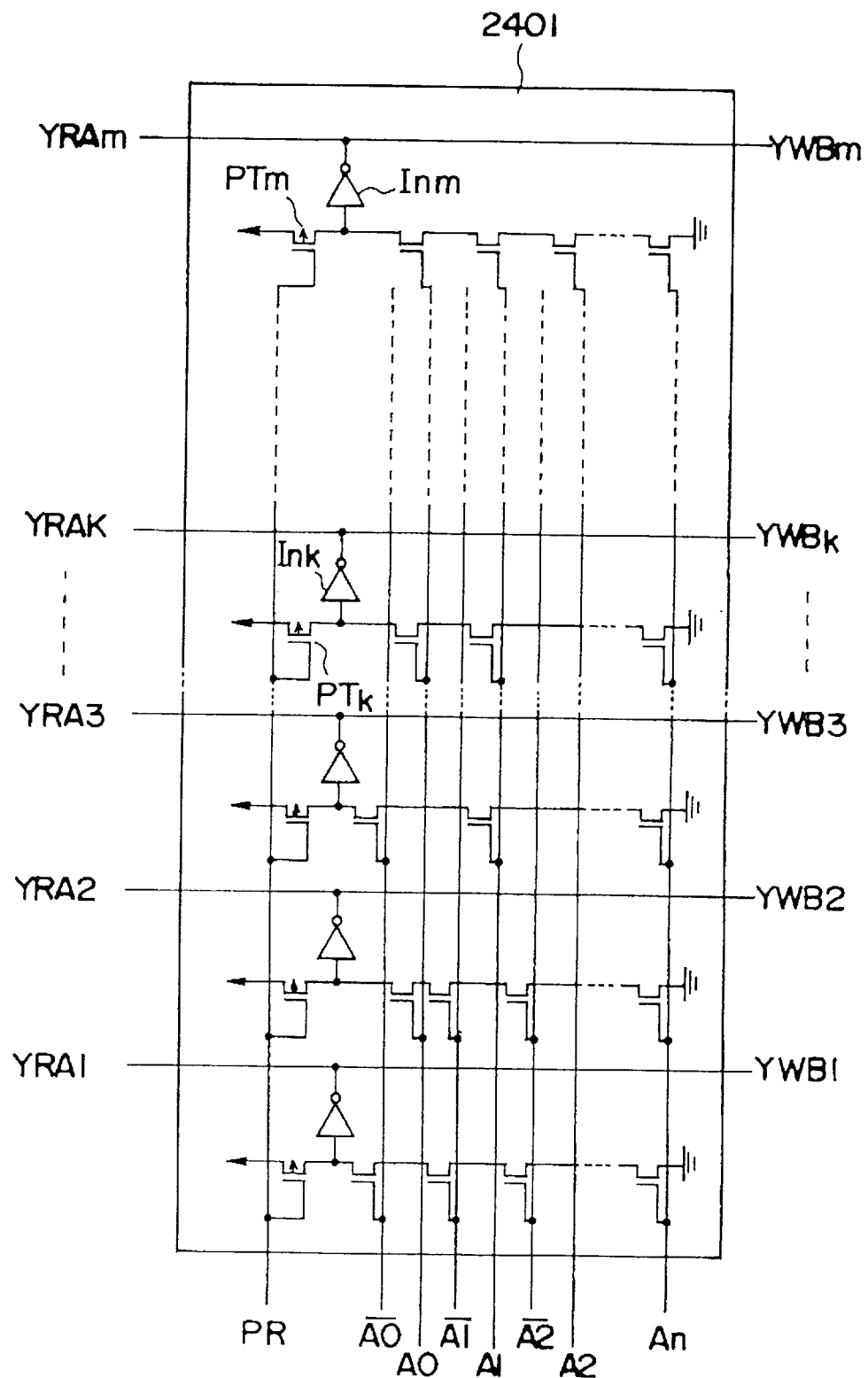

As shown in FIG. 28, the read/write Y address decoder 2401 comprises a plurality of P channel MOS transistors (hereinafter called "PMOSs") $PT_1$ through $PT_m$ supplied with a precharge signal PR, a plurality of inverters $I_{n1}$ through $I_{nm}$, and a plurality of N channel MOS transistors (hereinafter called "NMOSs") respectively electrically connected to the terminals supplied with the outer addresses $A_0$ and $\overline{A_0}$ through $A_n$ and $\overline{A_n}$. These NMOSs are electrically connected to the terminals supplied with the outer addresses on an arbitrary basis. Further, these NMOSs are disposed in such a manner than only the logic levels of the desired address signals $YRA_k$ and $YWB_k$ of the address signals $YRA_1$ through $YRA_m$ are brought to the "H" level.

The operation of the read/write Y address decoder 2401 is represented as an example by a timing chart shown in FIGS. 29(A)–29(M) In this case, the timing chart shown in FIGS. 29(A)–29(M) describes the timing for bringing each of the address signals $YRA_k$ and $YWB_k$ to the "H" level.

Figure 29:
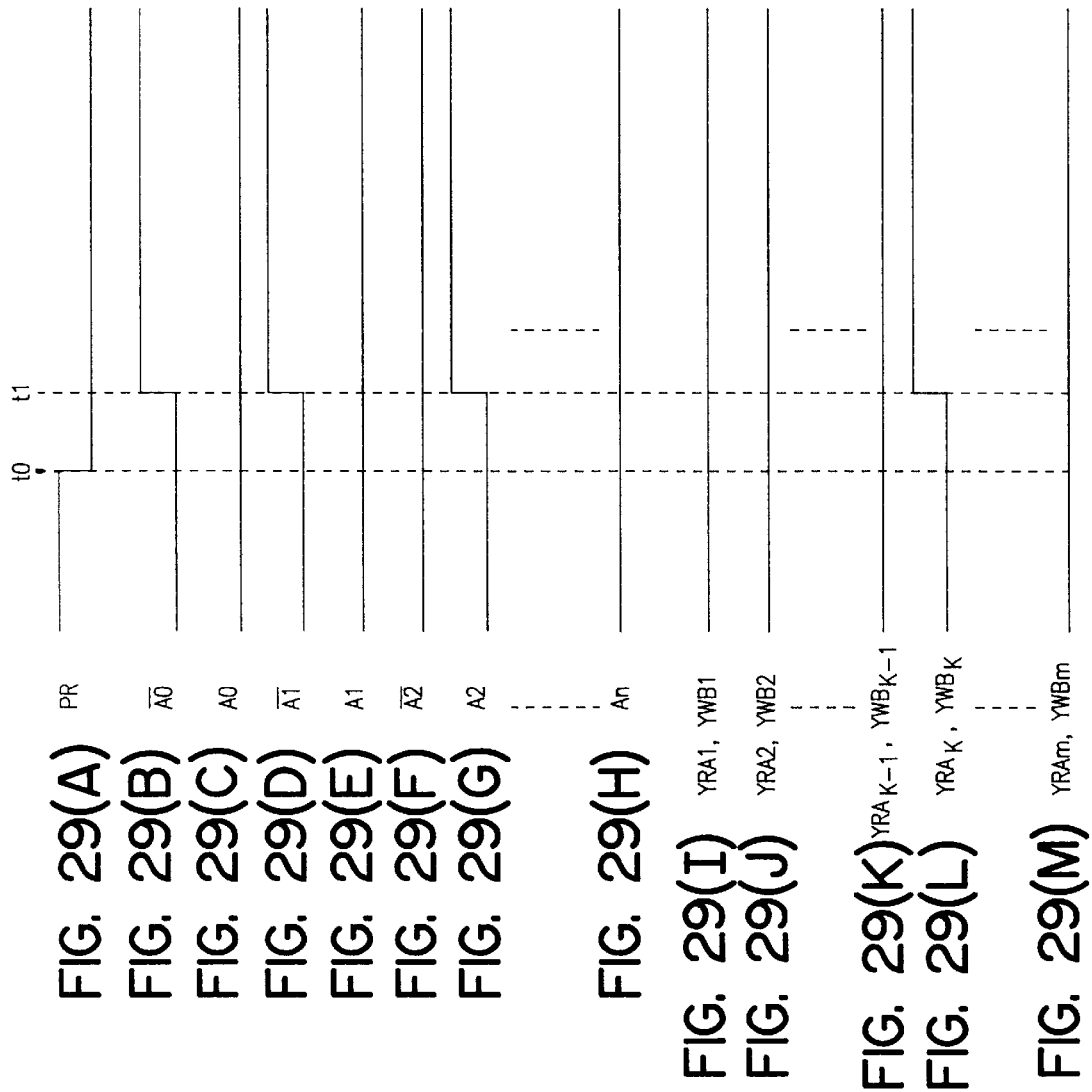
FIG. 29 is a partial timing chart for describing one example of the operation of the read/write shared Y address decoder employed in the serial access memory shown in FIG. 24.

During a period $t_0$, the precharge signal PR changes from "H" to "L". When the outer addresses are thereafter input during a period $t_2$, only the address signals $YRA_k$ and $YWB_k$ are brought to "H" level. This is because a signal having an "H" level is output from only the inverter $I_{nk}$ arranged in a column related to a combination of the NMOSs. Thus, the transistor pair $119A_k$ and $\overline{119A_k}$ of the transfer circuit 119A and the transistor pair $109B_k$ and $\overline{109B_k}$ of the transfer circuit 109B are turned ON. Although only an example is shown in FIG. 29, the operation of selecting other columns can also be easily understood by reference to this example.

Figure 30:
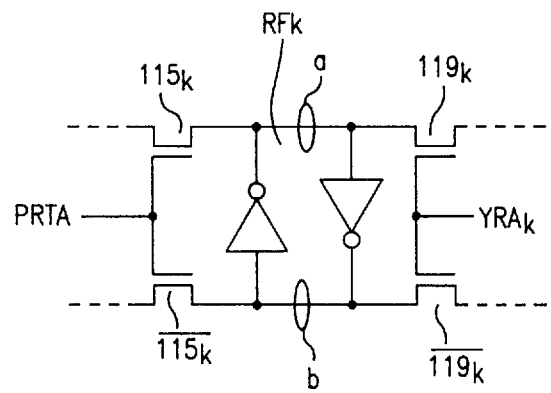
FIG. 30 is a circuit block diagram illustrating the structure of a principal part of a read register 117A employed in the serial access memory shown in FIG. 24.
Figure 31:
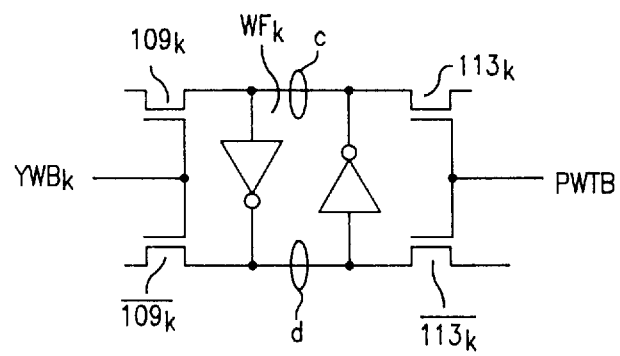
FIG. 31 is a circuit block diagram depicting the structure of a principal part of a write register 111B employed in the serial access memory shown in FIG. 24.
Figure 32:
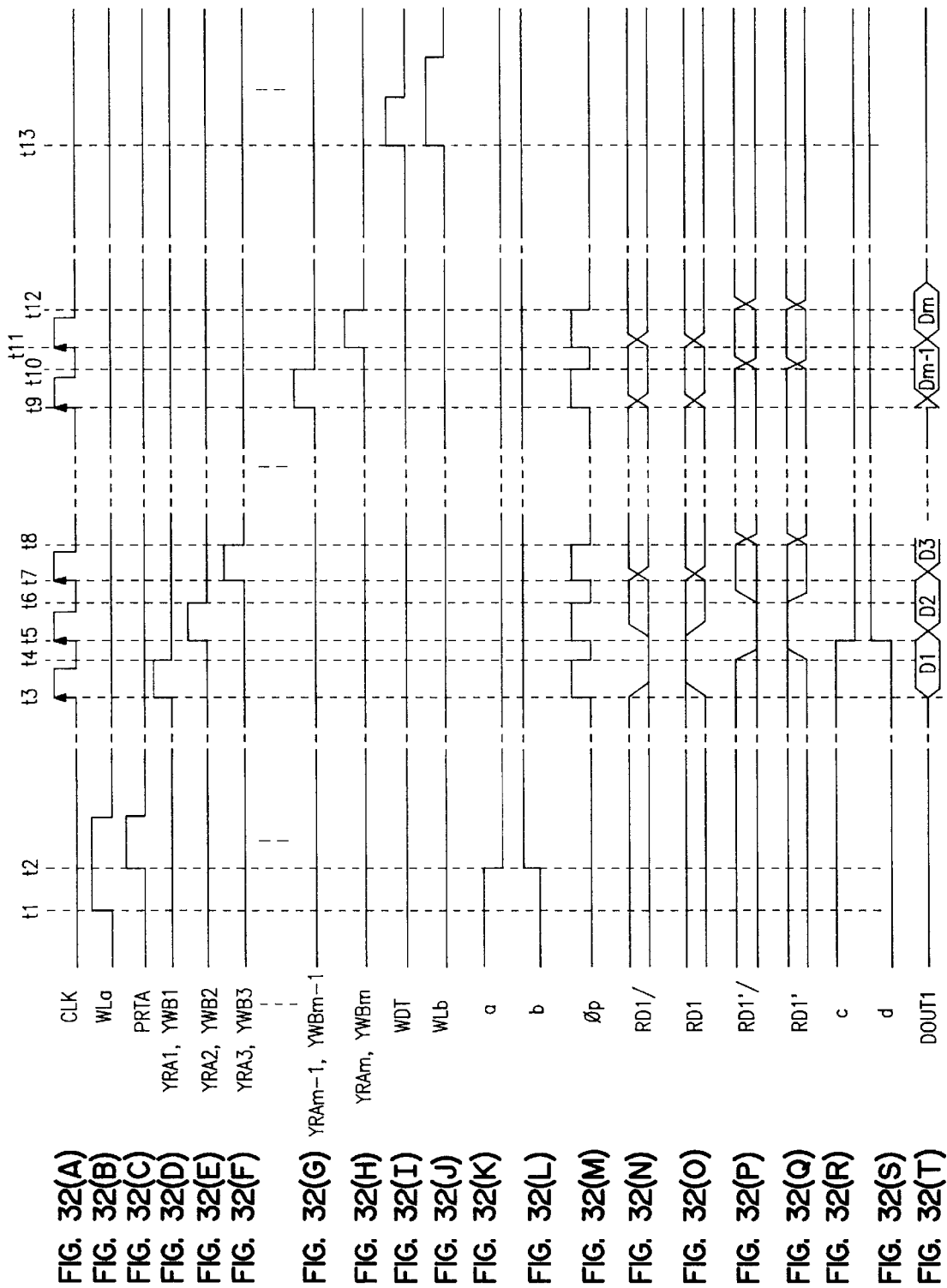
FIGS. 32(A)–32(T) are a partial timing chart for describing the operation of the serial access memory shown in FIG. 24.

A read operation of the serial access memory according to the present embodiment will now be described with reference to FIGS. 32(A)–32(T). The read operation is performed on a partition base for each period to provide an easy understanding. Now, nodes in a flip-flop $RF_1$ of a read register 117A are defined as a and b as shown in FIG. 30 and nodes in a flip-flop $WF_2$ of a write register 111B are defined as c and d as shown in FIG. 31. A clock signal used for the read operation is generated from the clock signal generating circuit shown in FIG. 5. An example in which data is transferred from the first serial access memory unit 2400A to the second serial access memory unit 2400B, will now be described on the central base. Other operations can be easily understood by referring to the operations of the aforementioned embodiments.

<Period $t_1$>

A desired word line $WL_a$ ($1 \leq a \leq n$) is selected by an X address decoder 103A. In this case, the potential of the selected word line $WL_a$ is brought to the "H" level. The word line $WL_a$ is electrically connected to a memory cell group having data stored therein to be read from a first output terminal DOUT1A.

At this time, data stored in memory cells $Q_{1,a}$ through $Q_{m,a}$ respectively connected to the word line $WL_a$ are read into bit line pairs $BL_1$ and $\overline{BL_1}$ through $BL_m$ and $\overline{BL_m}$ to which their corresponding memory cells are electrically connected. Thereafter, the data read into the bit line pairs are amplified by sense amplifiers $SA_1$ through $SA_m$ respectively.

<Period $t_2$>

Next, the logic level of a first read control signal PRTA is brought to the "H" level. Accordingly, transistor pairs $115A_1$ and $115A_1$ through $115A_m$ and $\overline{115A_m}$ of a transfer circuit 115A are turned ON.

Thus, the data on the bit line pairs $BL_1$ and $\overline{BL_1}$ through $BL_m$ and $\overline{BL_m}$, which have been amplified by the sense amplifiers $SA_1$ through $SA_m$ during the period $t_1$, are transferred to the first read register 117A at the same time.

<Period $t_3$>

Next, the clock signal CLK rises and a timing signal φP rises in synchronism with the clock signal CLK. Since the address signals $YRA_1$, and $YWB_1$ are output from the read/write Y address decoder 2401 at this time, a transistor pair $119A_1$ and $\overline{119A_1}$ of the transfer circuit 119A and a transistor pair $109B_1$ and $\overline{109B_1}$ of the transfer circuit 109B are turned ON. Thus, data stored in a flip-flop $FF_1$ of the first read register 117A is transferred to the read data bus pair RDA and $\overline{RDA}$. Further, the data is transferred to the delay circuit 2403 so as to be stored in therein.

<Period $t_4$> When the timing signal φP is brought to an "L", the transistor pair 2703 and 2704 of the delay circuit 2403 is turned ON so that the data stored in the delay circuit 2403 is transferred to the write data bus pair WDB and $\overline{WDB}$.

<Period $t_5$>

Next, the clock signal CLK is raised and the timing signal φP rises again in synchronism with the clock signal CLK. At this time, the read/write Y address decoder 2401 outputs the address signals $YRA_2$ and $YWB_2$ therefrom. Thus, since a transistor pair $119A_2$ and $\overline{119A_2}$ of the transfer circuit 119A is turned ON, data stored in a flip-flop $FF_2$ of the read register 117A is transferred to the read data bus pair RDA and $\overline{RDA}$. Since the timing signal φP is brought to the "H" level at this time, the transistor pair 2701 and 2702 of the delay circuit 2403 is turned ON so that the data on the read data bus pair RDA and $\overline{RDA}$ is stored in the flip-flop DFF of the delay circuit 2403. Since a transistor pair $109B_2$ and $\overline{109B_2}$ of the transfer circuit 109B is turned ON, the data transferred onto the write data bus pair WDB and $\overline{WDB}$ is stored in the flip-flop $WF_2$ of the write register 111B.

Cycles identical to these are subsequently repeated as represented during periods $t_6$ through $t_{13}$. The data is transferred from the first serial access memory unit 2400A to the second serial access memory unit 2400B and is outputted from the output terminal DOUT1A. In this case, the operation of transferring the data from the first serial access memory unit 2400A to the second serial access memory unit 2400B has been described. However, the operation of outputting data from an output terminal DOUT2B can be understood by reference to the operations of the aforementioned embodiments. The two port memory can be realized by the serial access memory according to the present embodiment in this way.

According to the present invention, the delay circuit is provided between the first serial access memory unit and the second serial access memory unit, and the data output from the first serial access memory unit is delayed for the predetermined period. It is therefore possible to prevent a data displacement or shift corresponding to one bit from occurring when the data is written.

Thus, a function equivalent to the function which has been achieved by a plurality of serial access memories can be realized within a single package.

Further, since the read/write address decoder is provided, a further improvement in integration can be realized.

The reason for providing the delay circuit will now be described below in detail.

When, for example, two serial access memories are simply connected to each other so as to be formed into one chip in order to integrate a plurality of serial access memories into one, the following inconvenience is developed.

Let's now consider the timing for outputting a signal from a first serial access memory. When an output operation is started in response to a rise in an nth clock during a time $t_n$, the signal is actually output from the first serial access memory with a given time ΔtAC (called an "access time") delayed from the period or time $t_n$.

Let's next consider the timing for inputting a signal to a second serial access memory. When an input operation is started in response to a rise in an mth clock during a period or time $t_m$, the proper input is actually rewritten into incorrect data after the incorrect data has been written into the second serial access memory unless the input signal is determined so as to appear on an input terminal at a time ΔtH (called a "hold time") earlier than the time $t_m$ where a circuit margin of operation is taken into consideration. Therefore, the data cannot be written into the second serial access memory at a high speed with a satisfactory margin of operation.

Thus, let's now consider an operation corresponding to an xth clock signal produced during a period or time $t_x$, for example. When the first serial access memory outputs data in response to the xth clock signal during a period or time t, an output $D_x$ is generated with a given delay time tAC. Further, a write operation is performed by the second serial access memory during the same time t. At this time, the data written into the second serial access memory in response to the clock signal at the time $t_x$ is equivalent to the data which has already been output from the first serial access memory before the time $t_x$. In this case, the data to be written into the second serial access memory becomes data $D_{x-1}$ which has been output during a time $t_{x-1}$.

Thus, when the first serial access memory and the second serial access memory are simply connected to each other, the data is shifted by one bit upon writing the data into the second serial access memory. This causes the inconvenience that the data cannot be written into the second serial access memory at a high speed with a satisfactory margin of operation.

Since, however, the delay circuit for delaying and adjusting the shift corresponding to the one bit is provided in the serial access memory according to the present embodiment of the present invention, a plurality of serial access memories (two serial access memories in the aforementioned embodiment) can be easily formed into one chip by using the conventional circuit design technology.

Figure 33:
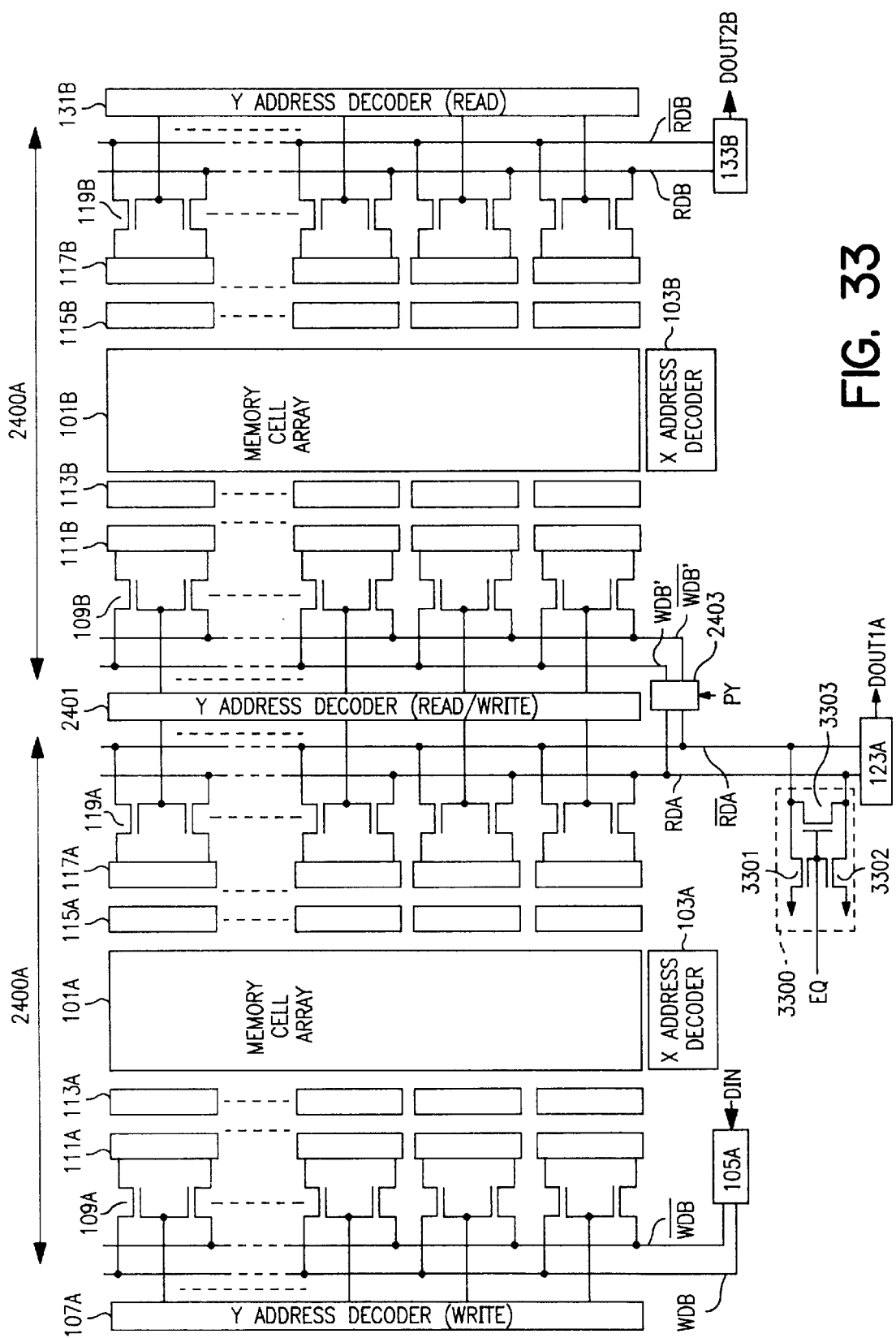
FIG. 33 is a circuit block diagram typically showing the structure of a principal part of a serial access memory according to a fifteenth embodiment of the present invention.

A fifteenth embodiment of the present invention will now be described with reference to FIG. 33. FIG. 33 is a block diagram showing the structure of a principal part of a serial access memory according to the fifteenth embodiment of the present invention. In this case, the aforementioned elements are suitably blocked and typically shown to provide an easy understanding of illustration of the present embodiment. The same elements of structure as the aforementioned elements are identified by like reference numerals, and their description will therefore be omitted.

In the serial access memory according to the present embodiment, an initializing circuit 3300 is electrically connected to the read data bus pair RDA and $\overline{RDA}$ employed in the serial access memory according to the fourteenth embodiment.

The initializing circuit 3300 is comprised of transistors 3301, 3302, and 3303 and has the function of supplying an initializing predetermined potential to the read data bus pair RDA and $\overline{RDA}$ in response to an initialization signal EQ.

These transistors are NMOSs. The transistor 3301 is electrically connected between the read data bus $\overline{\text{RDA}}$ and a power source having a predetermined potential. The transistor 3302 is electrically connected between the read data bus $\overline{\text{RDA}}$ and the power source. The transistor 3303 is electrically connected between the read data bus RDA and the read data bus $\overline{\text{RDA}}$. The control electrodes of each of these transistors are supplied with the initialization signal EQ.

The serial access memory according to the present embodiment is basically identical in operation to the serial access memory according to the fourteenth embodiment. However, the present serial access memory is different from the serial access memory according to the fourteenth embodiment in that each of the read data buses RDA and $\overline{\text{RDA}}$ is initially set to a predetermined potential by the initializing circuit 3300 during a period in which the initialization EQ is brought to an "H" level.

Figure 34:
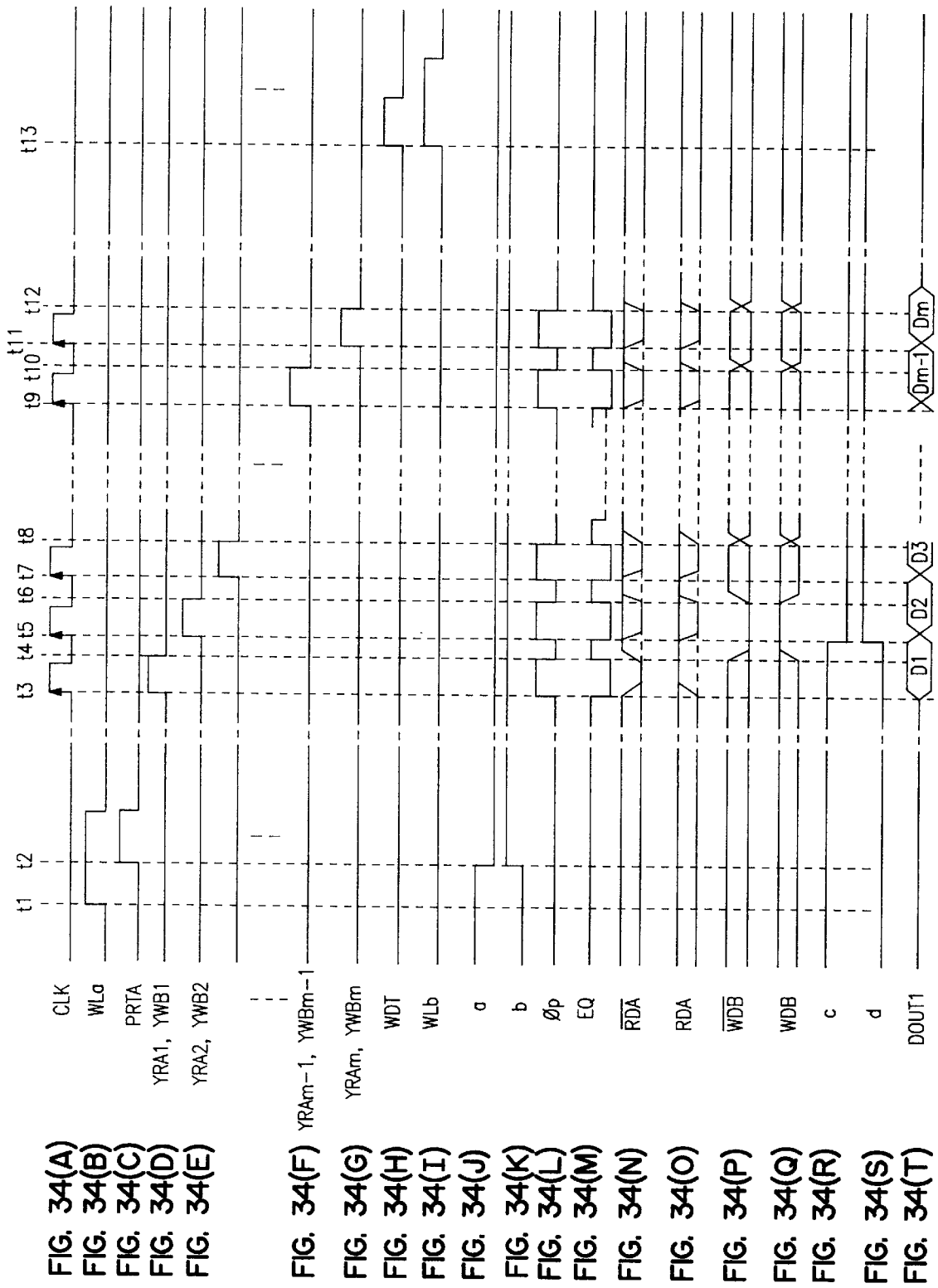
FIGS. 34(A)–34(T) are a partial timing chart for describing the operation of the serial access memory shown in FIG. 33.

The operation of the serial access memory according to the present embodiment will be described below with reference to a timing chart shown in FIGS. 34(A)–34(T). The description of the operation is performed on a partition base for each period in a manner similar to the above-described embodiments.

<Period $t_1$>

A desired word line $WL_a$ ($1 \leq a \leq n$) is selected by the X address decoder 103A. In this case, the potential of the selected word line $WL_a$ is brought to the "H" level. The word line $WL_a$ is electrically connected to a memory cell group having data stored therein to be read from a first output terminal DOUT1A.

At this time, data stored in memory cells $Q_{1,a}$ through $Q_{m,a}$ respectively connected to the word line $WL_a$ are read into bit line pairs $BL_1$ and $\overline{BL_1}$ through $BL_m$ and $\overline{BL_m}$ to which their corresponding memory cells are electrically connected. Thereafter, the data read into the bit line pairs are amplified by sense amplifiers $SA_1$ through $SA_m$ respectively.

<Period $t_2$>

Next, a logic level of the first read control signal PRTA is brought to the "H" level. Accordingly, transistor pairs $115A_1$ and $\overline{115A_1}$ through $115A_m$ and $\overline{115A_m}$ of the transfer circuit 115A are turned ON.

Thus, the data on the bit line pairs $BL_1$ and $\overline{BL_1}$ through $BL_m$ and $\overline{BL_m}$, which have been amplified by the sense amplifiers $SA_1$ through $SA_m$ during the period $t_1$, are transferred to the first read register 117A at the same time.

<Period $t_3$>

Next, the clock signal CLK is raised and the timing signal φP rises in synchronism with the clock signal CLK. Since address signals $YRA_1$ and $YWB_1$ are output from a read/write Y address decoder 2401 at this time, a transistor pair $119A_1$ and $\overline{119A_1}$ of the transfer circuit 119A and a transistor pair $109B_1$ and $\overline{109B_1}$ of a transfer circuit 109B are turned ON.

Further, since the initialization signal EQ changes from "H" to "L", data can be transferred to the read data bus pair RDA and $\overline{\text{RDA}}$. Each of the read data buses RDA and $\overline{\text{RDA}}$ has been initially set to the power source potential before the period $t_3$.

Thus, data stored in a flip-flop $FF_1$ of the first read register 117A is transferred to the read data bus pair RDA and $\overline{\text{RDA}}$. Further, the data is transferred to a delay circuit 2403 so as to be stored therein.

<Period $t_4$>

When the timing signal φP is brought to the "L" level, a transistor pair 2703 and 2704 of the delay circuit 2403 is turned ON so that data stored in the flip-flop DFF of the delay circuit 2403, is transferred to the write data bus pair WDB and $\overline{\text{WDB}}$.

Simultaneously, the initialization signal EQ is brought to the "H" level and each of the read data buses RDA and $\overline{\text{RDA}}$ is initially set to the power source voltage level.

<period $t_5$>

Next, the clock signal CLK rises and the timing signal φP rises again in synchronism with the clock signal CLK. At this time, the read/write Y address decoder 2401 simultaneously outputs address signals $YRA_2$ and $YWB_2$ therefrom.

Thus, since a transistor pair $119A_2$ and $\overline{119A_2}$ of the transfer circuit 119A is turned ON, data stored in a flip-flop $FF_2$ of the read register 117A is transferred to the read data bus pair RDA and $\overline{\text{RDA}}$.

Further, since the timing signal φP is brought to the "H" level, a transistor pair 2701 and 2702 of the delay circuit 2403 is turned ON so that the data on the read data bus pair RDA and $\overline{\text{RDA}}$ is stored in the flop-flop DFF of the delay circuit 2403.

The data transferred to the write data bus pair WDB and $\overline{\text{WDB}}$ during the period $t_4$ is stored in a flip-flop $WF_2$ of the write register 111B.

Cycles identical to these are subsequently repeated as represented during periods $t_5$ through $t_{13}$.

Since the serial access memory according to the present embodiment has the initializing circuit for the read data bus pair, as well as having the advantageous effect obtained by the serial access memory according to the fourteenth embodiment, a quicker access can be carried out.

Figure 35:
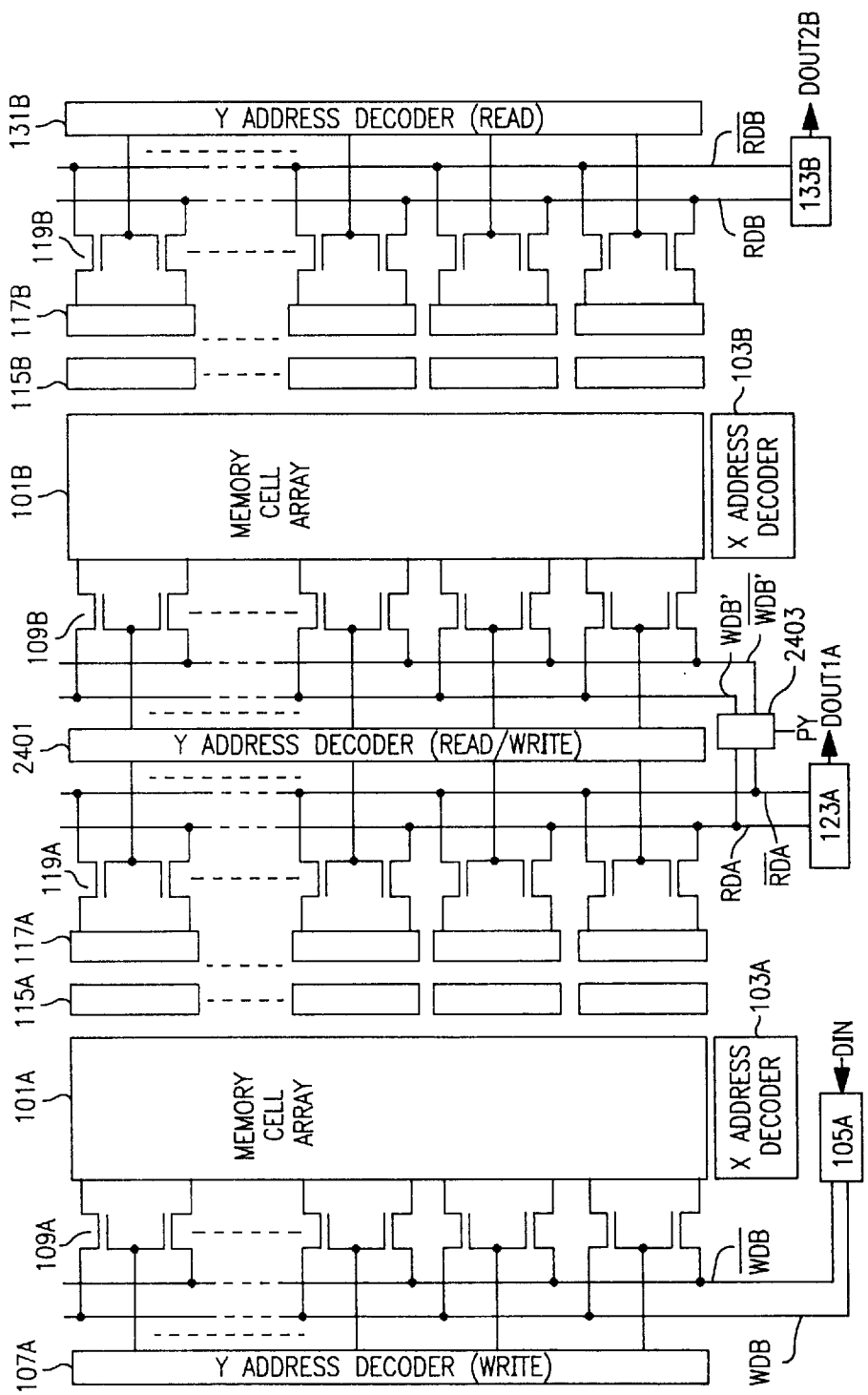
FIG. 35 is a circuit block diagram typically showing the structure of a principal part of a serial access memory according to a sixteenth embodiment of the present invention.

A sixteenth embodiment of the present invention will now be described with reference to FIG. 35. FIG. 35 is a block diagram showing the structure of a principal part of a serial access memory according to the sixteenth embodiment of the present invention. In this case, the aforementioned elements are suitably blocked and typically shown to provide an easy understanding of illustration of the present embodiment. The same elements of structure as the aforementioned elements are identified by like reference numerals and their description will therefore be omitted.

In the serial access memory according to the present embodiment, the transfer circuit 109B is electrically directly connected to a memory cell array 101B without providing the write register 111B and the transfer circuit 113B of the serial access memory according to the fourteenth embodiment.

In the present serial access memory, nodes c and d are defined as nodes corresponding to the nodes c and d employed in the fourteenth embodiments.

The operation of the serial access memory according to the present embodiment can be easily understood by reference to the operation of the fifteenth embodiment. In the serial access memory according to the present embodiment, data on the write data bus pair RDA and $\overline{\text{RDA}}$ is directly transferred to the memory cell array 101B.

When the serial access memory according to the present embodiment is used in an application of such a type that the advantageous effect obtained by the fourteenth embodiment is employed and no competition is produced between the reading of data from a second serial access memory and the writing of the data into the second serial access memory, a two port memory can be realized without the write register. It is therefore possible to greatly reduce the size of the chip.

Figure 36:
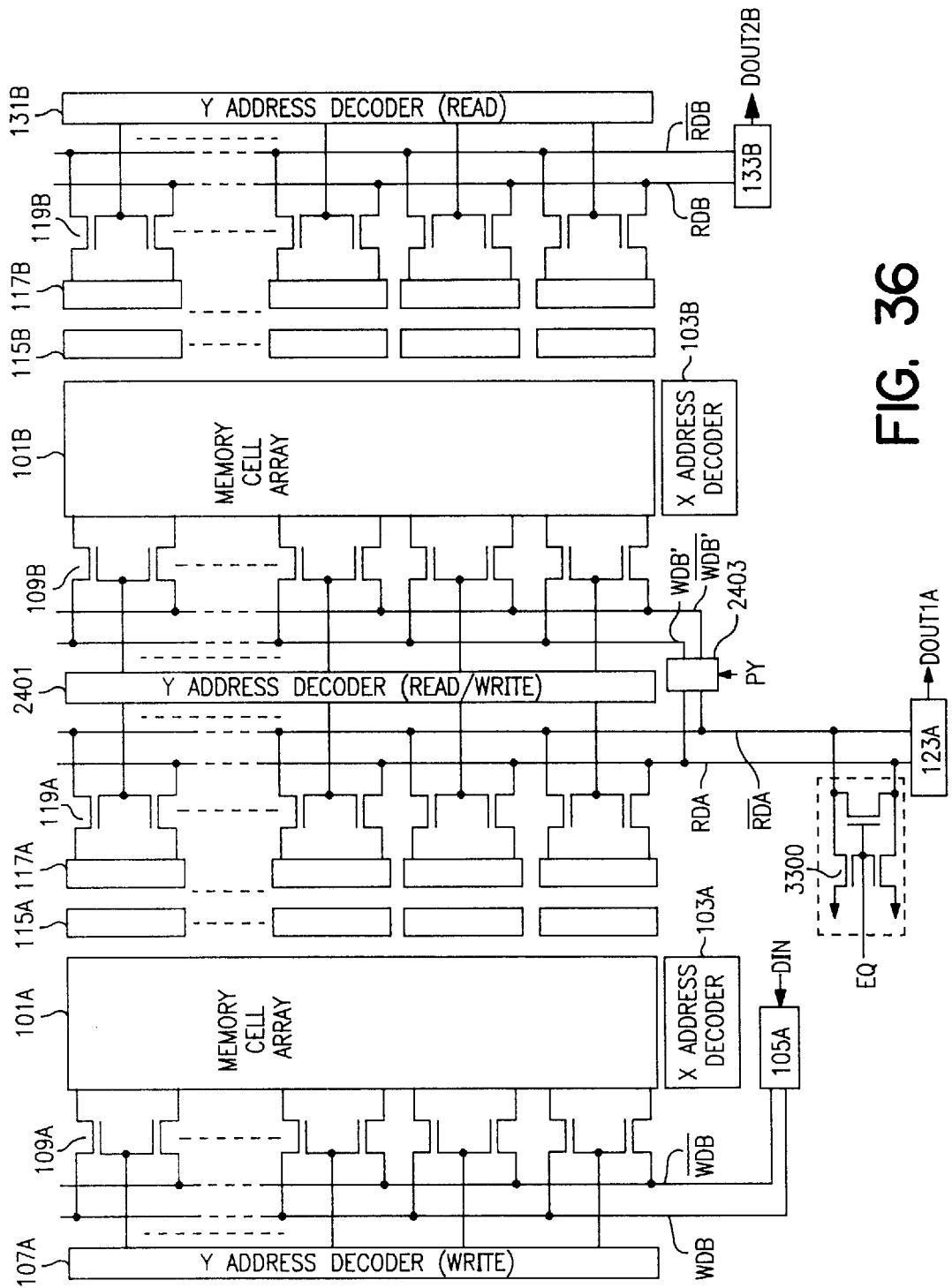
FIG. 36 is a circuit block diagram typically illustrating the structure of a principal part of a serial access memory according to a seventeenth embodiment of the present invention.

A seventeenth embodiment of the present invention will now be described with reference to FIG. 36. FIG. 36 is a block diagram showing the structure of a principal part of a serial access memory according to the seventeenth embodiment of the present invention. In this case, the aforementioned elements are suitably blocked and typically shown to provide an easy understanding of the present embodiment. The same elements of structure as the aforementioned elements are identified by like reference numerals and their description will therefore be omitted.

In the serial access memory according to the present embodiment, an initializing circuit 3300 is electrically connected to the read data bus pair RDA and $\overline{\text{RDA}}$ of the serial access memory according to the fifteenth embodiment.

The operation of the serial access memory according to the present embodiment can be understood by reference to the operations of the fourteenth through sixteenth embodiments.

Since the advantageous effect of the fifteenth embodiment is obtained and the initializing circuit is provided, the serial access memory according to the present embodiment can provide a quicker access.

Figure 37:
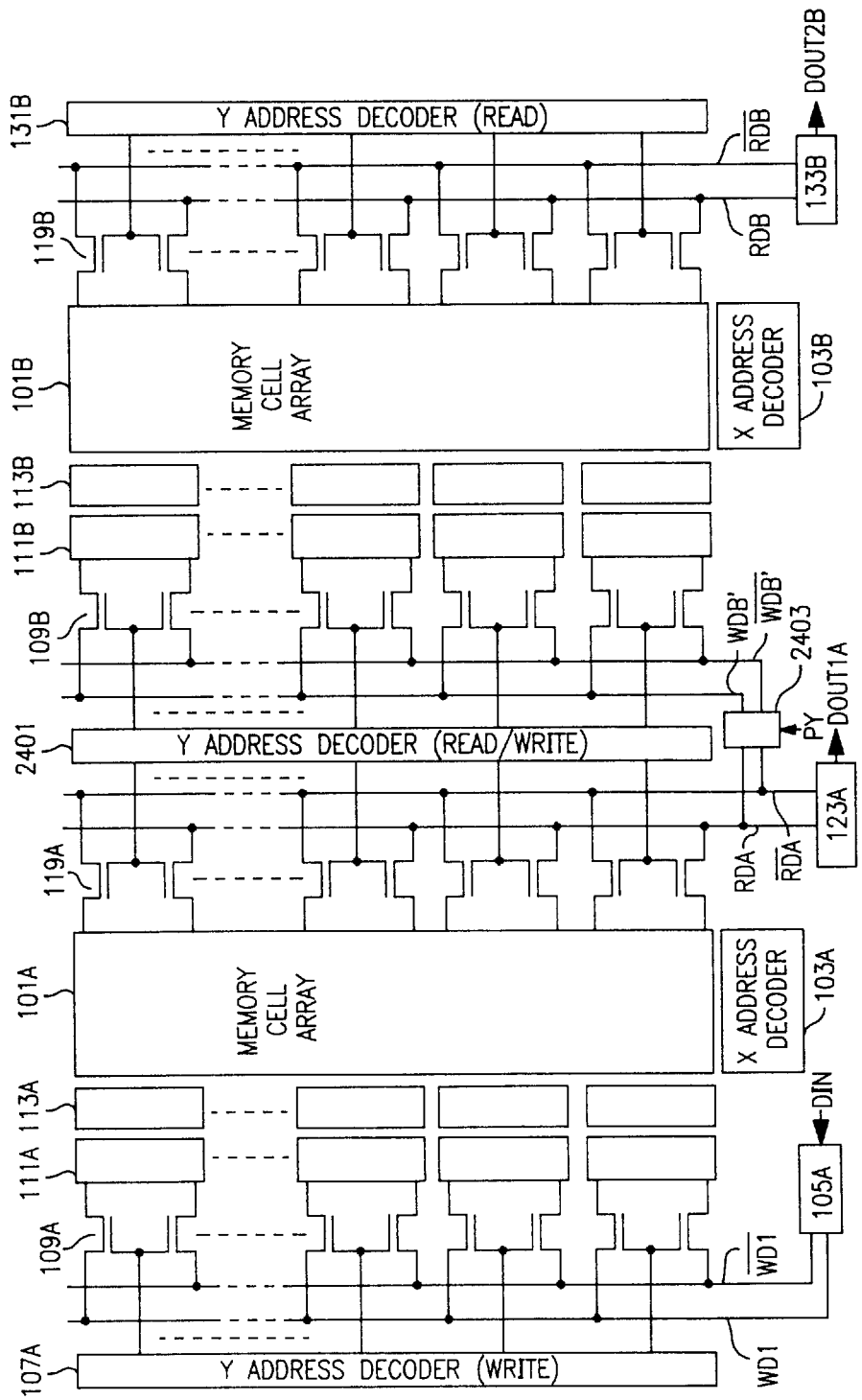
FIG. 37 is a circuit block diagram typically depicting the structure of a principal part of a serial access memory according to an eighteenth embodiment of the present invention.

An eighteenth embodiment of the present invention will now be described with reference to FIG. 37. FIG. 37 is a block diagram showing the structure of a principal part of a serial access memory according to the eighteenth embodiment of the present invention. In this case, the aforementioned elements are suitably blocked and typically shown to provide an easy understanding of the present embodiment. The same elements of structure as the aforementioned elements are identified by like reference numerals and their description will therefore be omitted.

In the serial access memory according to the present embodiment, the transfer circuit 119A and the transfer circuit 119B are respectively directly connected to a memory cell array 101A and a memory cell array 101B without providing the read register 117A and the transfer circuit 115A of the serial access memory according to the fourteenth embodiment and the read register 115B and the transfer circuit 117B thereof.

In the present serial access memory, nodes a and b are defined as nodes corresponding to the nodes a and b employed in the fourteenth embodiment.

The operation of the serial access memory according to the present embodiment can be easily understood by reference to the description of the operation of the fourteenth embodiment.

When the serial access memory according to the present embodiment is used in an application of such a type that the advantageous effect obtained by the fourteenth embodiment is employed and no competition is produced between the timing of writing data into a second serial access memory and the timing of reading data from a first serial access memory, a two port memory can be realized without providing the read data register. It is therefore possible to greatly reduce the size of the chip.

Figure 38:
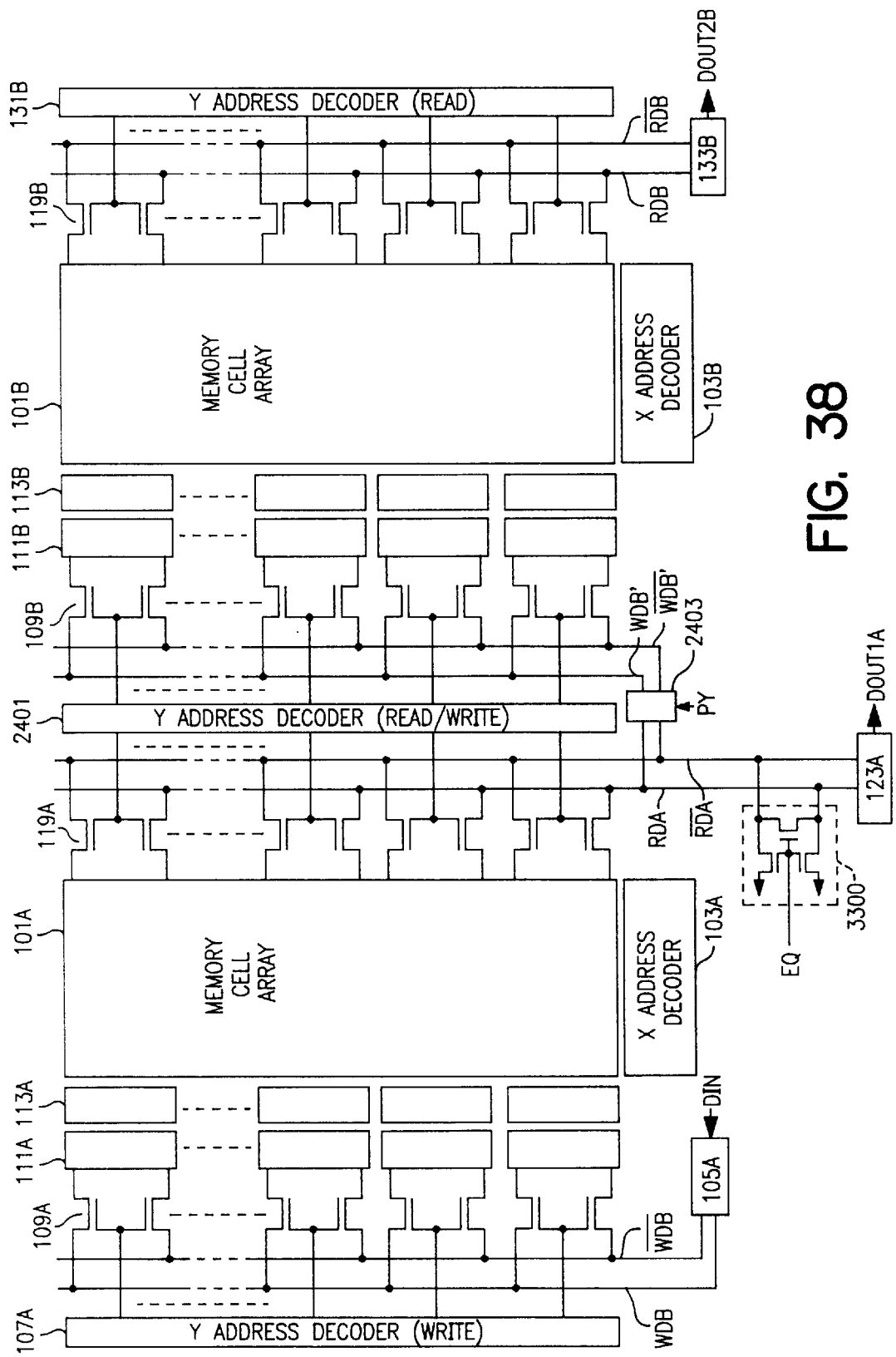
FIG. 38 is a circuit block diagram typically showing the structure of a principal part of a serial access memory according to a nineteenth embodiment of the present invention.

A nineteenth embodiment of the present invention will now be described with reference to FIG. 38. FIG. 38 is a block diagram showing the structure of a principal part of a serial access memory according to the nineteenth embodiment of the present invention. In this case, the aforementioned elements are suitably blocked and typically shown to provide an easy understanding of the present embodiment. The same elements of structure as the aforementioned elements are identified by like reference numerals, and their description will therefore be omitted.

In the serial access memory according to the present embodiment, an initializing circuit 3300 is electrically connected to the read data bus pair RDA and $\overline{\text{RDA}}$ of the serial access memory according to the eighteenth embodiment.

The operation of the serial access memory according to the present embodiment can be understood by reference to the description of the operations of the fifteenth through eighteenth embodiments.

The serial access memory according to the present embodiment can provide a quicker access because the advantageous effect of the eighteenth embodiment is obtained and the initializing circuit is provided in the present serial access memory.

Figure 39:
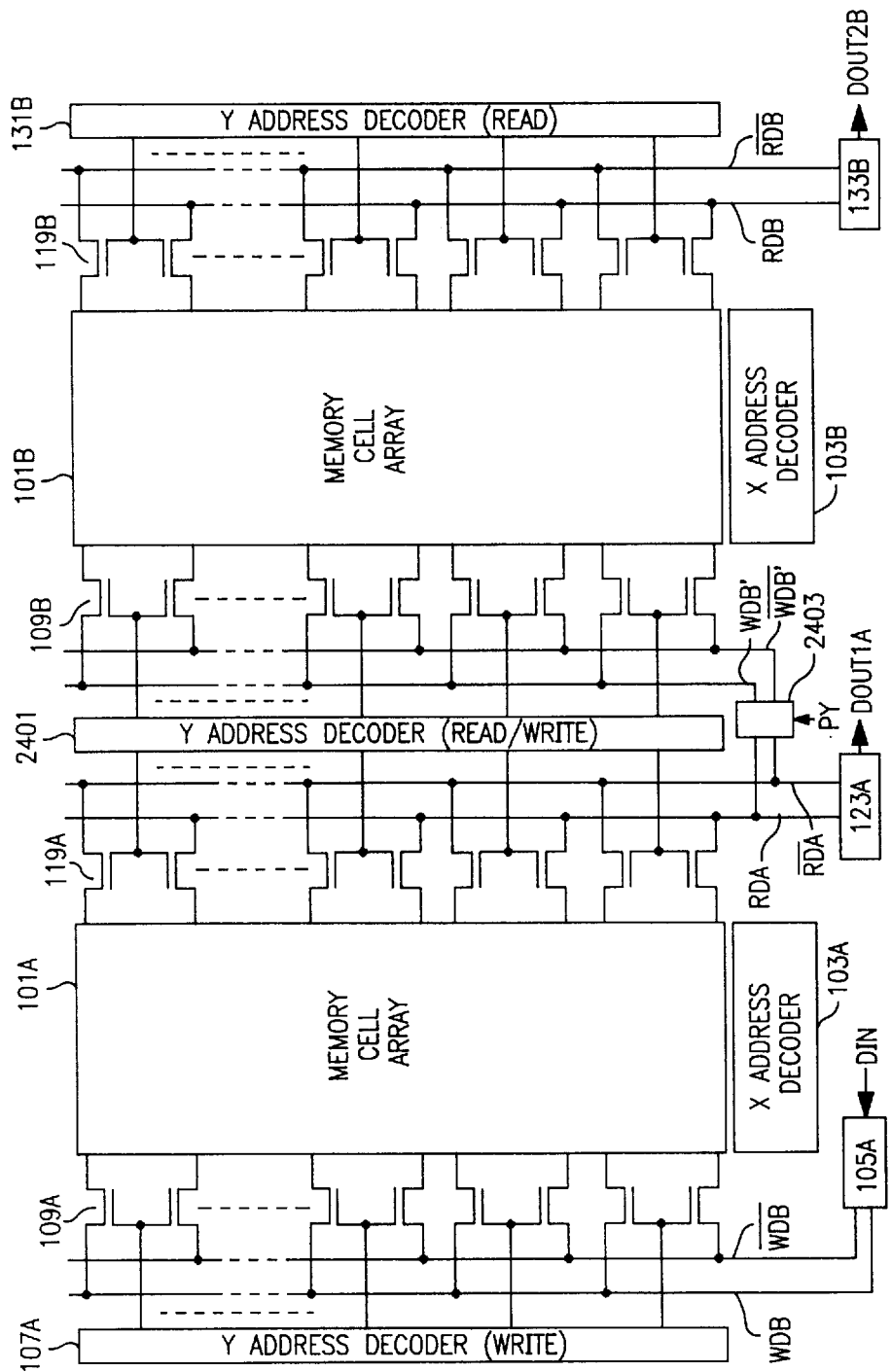
FIG. 39 is a circuit block diagram typically illustrating the structure of a principal part of a serial access memory according to a twentieth embodiment of the present invention.

A twentieth embodiment of the present invention will now be described with reference to FIG. 39. FIG. 39 is a block diagram showing the structure of a principal part of a serial access memory according to the twentieth embodiment of the present invention. In this case, the aforementioned elements are suitably blocked and typically shown to provide an easy understanding of the present embodiment. The same elements of structure as the aforementioned elements are identified by like reference numerals, and their description will therefore be omitted.

In the serial access memory according to the present embodiment, transfer circuits 109A and 119A and transfer circuits 109B and 119B are respectively directly connected to the memory cell array 101A and the memory cell array 101B without providing the write register 111A and the transfer circuit 113A, the read register 117A and the transfer circuit 115A all employed in the first serial access memory unit of the fourteenth embodiment and the write register 111B and the transfer circuit 113B and the read register 115B and the transfer circuit 117B, all employed in the second serial access memory unit of the fourteenth embodiment.

The operation of the serial access memory according to the present embodiment can be easily understood by reference to the description of the operation of the fourteenth embodiment. Since the write and read registers are not provided in this case, data are respectively directly input and output between a write data bus pair and a read data bus pair and the memory cell array 101A and the memory cell array 101B.

When the serial access memory according to the present embodiment is used in an application of such a type that the advantageous effect obtained by the fourteenth embodiment is employed and a quick access is not so required, a two port memory can be realized without providing the read and write data registers. It is therefore possible to provide a memory which can be greatly reduced in chip size and is low in cost.

Figure 40:
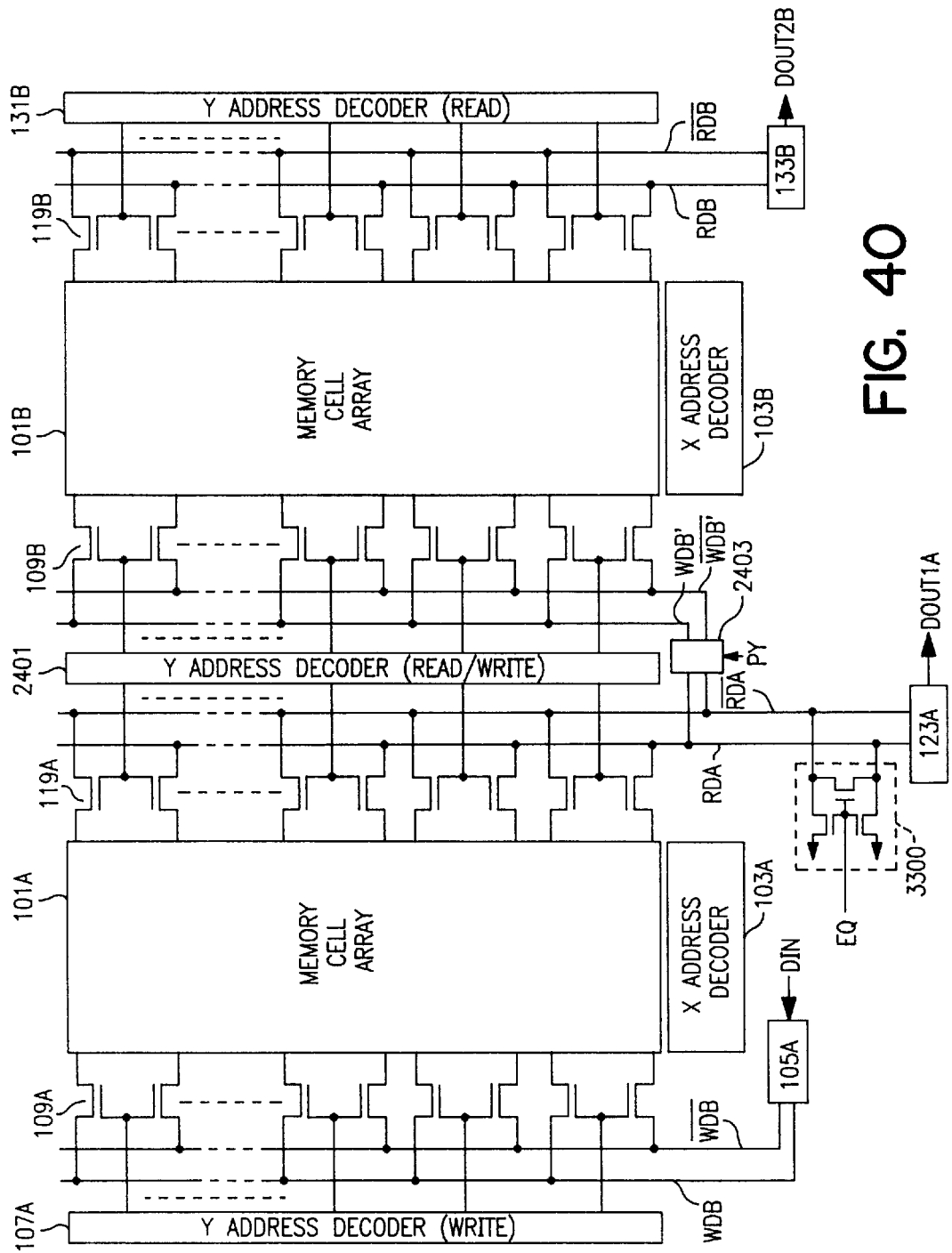
FIG. 40 is a circuit block diagram typically depicting the structure of a principal part of a serial access memory according to a twenty-first embodiment of the present invention.

A twenty-first embodiment of the present invention will now be described with reference to FIG. 40. FIG. 40 is a block diagram showing the structure of a principal part of a serial access memory according to the twenty-first embodiment of the present invention. In this case, the aforementioned elements are suitably blocked and typically shown to provide an easy understanding of the present embodiment. The same elements of structure as the aforementioned elements are identified by like reference numerals, and their description will therefore be omitted.

In the serial access memory according to the present embodiment, an initializing circuit 3300 is electrically connected to the read data bus pair RDA and $\overline{\text{RDA}}$ employed in the serial access memory according to the twentieth embodiment.

The operation of the serial access memory according to the present embodiment can be understood by reference to the description of the operations of the fourteenth, fifteenth, and twentieth embodiments.

The serial access memory according to the present embodiment can provide a quicker access because the advantageous effect of the twentieth embodiment is obtained and the initializing circuit is provided in the present serial access memory.

Figure 41:
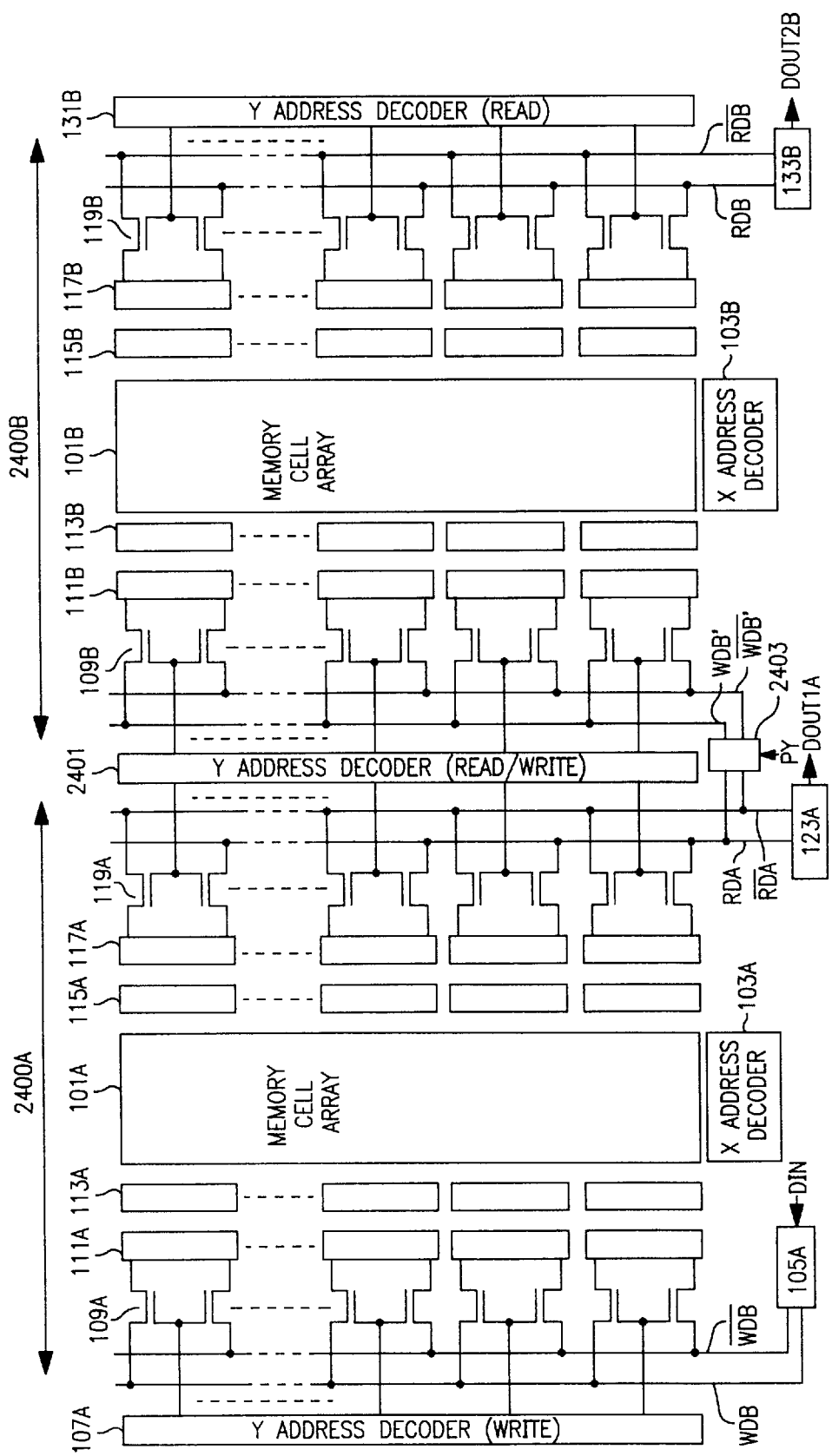
FIG. 41 is a circuit block diagram typically depicting the structure of a principal part of a serial access memory according to a twenty-second embodiment of the present invention.

A twenty-second embodiment of the present invention will now be described with reference to FIG. 41. FIG. 41 is a block diagram showing the structure of a principal part of a serial access memory according to the twenty-second embodiment of the present invention. In this case, the aforementioned elements are suitably blocked and typically shown to provide an easy understanding of the present embodiment. The same elements of structure as the aforementioned elements are identified by like reference numerals and their description will therefore be omitted.

In the serial access memory according to the present embodiment, a memory circuit 4100 is electrically connected to the write data bus pair WDB' and $\overline{\text{WDB}}$' of the second serial access memory unit employed in the fourteenth embodiment.

Figure 42:
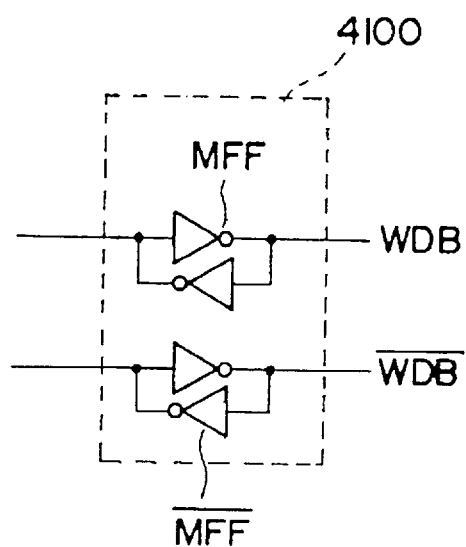
FIG. 42 is a circuit block diagram showing the configuration of a memory circuit employed in the serial access memory shown in FIG. 41.

The memory circuit 4100 is comprised of two flip-flops MFF and $\overline{\text{MFF}}$ as shown in FIG. 42 and has the function of retaining data on a write data bus pair WDB' and $\overline{\text{WDB}}$'.

The operation of the serial access memory according to the present embodiment can be easily understood by reference to the operation of the fifteenth embodiment. In this case, the data on each of the write data buses WDB' and $\overline{\text{WDB}}$' is held until the next data is transferred.

According to the serial access memory of the present embodiment, since the memory circuit 4100 is electrically connected to the write data bus pair WDB' and $\overline{\text{WDB}}$' of the second serial access memory unit, the operation of the serial access memory is reliably ensured, as well as the achievement of the advantageous effect of the fourteenth embodiment when the operation of the serial access memory according to the present embodiment needs to pause.

Figure 43:
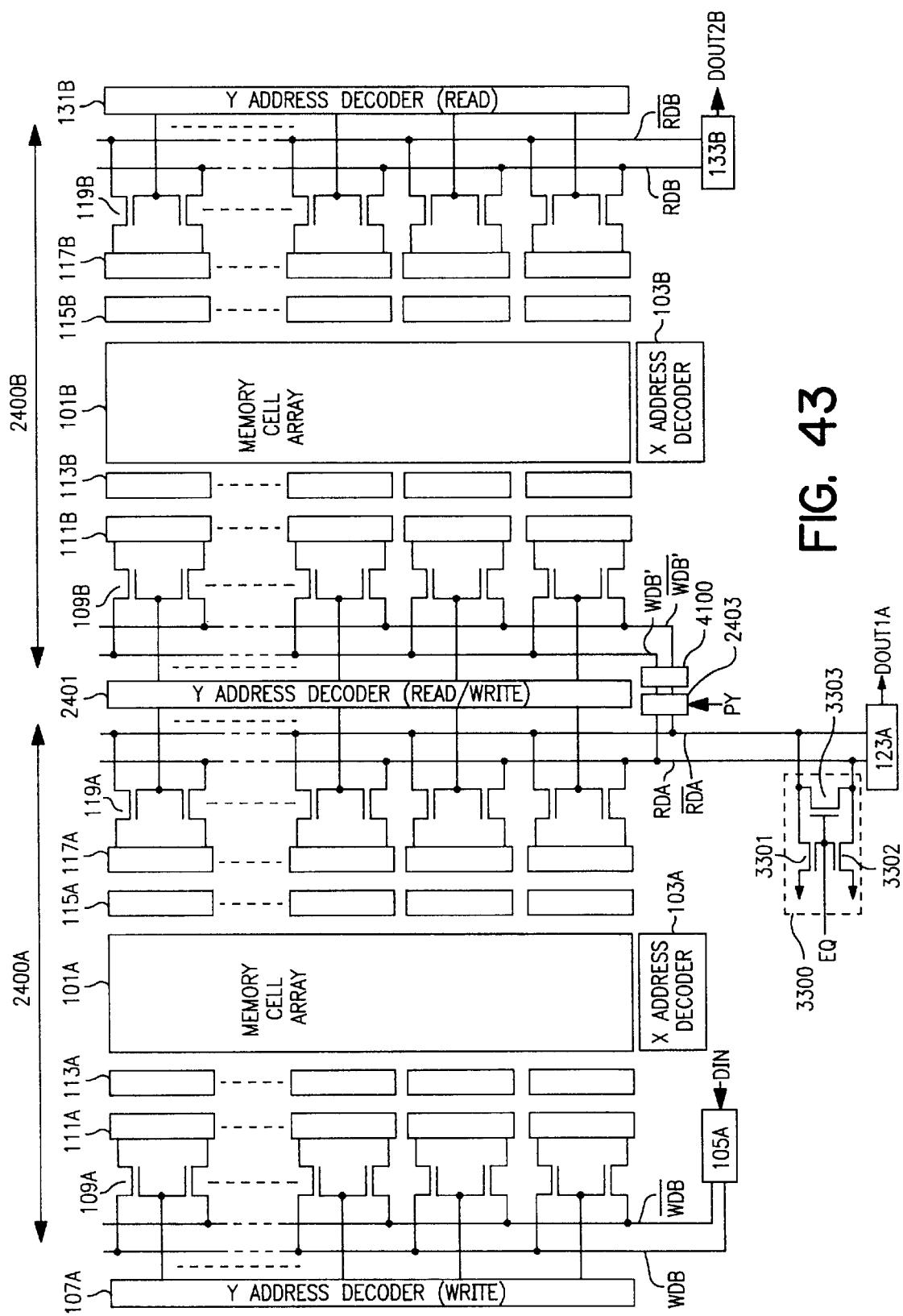
FIG. 43 is a circuit block diagram typically illustrating the structure of a principal part of a serial access memory according to a twenty-third embodiment of the present invention.

A twenty-third embodiment of the present invention will now be described with reference to FIG. 43. FIG. 43 is a block diagram showing the structure of a principal part of a serial access memory according to the twenty-third embodiment of the present invention. In this case, the aforementioned elements are suitably blocked and typically shown to provide an easy understanding of the present embodiment. The same elements of structure as the aforementioned elements are identified by like reference numerals and their description will therefore be omitted.

In the serial access memory according to the present embodiment, a memory circuit 4100 is electrically connected to the write data bus pair WDB' and $\overline{\text{WDB}}$' of the second serial access memory unit employed in the fifteenth embodiment.

The operation of the serial access memory according to the present embodiment can be easily understood by reference to the operations of the fifteenth and sixteenth embodiments. In this case, the data on each of the write data buses WDB' and $\overline{\text{WDB}}$' is held until the next data is transferred.

According to the serial access memory of the present embodiment, since the memory circuit 4100 is electrically connected to the write data bus pair WDB' and $\overline{\text{WDB}}$' of the second serial access memory unit, the operation of the serial access memory is reliably ensured, as well as the achievement of the advantageous effects of the fourteenth and sixteenth embodiments when the operation of the serial access memory according to the present embodiment needs to pause.

If memory circuits 4100 are electrically connected to the write data bus pairs WDB' and $\overline{\text{WDB}}$' of the second serial access memory units of the sixteenth through twenty-first embodiments in a manner similar to the twenty-second and twenty-third embodiments, then their reliable operations are ensured, as well as the achievement of the advantageous effects of the sixteenth through twenty-first embodiments because of the connection of the memory circuits 4100 to the write data bus pairs WDB' and $\overline{\text{WDB}}$' of the second serial memory units when the operations of the respective serial access memories need to pause.

A description will now be made of embodiments each applied to an apparatus wherein the serial access memories according to the above embodiments are provided in the form of two banks.

Figure 44:
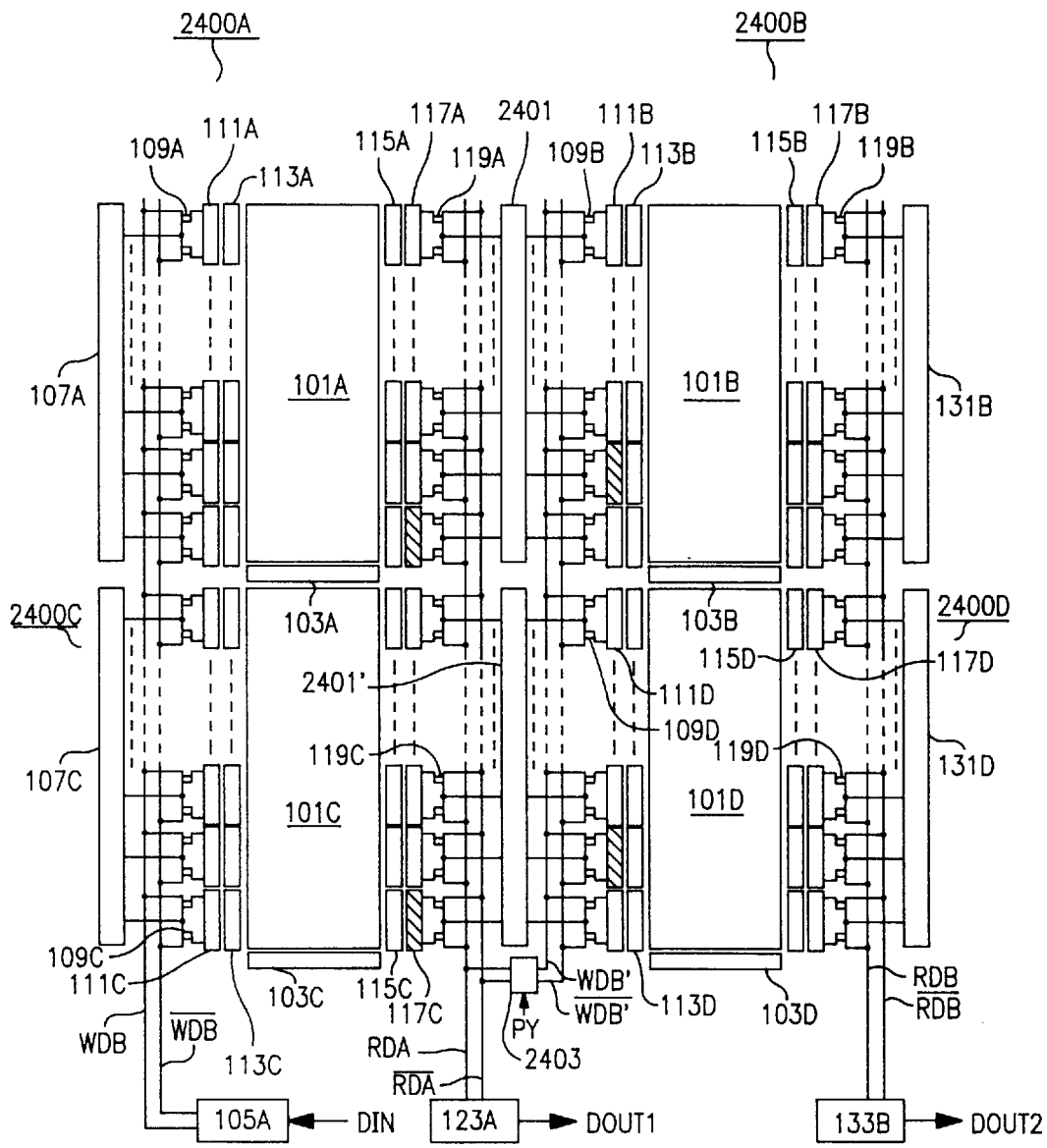
FIG. 44 is a circuit block diagram typically showing the structure of a principal part of a serial access memory according to a twenty-fourth embodiment of the present invention.

A twenty-fourth embodiment of the present invention will now be described with reference to FIG. 44. FIG. 44 is a block diagram showing the structure of a principal part of a serial access memory according to the twenty-fourth embodiment of the present invention. In this case, the aforementioned elements are suitably blocked and typically shown to provide an easy understanding of the present embodiment. The serial access memory according to the present embodiment comprises a first serial access memory unit 2400A, a second serial access memory unit 2400B, a third serial access memory unit 2400C, and a fourth serial access memory unit 2400D.

Reference symbols "A" are respectively applied to ends of the aforementioned reference numerals applied to the elements of the first serial access memory unit 2400A, which have the same functions as those of the aforementioned elements, and their detailed description will be omitted. The detailed configuration of the first serial access memory unit 2400A can be easily understood by reference to FIG. 25.

Reference symbols "B" are respectively applied to the ends of the aforementioned reference numerals applied to elements of the second serial access memory unit 2400B, which have the same functions as those of the aforementioned elements, and their detailed description will be omitted. The detailed configuration of the second serial access memory unit 2400B can be easily understood by reference to FIG. 26.

Reference symbols "C" are respectively applied to the ends of the aforementioned reference numerals applied to elements of the second serial access memory unit 2400C, which have the same functions as those of the aforementioned elements, and their detailed description will be omitted. The detailed configuration of the second serial access memory unit 2400C can be easily understood by reference to FIGS. 25 and 26 or the like. A write data bus pair WDB and WDB and a read data bus pair RDA and $\overline{\text{RDA}}$ of the third serial access memory unit 2400C are respectively electrically connected to the write data bus pair WDB and $\overline{\text{WDB}}$ and the read data bus pair RDA and $\overline{\text{RDA}}$ of the first serial access memory unit 2400A.

Reference symbols "D" are respectively applied to the ends of the aforementioned reference numerals applied to elements of the second serial access memory unit 2400D, which have the same functions as those of the aforementioned elements, and their detailed description will be omitted. The detailed configuration of the second serial access memory unit 2400D can be easily understood by reference to FIGS. 25 and 26 or the like. A write data bus pair WDB' and $\overline{\text{WDB}}$' and a read data bus pair RDB and RDB of the fourth serial access memory unit 2400D are respectively electrically connected to the write data bus pair WDB' and $\overline{\text{WDB}}$' and the read data bus pair RDB and $\overline{\text{RDB}}$ of the second serial access memory unit 2400B.

Figure 45:
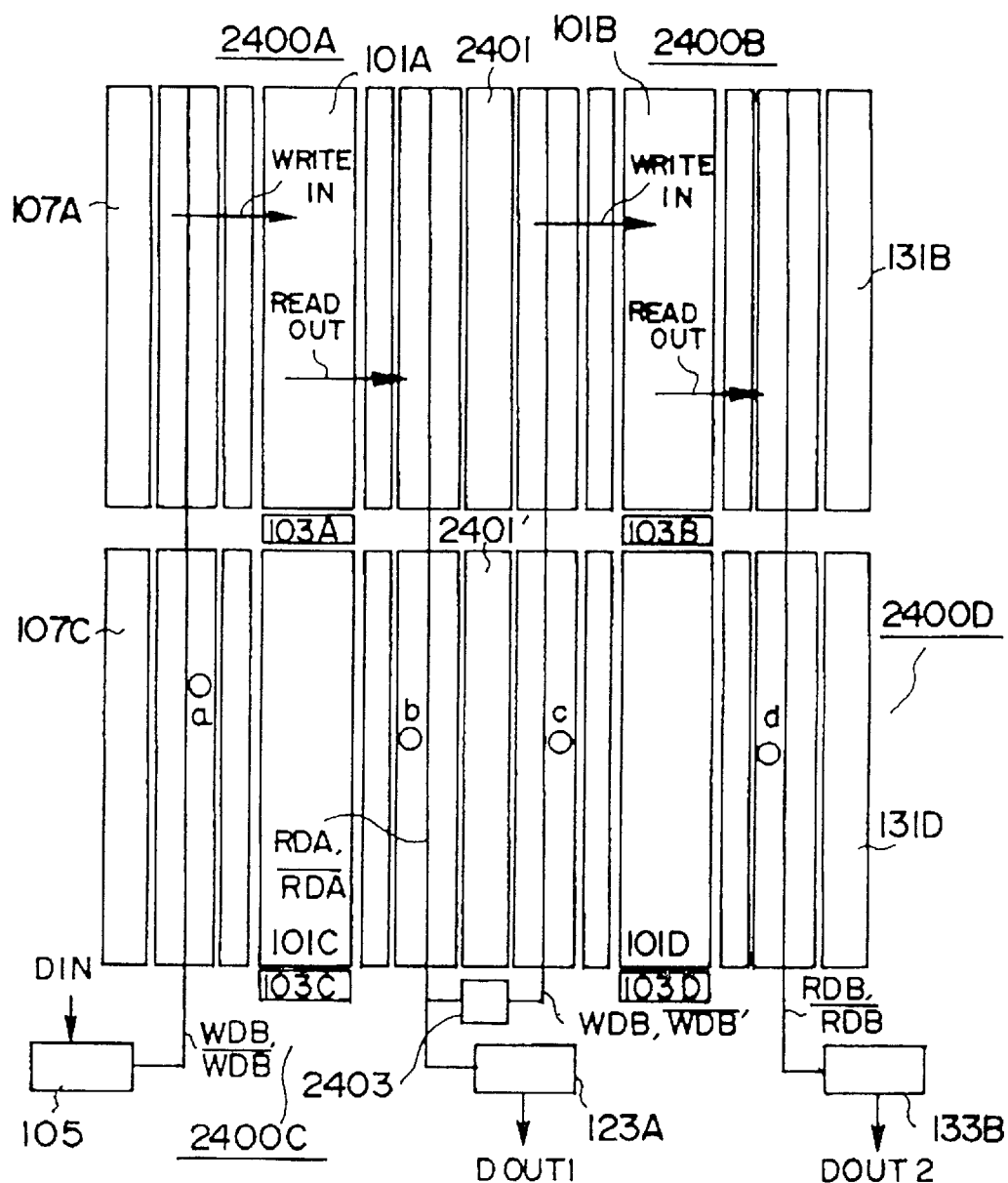
FIG. 45 is a typical circuit block diagram for describing one operation of the serial access memory shown in FIG. 44.
Figure 46:
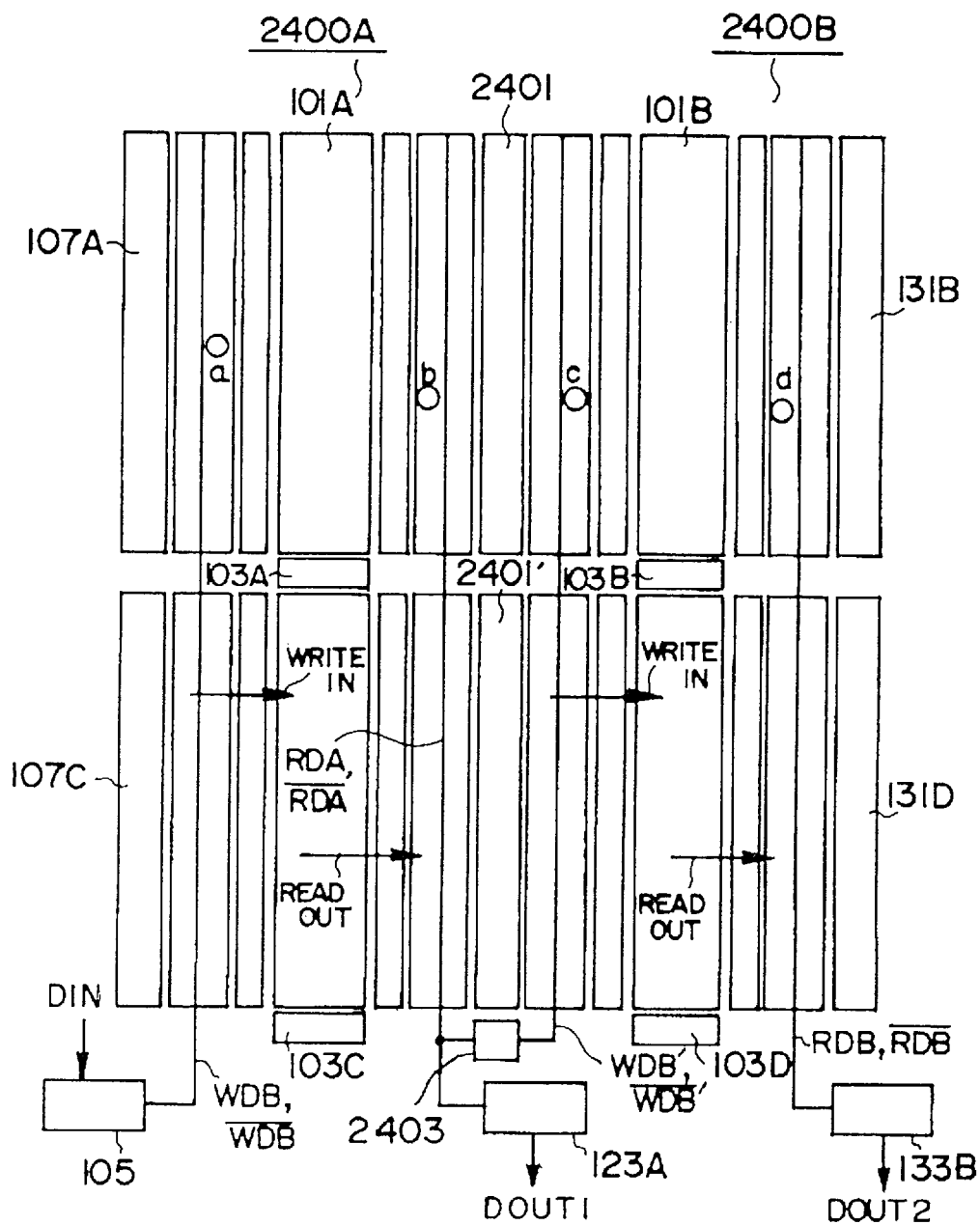
FIG. 46 is a typical circuit block diagram for describing another operation of the serial access memory shown in FIG. 44.

The basic operation of the serial access memory according to the present embodiment can be understood by reference to the operation of the fourteenth embodiment. Therefore, a description will now be made of only characteristic operations with reference to FIGS. 45 and 46. FIGS. 45 and 46 are respectively typical circuit block diagrams for describing the characteristic operations of the serial access memory according to the present embodiment.

As shown in FIG. 45, the third serial access memory unit 2400C and the fourth serial access memory unit 2400D can perform access operations simultaneously with a transfer process (WRITE IN) for data writing and a transfer process (READ OUT) for data reading, both of which are performed by the first and second serial access memory units 2400A and 2400B, for example. Similarly, as shown in FIG. 46, the first and second serial access memory units 2400A and 2400B can perform access operations simultaneously with a transfer process (WRITE IN) for data writing and a transfer process (READ OUT) for data reading, both of which are carried out by the third and fourth serial access memory units 2400C and 2400D, for example. In this case, symbols a, b, and d in the drawings represent arbitrary bits in registers which are in access operation, and are shown to provide an easy understanding.

Since the serial access memory according to the present embodiment can be operated in the above-described manner, the data writing and reading processes can be performed without interruption. It is also possible to provide a serial access memory which can bring about the advantageous effect obtained by the fourteenth embodiment and can be applied to wider uses.

Similarly, the twenty-fifth through thirty-first embodiments in which the serial access memory according to the present embodiment has been applied to each of the serial access memories according to the various embodiments described above, will be described below. In this case, the aforementioned elements are suitably blocked and typically shown to provide an easy understanding of each of the present embodiments. The same elements of structure as the aforementioned elements are identified by like reference numerals, and their description will therefore be omitted. Detailed descriptions about these can be understood by reference to the above-described embodiments.

Figure 47:
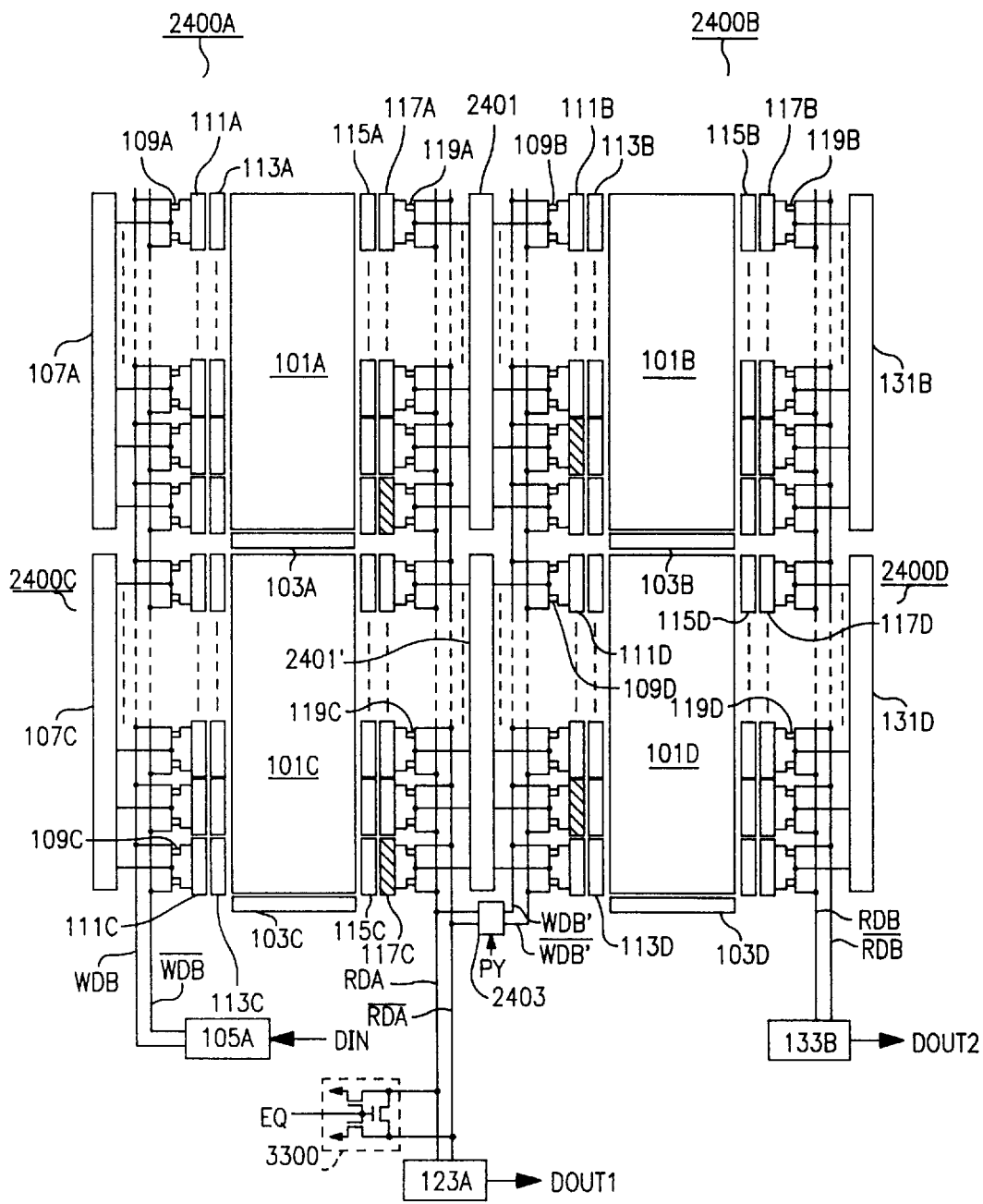
FIG. 47 is a circuit block diagram typically showing the structure of a principal part of a serial access memory according to a twenty-fifth embodiment of the present invention.

The twenty-fifth embodiment shows a case where the serial access memory according to the fifteenth embodiment is provided in the form of two banks, as shown in FIG. 47 as in the case of the serial access memory according to the twenty-fourth embodiment.

Figure 48:
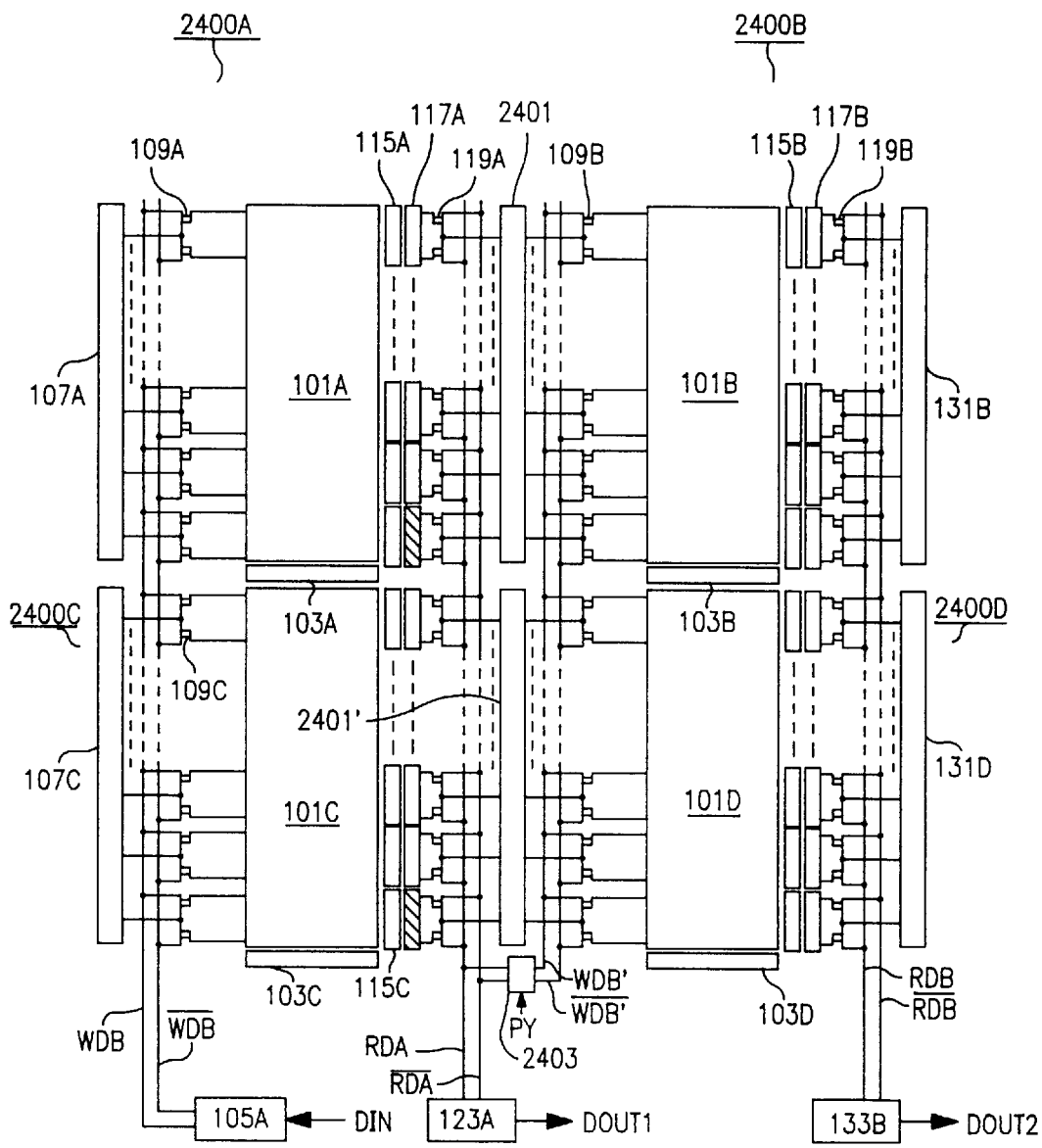
FIG. 48 is a circuit block diagram typically illustrating the structure of a principal part of a serial access memory according to a twenty-sixth embodiment of the present invention.

The twenty-sixth embodiment shows a case where the serial access memory according to the sixteenth embodiment is provided in the form of two banks as shown in FIG. 48 as in the case of the serial access memory according to the twenty-fourth embodiment.

Figure 49:
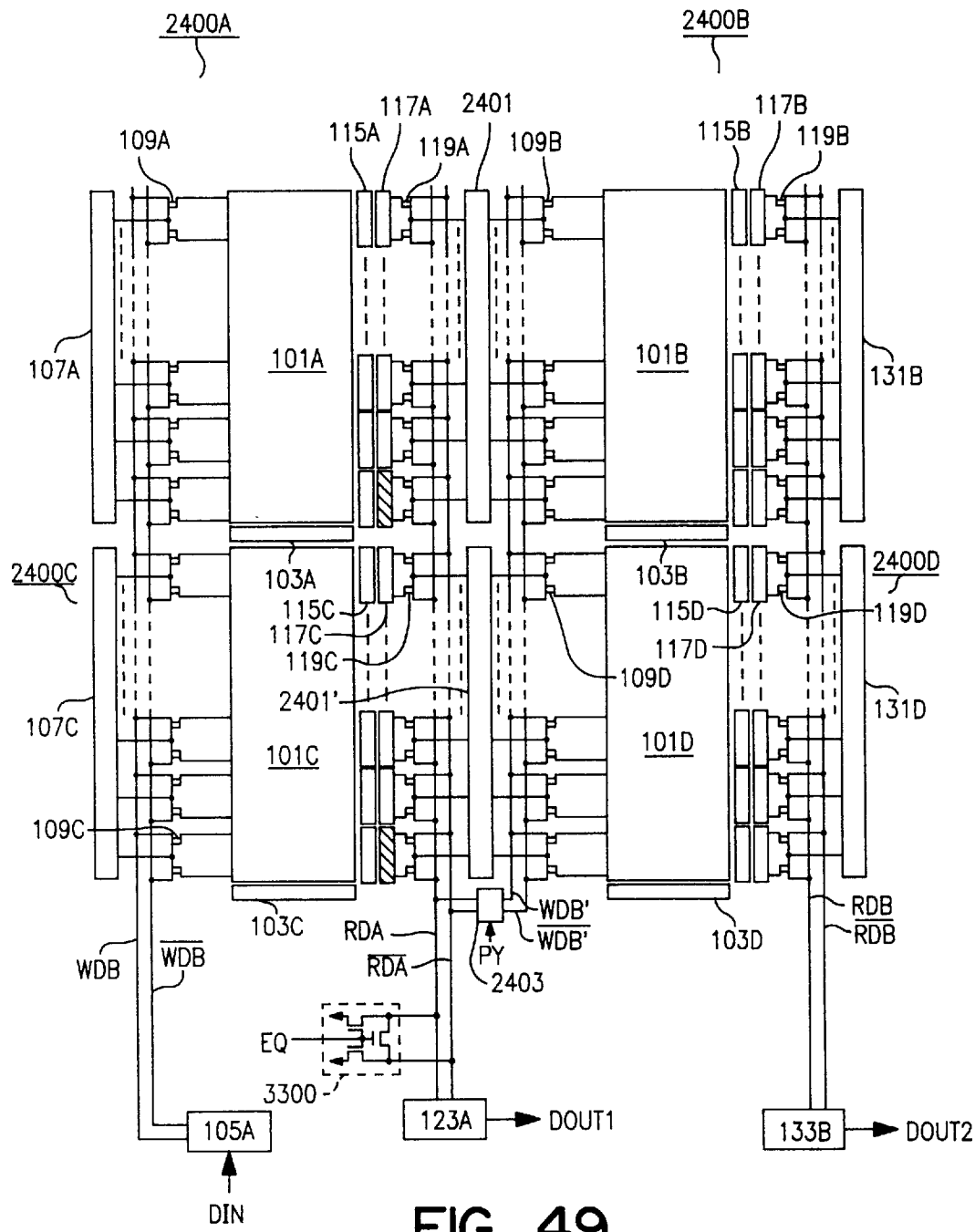
FIG. 49 is a circuit block diagram typically depicting the structure of a principal part of a serial access memory according to a twenty-seventh embodiment of the present invention.

The twenty-seventh embodiment illustrates a case where the serial access memory according to the seventeenth embodiment is provided in the form of two banks as shown in FIG. 49 as in the case of the serial access memory according to the twenty-fourth embodiment.

Figure 50:
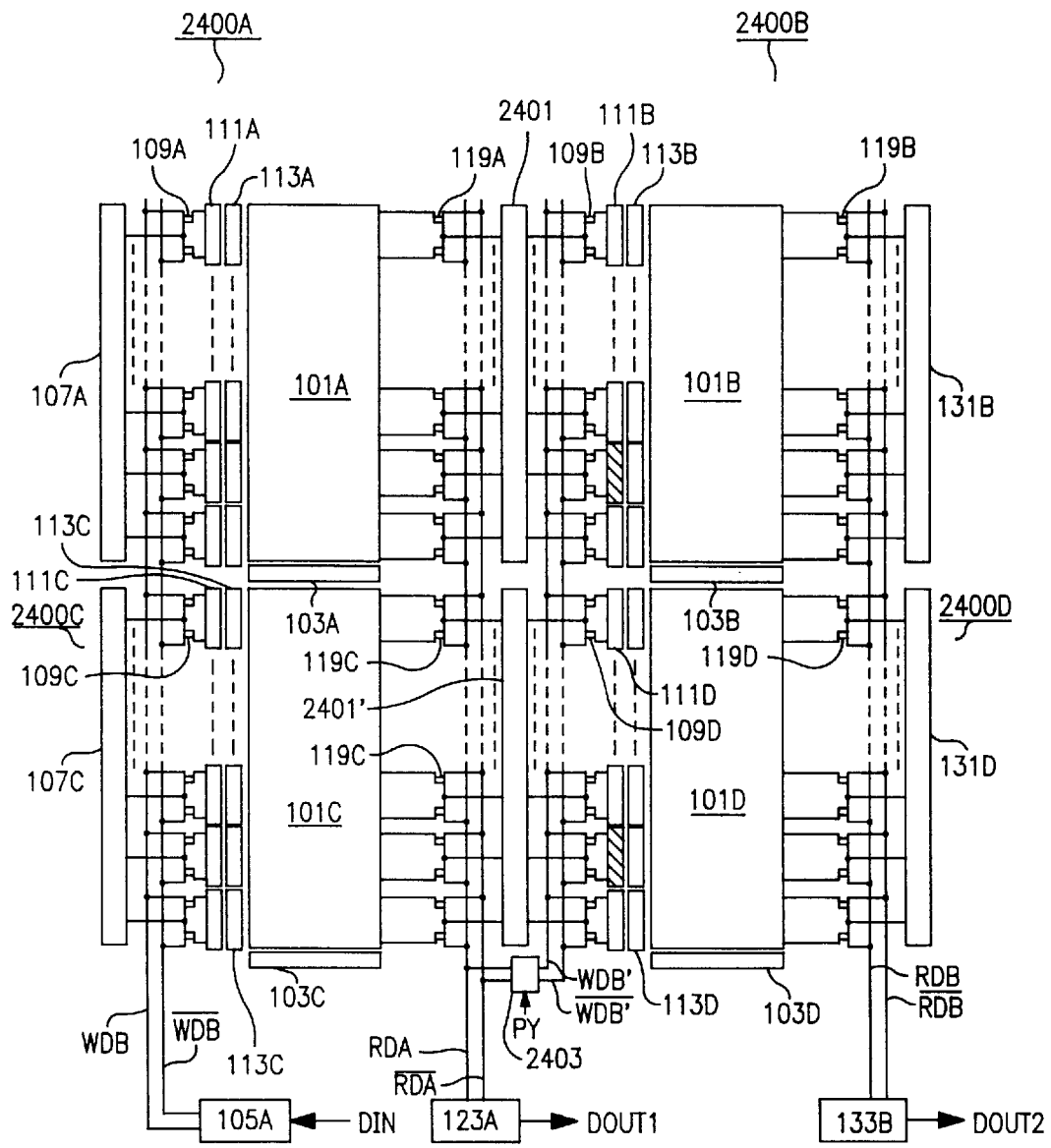
FIG. 50 is a circuit block diagram typically showing the structure of a principal part of a serial access memory according to a twenty-eighth embodiment of the present invention.

The twenty-eighth embodiment depicts a case where the serial access memory according to the eighteenth embodiment is provided in the form of two banks as shown in FIG. 50 as in the case of the serial access memory according to the twenty-fourth embodiment.

Figure 51:
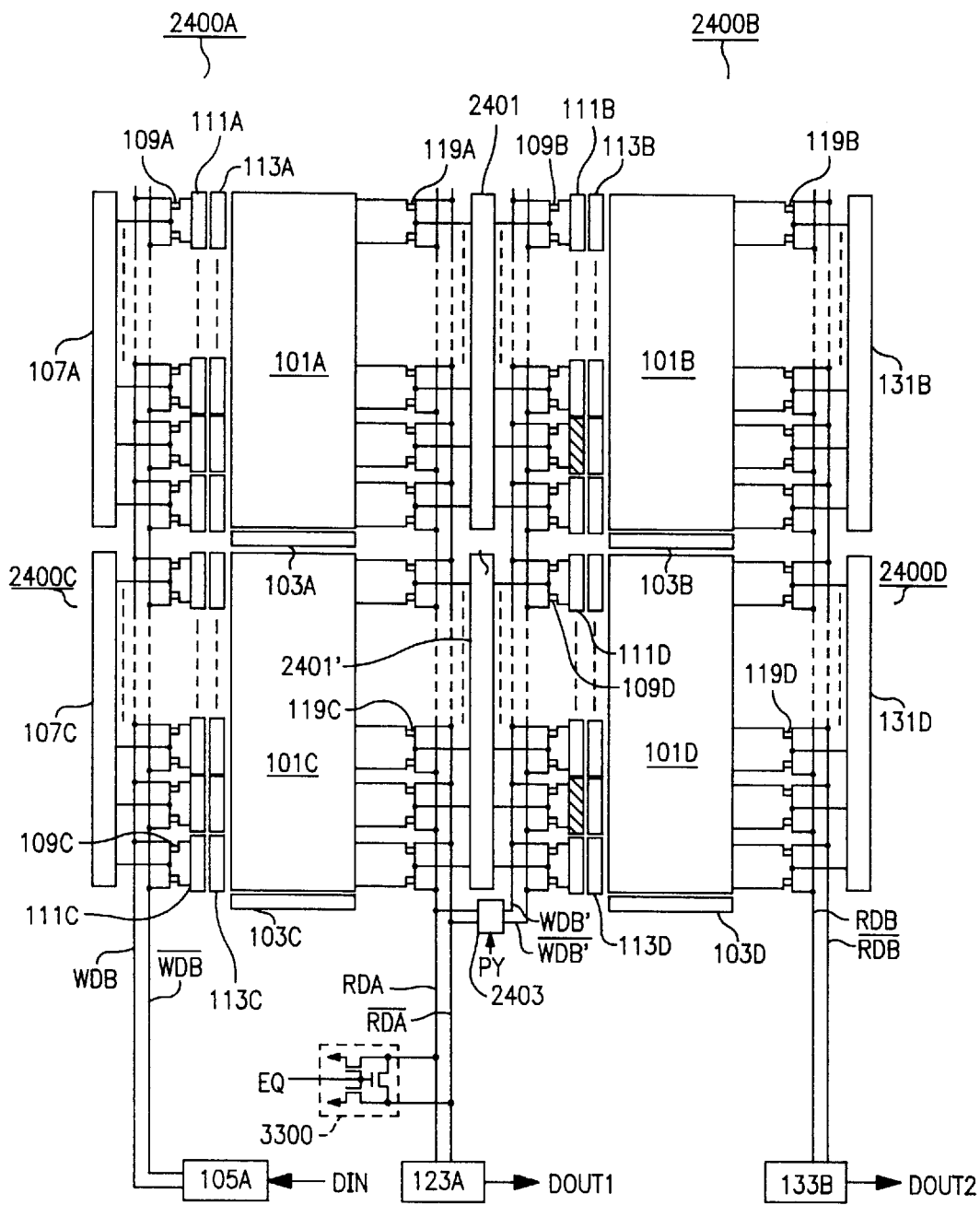
FIG. 51 is a circuit block diagram typically illustrating the structure of a principal part of a serial access memory according to a twenty-ninth embodiment of the present invention.

The twenty-ninth embodiment shows a case where the serial access memory according to the nineteenth embodiment is provided in the form of two banks as shown in FIG. 51 as in the case of the serial access memory according to the twenty-fourth embodiment.

Figure 52:
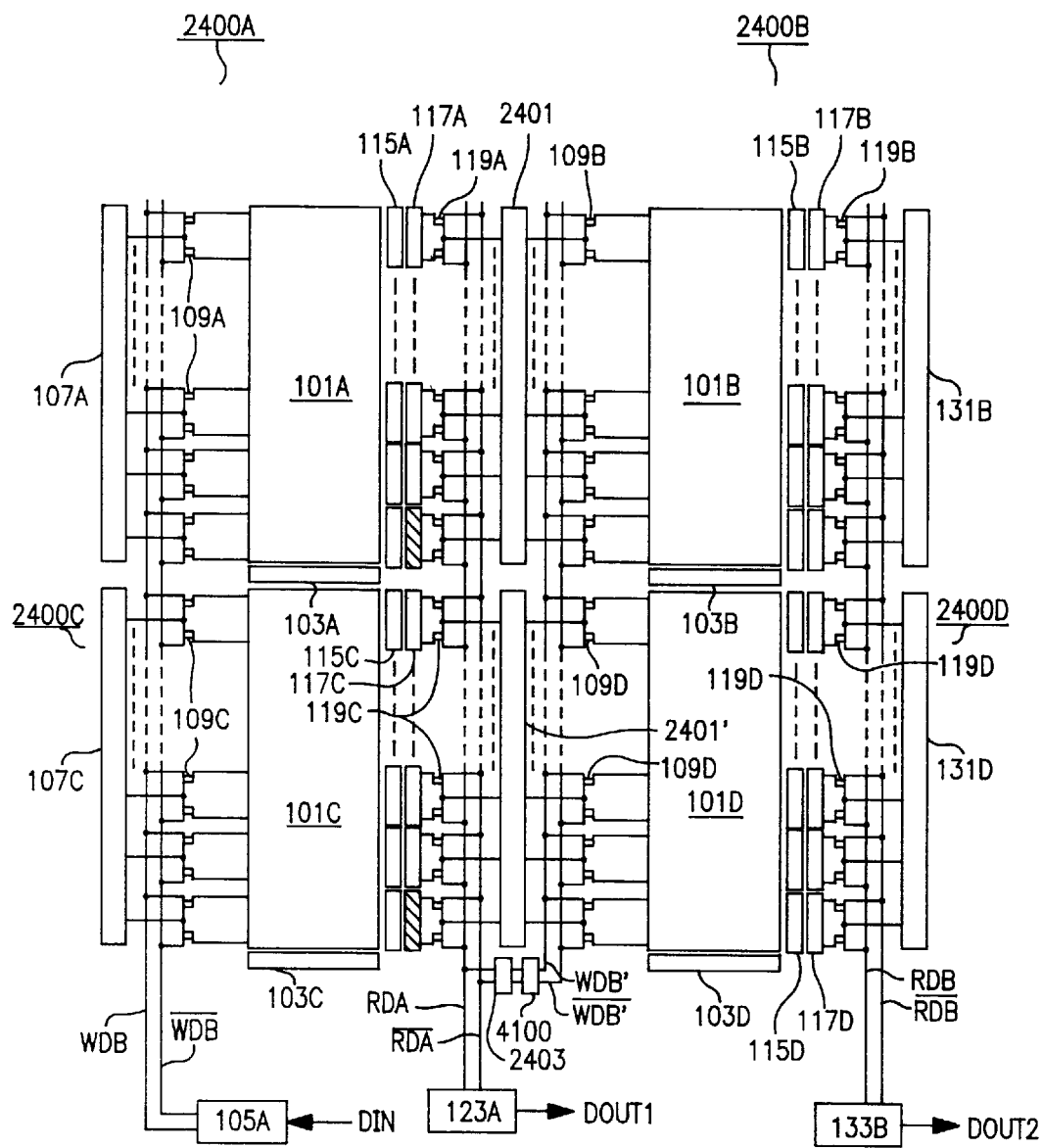
FIG. 52 is a circuit block diagram typically depicting the structure of a principal part of a serial access memory according to a thirtieth embodiment of the present invention.

The thirtieth embodiment shows a case where the serial access memory according to the twenty-second embodiment is provided in the form of two banks as shown in FIG. 52 as in the case of the serial access memory according to the twenty-fourth embodiment.

Figure 53:
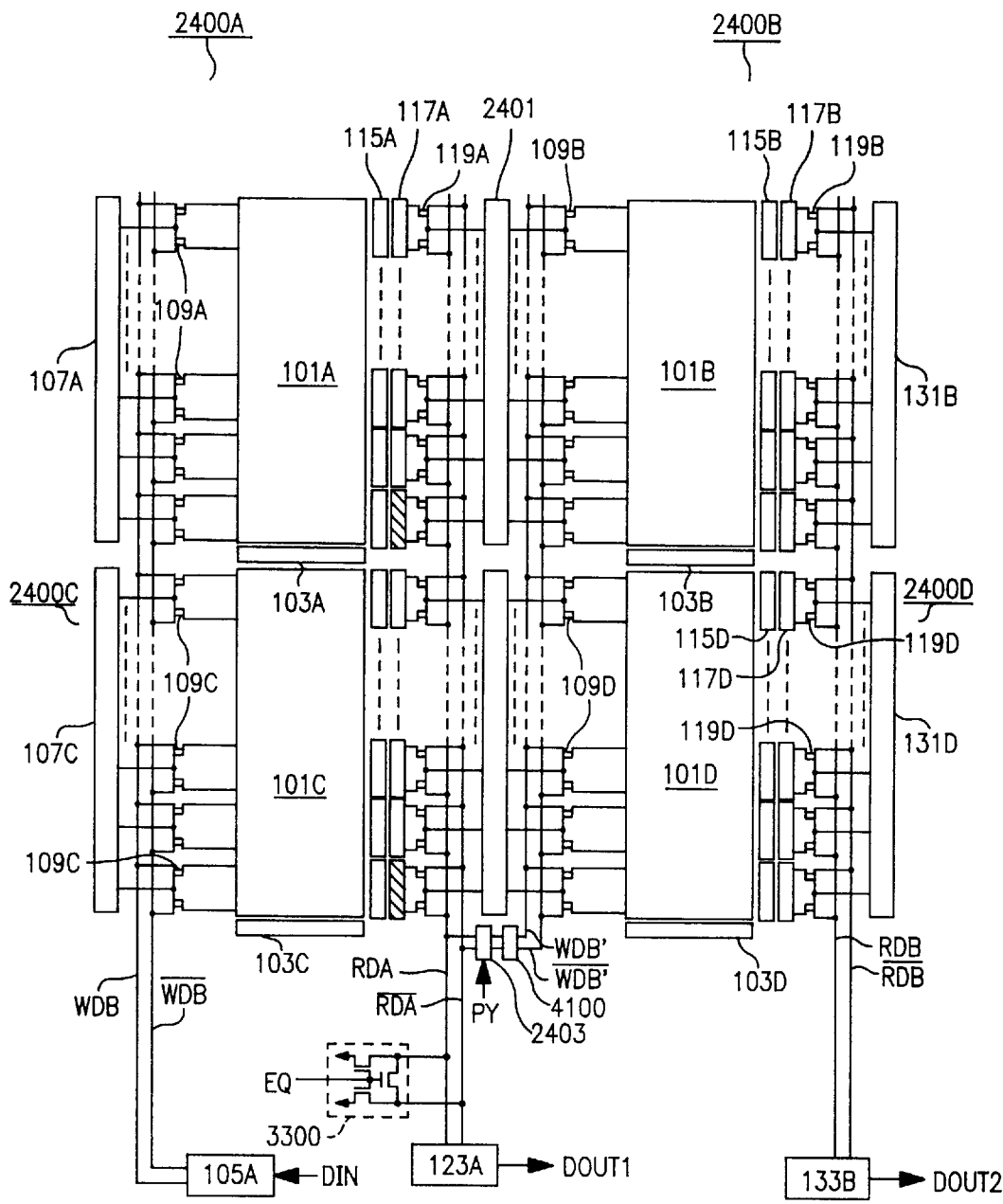
FIG. 53 is a circuit block diagram typically showing the structure of a principal part of a serial access memory according to a thirty-first embodiment of the present invention.

The thirty-first embodiment shows a case where the serial access memory according to the twenty-third embodiment is provided in the form of two banks as shown in FIG. 53 as in the case of the serial access memory according to the twenty-fourth embodiment.

Although not shown in the drawings, each of the serial access memories according to the twenty-second and twenty-third embodiments and each of the serial access memories constructed such that the memory circuits 4100 are electrically connected to the write data bus pairs WDB and $\overline{\text{WDB}}$ of the second serial access memory units of the sixteenth through twenty-first embodiments, can also be constructed in the form of two banks by applying the serial access memory according to the twenty-fourth embodiment to each of these serial access memories in the same manner as described above.

Since each of the serial access memories according to the twenty-fifth through thirty-first embodiments can be operated as described in the twenty-fourth embodiment, the data writing and reading processes can be performed without interruption. It is thus possible to provide serial access memories each of which can perform data writing and reading processes and can be applied to wider uses as well as the achievement of the advantageous effect of the fourteenth embodiment.

Figure 54:
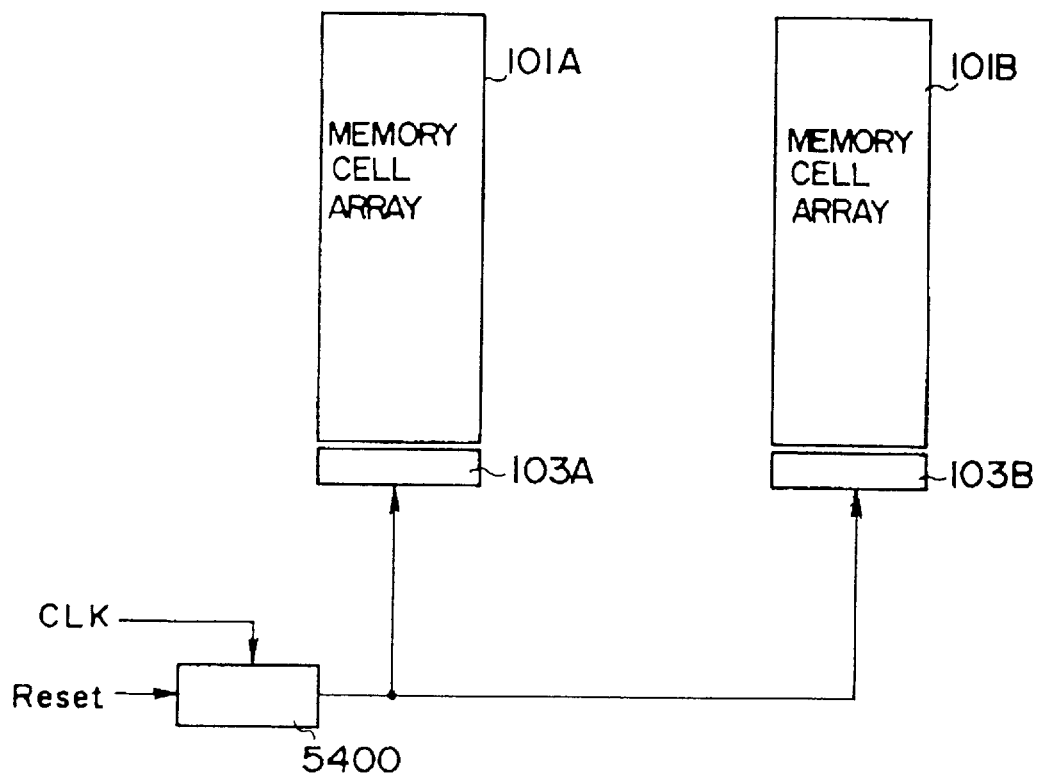
FIG. 54 is a circuit block diagram typically illustrating the structure of a principal part of a serial access memory according to a thirty-second embodiment of the present invention.
Figure 55:
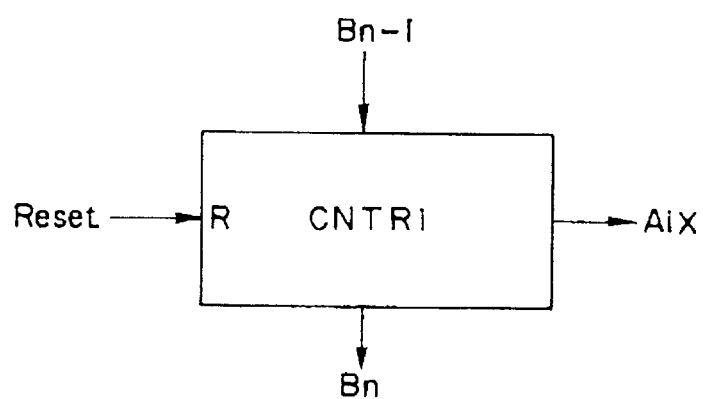
FIG. 55 is a circuit block diagram depicting a unit address counter circuit employed in the serial access memory shown in FIG. 54.

A thirty-second embodiment of the present invention will now be described with reference to FIG. 54. FIG. 54 is a block diagram showing the structure of a principal part of a serial access memory according to the thirty-second embodiment of the present invention. In this case, the aforementioned elements are suitably blocked and typically shown to provide an easy understanding of the present embodiment. The same elements of structure as the aforementioned elements are identified by like reference numerals, and their description will therefore be omitted.

An address counter circuit 5400 for supplying a common X address to each of the X address decoders 103A and 103B employed in the above-described various embodiments is provided in the serial access memory according to the present embodiment.

The address counter circuit 5400 has the function of supplying X addresses $A_{0X}$, $A_{1X}$, ... $A_{nX}$ to the X address decoders 103A and 103B in common in response to the clock signal CLK and a reset signal Reset. The address counter circuit 5400 is comprised of a plurality of unit address counter circuits $CNTR_0$ through $CNTR_n$.

The unit address counter circuit $CNTR_i$ receives a reset signal Reset and an input $B_{n-1}$ therein and outputs an output $B_n$ and an X address $A_{iX}$ therefrom. When the reset signal Reset is brought to the "H" level, the output $B_n$ of the unit address counter circuit $CNTR_i$ is brought to the "L" level.

Figure 56:
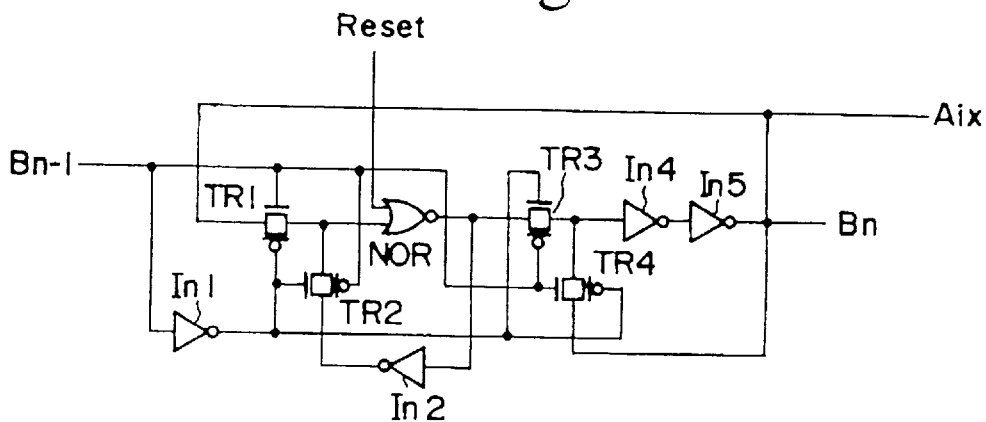
FIG. 56 is a circuit block diagram showing a specific configuration of the unit address counter circuit employed in the serial access memory shown in FIG. 54.

A specific configuration of the unit address counter circuit $CNTR_i$ is shown in FIG. 56. The unit address counter circuit $CNTR_i$ comprises an inverter $In_1$ having an input terminal supplied with the input $B_{n-1}$, a transfer gate TR1 controlled based on the output of the inverter $In_1$ and the input $B_{n-1}$, a transfer gate TR2 controlled based on the output of the inverter $In_1$ and the input $B_{n-1}$, a NOR gate having input terminals, one of which is supplied with the reset signal Reset and the other of which is supplied with the X address $A_{iX}$ through the transfer gate TR1 and is electrically connected to the output of an inverter $In_2$ through the transfer gate TR2, a transfer gate TR3 controlled based on the output of the inverter $In_1$ and the input $B_{n-1}$, a transfer gate TR4 controlled based on the output of the inverter $In_1$ and the input $B_{n-1}$, an inverter $In_4$ having an input terminal electrically connected to the output of the NOR gate through the transfer gate TR3 and the output $B_n$ through the transfer gate TR4, and an inverter $In_5$ whose input and output are respectively electrically connected to the output of the inverter In₄ and the output Bₙ.

Figure 57:
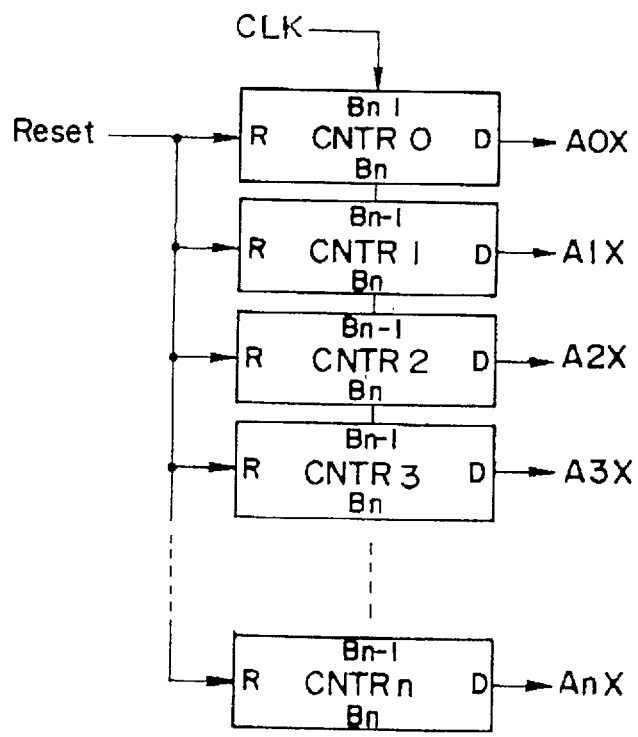
FIG. 57 is a circuit block diagram illustrating the configuration of an address counter circuit employed in the serial access memory shown in FIG. 54.
Figure 58:
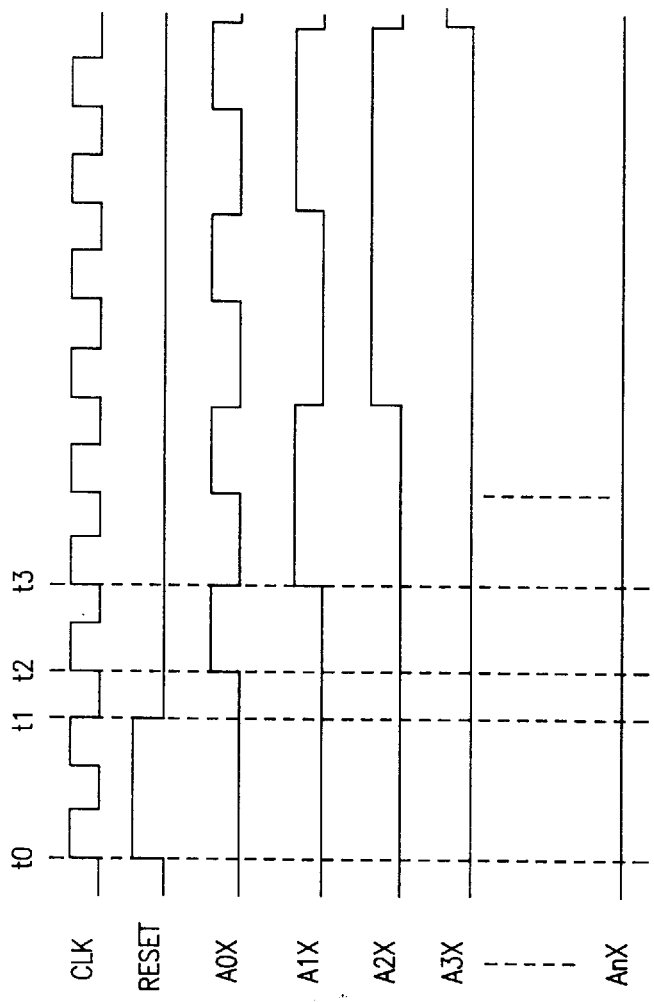
FIGS. 58(a)–58(G) are a partial timing chart for describing the operation of the address counter circuit shown in FIG. 57.

As shown in FIG. 57, the address counter circuit 5400 comprises a plurality of unit address counter circuits electrically series-connected to one another. The operation of the address counter circuit 5400 is represented by a partial timing chart shown in FIGS. 58(A)–58(G) as an illustrative example.

Figure 59:
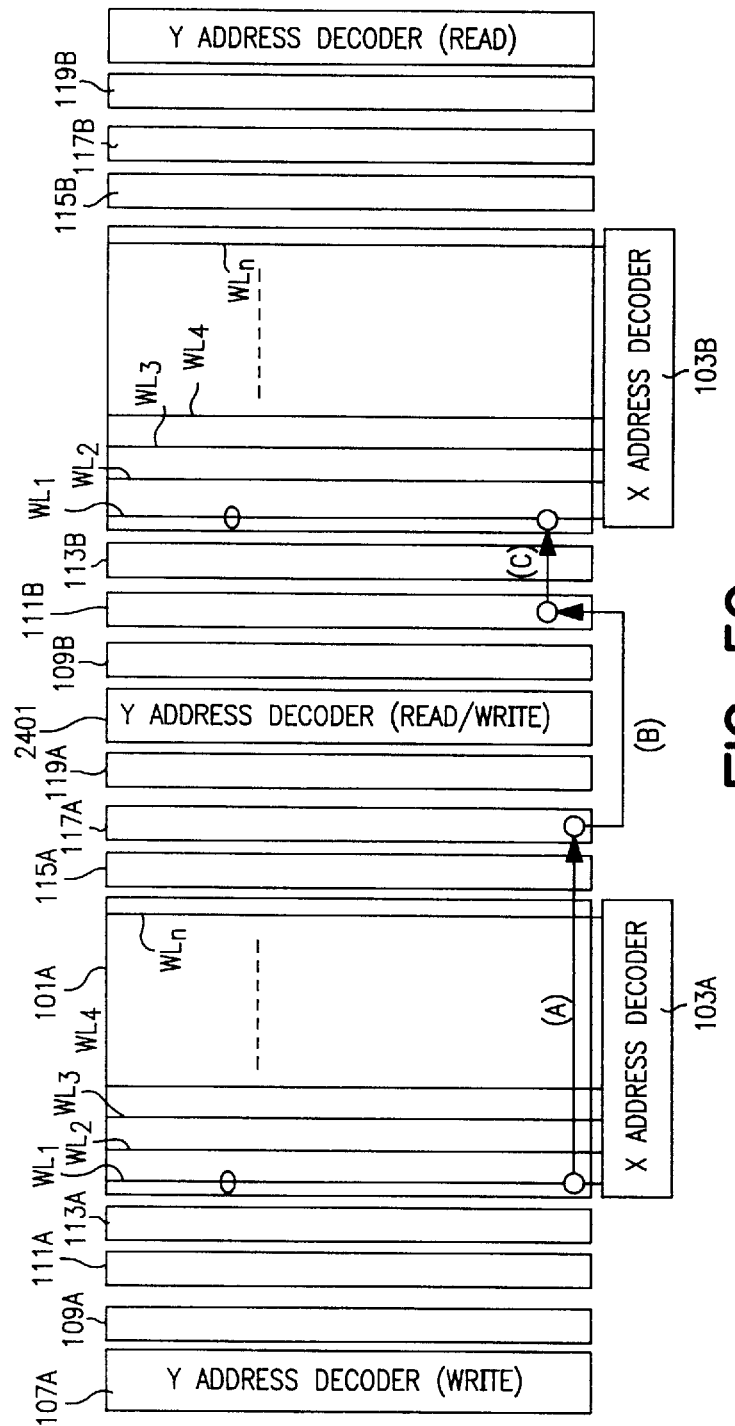
FIG. 59 is a partial timing chart for describing the operation of the serial access memory shown in FIG. 54.

The operation of the serial access memory according to the present embodiment will now be described in brief with reference to FIG. 59.

When the address counter 5400 supplies the common X address to each of the X address decoders 103A and 103B, the first and second memory cell arrays 101A and 101B respectively select, for example, a word line WL₁ of the first memory cell array 101A and a word line WL₁ of the second memory cell array 101B in response to the same X address.

In this case, the word line WL₁ of the first memory cell array 101A is started up or activated so as to transfer data from the first memory cell array 101A to the first read register 117A (see (A) in the drawing). Thereafter, the data is delayed by one bit under the operation of a delay circuit and the delayed data is written into a second write register 111B (see (B) in the drawing). After that, a word line WL₀ of the second memory cell array 101B is started up so that the contents stored in the second write register 111B are transferred to a memory cell electrically connected to the word line WL₀ (see (C) in the drawing).

Namely, the data stored in the memory cell connected to the word line of the first memory cell array 101A, which has been selected based on the common X address, is transferred to the first read register 117A and is output from the first output terminal DOUT1 in response to the clock signal CLK. Further, the data is written into the second write register 111B after it has been delayed by a predetermined time interval. After completion of the writing of the data into the second write register 111B, the data is then written into the memory cell connected to the word line of the second memory cell array 101B, which has been selected based on the common X address.

According to the serial access memory of the present embodiment, the advantageous effect obtained by each of the aforementioned embodiments can be brought about. Further, the address counter circuit is provided and the common address is supplied to the first and second X address decoders. Therefore, the number of address generating circuits can be reduced and hence the chip area can be reduced.

According to each of the serial access memories of the present invention, as has been described above using the various embodiments, a function equivalent to the function which has been achieved by a plurality of serial access memories can be realized by electrically series-connecting first and second transfer registers to one another.

Further, since each of the serial access memories of the present application is constructed in the above-described manner, a plurality of conventionally-used serial access memories can be simply formed into one chip.

Figure 60:
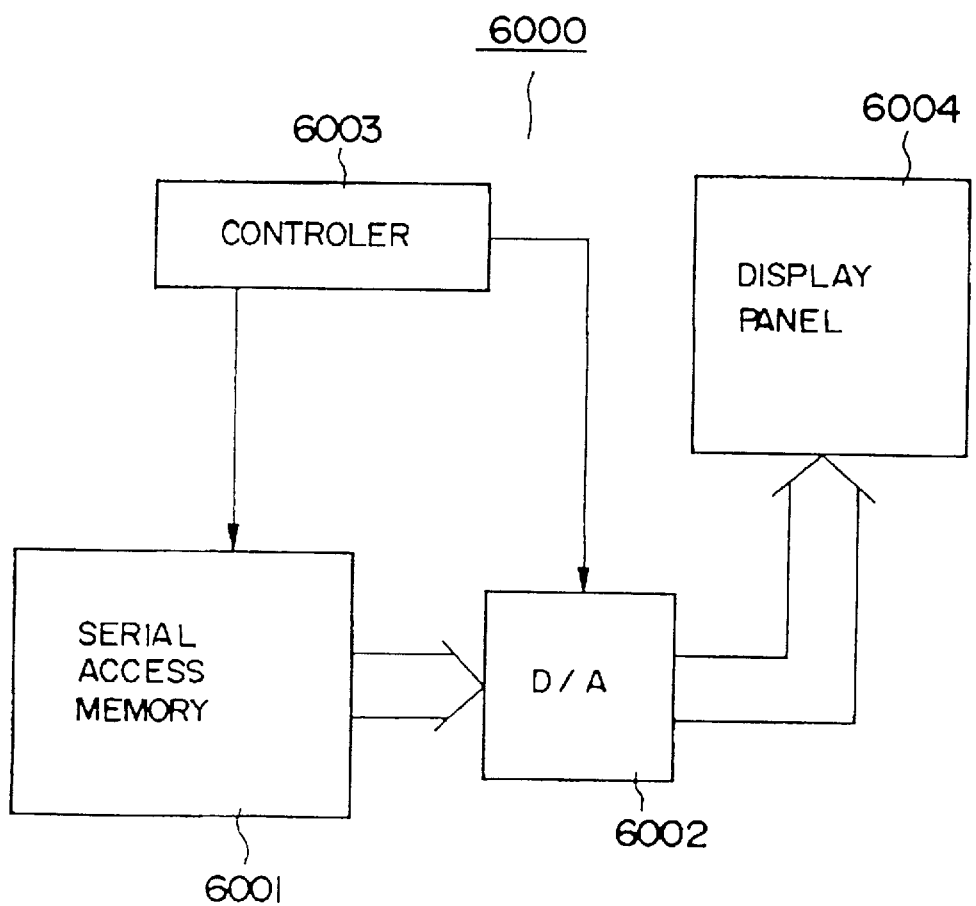
FIG. 60 is a circuit block diagram showing one example in which a serial access memory according to the present invention is applied to a display device.

Each of the serial access memories of the present invention can be applied to a display unit or device 6000 as shown in FIG. 60.

The display device 6000 comprises a serial access memory 6001 according to the present invention, a D/A converter 6002 for receiving and digital-to-analog converting an output produced from the serial access memory 6001 and outputting the converted data therefrom, a controller 6003 for controlling the serial access memory 6001 and the D/A converter 6002, and a display panel 6004 for displaying the data output from the D/A converter 6002 as display data.

The serial access memories of the present invention can be applied to various fields in addition to the above application.

While the present invention has been described with reference to the illustrative embodiments, this description is not intended to be construed in a limiting sense. Various modifications of the illustrative embodiments, as well as other embodiments of the invention, will be apparent to those skilled in the art in reference to this description. It is therefore contemplated that the appended claims will cover any such modifications or embodiments as fall within the true scope of the invention.

What is claimed is:

1. A serial access memory comprising:
   a plurality of word lines;
   a plurality of bit line pairs provided so as to intersect said plurality of word lines respectively;
   a plurality of memory cells connected to points where said plurality of word lines and said plurality of bit line pairs intersect, for storing data therein respectively and providing said data to the plurality of bit lines;
   an X decoder circuit for selecting a desired word line from said plurality of word lines;
   a plurality of first registers;
   a plurality of first switching circuits respectively connected between said plurality of bit line pairs and said plurality of first registers and allowed to conduct between said plurality of bit line pairs and said plurality of first registers in response to a first control signal;
   a plurality of second registers;
   a plurality of second switching circuits respectively connected between said plurality of first registers and said plurality of second registers and allowed to conduct between said plurality of first registers and said plurality of second registers in response to a second control signal;
   a first output circuit;
   a first transfer circuit connected between said plurality of first registers and said first output circuit, for selecting a desired register from said plurality of first registers in response to a first column signal and transferring data stored in said selected register to said first output circuit;
   a second output circuit;
   a second transfer circuit connected between said plurality of second registers and said second output circuit, for selecting a desired register from said plurality of second registers in response to a second column signal and transferring data stored in said selected register to said second output circuit; and
   Y decoder means for supplying the first and second column signals to said first and second transfer circuits respectively,
   wherein data provided to the bit line pairs from the memory cells is input to said plurality of first registers when said plurality of first switching circuits is turned ON and said plurality of second switching circuits is turned OFF, and data passes through said first registers so as to be input to said plurality of second registers when said plurality of first switching circuits is turned ON and said plurality of second switching circuit is turned ON.

2. The serial access memory as claimed in claim 1, wherein a first delay circuit for delaying the data transferred from said first transfer circuit is connected between said first transfer circuit and said first output circuit.

3. The serial access memory as claimed in claim 2, wherein a first bypass circuit connected between said first transfer circuit and said first output circuit in shunt with said first delay circuit is provided so as to transfer data transferred from said first transfer circuit to said first output circuit in response to a first bypass signal.

4. The serial access memory as claimed in claim 3, further including a second delay circuit connected between said second transfer circuit and said second output circuit, for delaying data transferred from said second transfer circuit, and a second bypass circuit connected between said second transfer circuit and said second output circuit in shunt with said second delay circuit, for transferring the data transferred from said second transfer circuit to said second output circuit in response to a second bypass signal.

5. The serial access memory as claimed in claim 1, further including:
   first and second flip-flop circuits series-connected between said first transfer circuit and said first output circuit;
   a first transistor connected between said first transfer circuit and said first output circuit in shunt with said first and second flip-flop circuits and allowed to conduct between said first transfer circuit and said first output circuit in response to a first select signal; and
   a second transistor connected between said first flip-flop circuit and said first output circuit in shunt with said second flip-flop circuit and allowed to conduct between said first flip-flop circuit and said first output circuit in response to a second select signal.

6. The serial access memory as claimed in claim 5, further including:
   third and fourth flip-flop circuits series-connected between said second transfer circuit and said second output circuit;
   a third transistor connected between said second transfer circuit and said second output circuit in shunt with said third and fourth flip-flop circuits and allowed to conduct between said second transfer circuit and said second output circuit in response to a third select signal; and
   a fourth transistor connected between said third flip-flop circuit and said second output circuit in shunt with said fourth flip-flop circuit and allowed to conduct between said third flip-flop circuit and said second output circuit in response to a fourth select signal.

7. The serial access memory as claimed in claim 1, wherein the dimensions of individual transistors forming said plurality of first registers are smaller than those of individual transistors forming said plurality of second registers.

8. The serial access memory as claimed in claim 1, wherein a first resistor is connected between said plurality of second registers and a drive power source.

9. The serial access memory as claimed in claim 8, wherein a second resistor is connected between said plurality of first registers and said drive power source.

10. The serial access memory as claimed in claim 1, wherein said plurality of first registers and said plurality of second registers are respectively comprised of first and second inverters, said first inverters each having an output connected to an input of each of said second inverters and said second inverters each having an output connected to an input of each of said first inverters.

11. The serial access memory as claimed in claim 10, wherein said first and second inverters are clocked inverters.

12. A serial access memory comprising:
   a memory cell array having a plurality of memory cells arranged therein for storing data therein;
   a first switching circuit;
   a first register group connected to said memory cell array through said first switching circuit;
   a second switching circuit; and
   a second register group connected to said first register through said second switching circuit,
   wherein data from said memory cell array passes through said first register group so as to be transferred from said memory cell array to said second register group when said first switching circuit and said second switching circuit are in an ON state, and data is transferred from said memory cell array to said first register group when said first switching circuit is in an ON state and said second switching circuit is in an OFF state.

13. The serial access memory as claimed in claim 12, wherein the dimensions of individual transistors forming said first register group are smaller than those of individual transistors forming said second register group.

14. The serial access memory as claimed in claim 12, wherein each register of said first and second register groups is comprised of first and second inverters, said first inverter having an output connected to an input of said second inverter and said second inverter having an output connected to an input of said first inverter.

15. The serial access memory as claimed in claim 14, wherein a first resistor is connected between said first and second inverters and a drive power source.

16. The serial access memory as claimed in claim 14, wherein the dimensions of individual transistors forming the inverters of said first register group are smaller than those of individual transistors forming the inverters of said second register group.

17. A serial access memory comprising:
   a first memory cell for storing data therein;
   a first transistor;
   a first register connected to said first memory cell through said first transistor;
   a second transistor;
   a second register connected to said first register through said second transistor;
   a first control signal supply line for supplying a first control signal having either a first logic level or a second logic level to said first transistor; and
   a second control signal supply line for supplying a second control signal having either the first logic level or the second logic level to said second transistor,
   wherein said first transistor and said second transistor are respectively turned ON and OFF so that the data is input to said first register when said first control signal has the first logic level and said second control signal has the second logic level, and said first transistor and said second transistor are both turned ON so that data passes through said first register to be input to said second register when said first control signal has the first logic level and said second control signal has the first logic level.

18. The serial access memory as claimed in claim 17, wherein the dimensions of individual transistors forming said first register are smaller than those of individual transistors forming said second register.

19. The serial access memory as claimed in claim 17, wherein a first resistor is connected between said second register and a drive power source.

20. The serial access memory as claimed in claim 19, wherein a second resistor is connected between said first register and said drive power source.

21. The serial access memory as claimed in claim 17, wherein each of said first and second registers is comprised of two inverters, one of which has an output connected to an input of the other inverter and the other of which has an output connected to an input of said one inverter.

22. The serial access memory as claimed in claim 21, wherein the dimensions of individual transistors forming the inverters of said first register are smaller than those of individual transistors forming the inverters of said second register.

23. A serial access memory device comprising:
a first serial access memory unit which includes
a first word line;
a first bit line pair provided so as to intersect said first word line;
a first memory cell connected to a point where said first word line and said first bit line pair intersect, for storing first data therein;
an output register;
a first switching circuit connected between said first bit line pair and said output register and allowed to conduct between said first bit line pair and said output register in response to a first control signal so as to transfer the first data to said output register;
a data bus;
an output circuit connected to said data bus; and
a first transfer circuit connected between said output register and said data bus, for transferring the first data to said data bus in response to a first column signal;
a second serial access memory unit which includes
a second word line;
a second bit line pair provided so as to intersect said second word line;
a second memory cell connected to a point where said second word line and said second bit line pair intersect, for storing second data therein;
an input register;
a second switching circuit connected between said second bit line pair and said input register and allowed to conduct between said second bit line pair and said input register in response to a second control signal so as to supply the first data to said second bit line pair; and
a second transfer circuit connected between said input register and said data bus, for transferring the first data on said data bus to said input register in response to a second column signal;
a Y decoder circuit for supplying the first column signal to said first transfer circuit and supplying the second column signal to said second transfer circuit; and
a delay circuit connected between said data bus and said second transfer circuit, for delaying the first data on said data bus by a predetermined time interval and supplying the delayed first data to said second transfer circuit.

24. The serial access memory device as claimed in claim 23, further including an initializing circuit connected to said data bus, for setting said data bus supplied with the first data to a predetermined potential in response to an initialization signal.

25. The serial access memory device as claimed in claim 23, further including a data memory circuit provided between said delay circuit and said second transfer circuit, for storing the first data supplied from said second transfer circuit therein.

26. The serial access memory device as claimed in claim 24, further including a data memory circuit provided between said delay circuit and said second transfer circuit, for storing the first data supplied from said second transfer circuit therein.

27. The serial access memory device as claimed in claim 23, further including a first X decoder circuit for supplying a first select signal to said first word line, a second X decoder circuit for supplying a second select signal to said second word line and an address counter for supplying a common address to said first and second X decoder circuits.

28. The serial access memory device as claimed in claim 26, further including a first X decoder circuit for supplying a first select signal to said first word line, a second X decoder circuit for supplying a second select signal to said second word line and an address counter for supplying a common address to said first and second X decoder circuits.

29. A display device comprising:
said serial access memory device as claimed in claim 23;
a D/A converter circuit for receiving output data from said output circuit of said serial access memory device, converting the output data from a digital value to an analog value and outputting the converted data therefrom;
a control circuit for controlling said serial access memory device and said D/A converter circuit; and
a display for displaying an image on the screen in accordance with the output produced from said D/A converter circuit.

30. The serial access memory device as claimed in claim 26, wherein the delaying of the first data by the predetermined time interval is developed according to a variation in logic level of a delay control signal.

31. A semiconductor memory device having said serial access memory device as claimed in claim 23, which is covered with a package resin.

32. The serial access memory as claimed in claim 1, wherein said first registers are electrically isolated from one another continuously during operation of the serial access memory, and said second registers are electrically isolated from one another continuously during operation of the serial access memory.

33. The serial access memory as claimed in claim 12, wherein said first register group comprises first register stages that are electrically isolated from one another continuously during operation of the serial access memory, and said second register group comprises second register stages that are electrically isolated from one another continuously during operation of the serial access memory.

34. A serial access memory, comprising:
an array of memory cells for storing data, the memory cells being disposed in rows and columns;
a first read register which includes a plurality of first flip-flops which are electrically isolated from one another, each first flip-flop corresponding to a respective one of the rows of the array;
a first transfer circuit for transferring data read from each of the rows to the corresponding first flip-flop in response to a first control signal;
a second read register which includes a plurality of second flip-flops which are electrically isolated from one another, each second flip-flop corresponding to a respective one of the first flip-flops; and a second transfer circuit for transferring data from the first flip-flops to the corresponding second flip-flops in response to a second control signal.

35. The serial access memory of claim 34, further comprising a first data bus, a second data bus, and circuitry for transferring data from the first flip-flops to the first data bus and for transferring data from the second flip-flops to the second data bus.

36. The serial access memory of claim 35, further comprising a delay circuit connected to the first data bus.

37. The serial access memory of claim 36, wherein the delay circuit comprises a plurality of flip-flops connected in series, and further comprising circuitry for selectively bypassing at least one of the flip-flops in the delay circuit.

38. The serial access memory of claim 36, further comprising a delay circuit connected to the second data bus.

39. The serial access memory of claim 35, further comprising a delay circuit connected to the second data bus.

40. The serial access memory of claim 39, wherein the delay circuit comprises a plurality of flip-flops connected in series, and further comprising circuitry for selectively bypassing at least one of the flip-flops in the delay circuit.

\* \* \* \* \*